United States Patent
Yamaguchi

(10) Patent No.: US 10,755,858 B2
(45) Date of Patent: Aug. 25, 2020

(54) TAPING ELECTRONIC COMPONENT ARRAY

(71) Applicant: Murata Manufacturing Co., Ltd., Kyoto-fu (JP)

(72) Inventor: Chihiro Yamaguchi, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 185 days.

(21) Appl. No.: 15/977,962

(22) Filed: May 11, 2018

(65) Prior Publication Data

US 2018/0330882 A1 Nov. 15, 2018

(30) Foreign Application Priority Data

May 12, 2017 (JP) .................. 2017-095259

(51) Int. Cl.
*H01F 27/28* (2006.01)
*H01G 4/232* (2006.01)
(Continued)

(52) U.S. Cl.
CPC ........... *H01G 4/232* (2013.01); *H01F 17/045* (2013.01); *H01F 27/292* (2013.01); *H01G 2/065* (2013.01);
(Continued)

(58) Field of Classification Search
CPC .......... H01F 2017/0093; H01F 27/292; H01F 17/045; H01F 41/06; H01F 41/07; H01G 4/232; H01G 4/12; H01G 2/065; H01G 2/10; H05K 1/181; H05K 13/021; H05K 2201/10681; H05K 2201/10522
USPC .................. 336/83, 192, 221, 222
See application file for complete search history.

(56) References Cited

U.S. PATENT DOCUMENTS 3,736,543 A * 5/1973 Lademann .............. H01F 5/003
336/200
6,437,985 B1 * 8/2002 Blanc ..................... G06K 19/02
257/647
(Continued)

FOREIGN PATENT DOCUMENTS

JP     S63232170 A    9/1988
JP     2012079995 A   4/2012
(Continued)

OTHER PUBLICATIONS

An Office Action; "Notification of Reasons for Refusal," Mailed by the Japanese Patent Office dated Sep. 3, 2019, which corresponds to Japanese Patent Application No. 2017-095259 and is related to U.S. Appl. No. 15/977,962; with English language translation.
(Continued)

*Primary Examiner* — Mang Tin Bik Lian
(74) *Attorney, Agent, or Firm* — Studebaker & Brackett PC

(57) ABSTRACT

A taping electronic component array includes a tape including a long carrier tape, in which recesses are provided along a longitudinal direction, and a cover tape that is provided on the carrier tape to cover the recesses; and a first coil component and a second coil component, which are disposed in each of the recesses. The first coil component includes a first core and a first coil in which a first wire and a second wire are wound around the first core in a predetermined winding direction while twisted in a predetermined twist direction, and the second coil component includes a second core and a second coil in which the first wire and the second wire are wound around the second core in the predetermined winding direction while twisted in an opposite direction to the predetermined twist direction. Thus, degradation of manufacturing capacity is prevented.

12 Claims, 59 Drawing Sheets

(51) Int. Cl.
- *H01G 2/06* (2006.01)
- *H01G 4/12* (2006.01)
- *H01G 2/10* (2006.01)
- *H01F 27/29* (2006.01)
- *H05K 13/02* (2006.01)
- *H01F 17/04* (2006.01)
- *H05K 1/18* (2006.01)
- *H01F 41/06* (2016.01)
- *H01F 17/00* (2006.01)

(52) U.S. Cl.
CPC ............... *H01G 2/10* (2013.01); *H01G 4/12* (2013.01); *H05K 13/021* (2013.01); *H01F 41/06* (2013.01); *H01F 2017/0093* (2013.01); *H05K 1/181* (2013.01); *H05K 2201/10522* (2013.01); *H05K 2201/10681* (2013.01)

(56) References Cited

U.S. PATENT DOCUMENTS

| | | | | |
|---|---|---|---|---|
| 7,549,208 B2* | 6/2009 | Okamoto | ......... | G06K 19/07718 29/601 |
| 7,786,450 B2* | 8/2010 | Zach | ........ | H01F 5/003 250/396 M L |
| 8,937,522 B2* | 1/2015 | Lai | ........... | H01F 27/29 336/192 |
| 9,177,710 B2* | 11/2015 | Lee | ........... | H01F 27/26 |
| 2016/0379756 A1 | 12/2016 | Yamakita | | |
| 2017/0025212 A1* | 1/2017 | Jerez | ........... | H01F 17/045 |

FOREIGN PATENT DOCUMENTS

| | | | |
|---|---|---|---|
| JP | 2014216525 A | | 11/2014 |
| JP | 2015-019117 A | | 1/2015 |
| JP | 2015026717 A | * | 2/2015 |
| JP | 2015026717 A | | 2/2015 |
| JP | 2017-011132 A | | 1/2017 |

OTHER PUBLICATIONS

An Office Action; "Notification of Reasons for Refusal," issued by the Japanese Patent Office dated Feb. 12, 2020, which corresponds to Japanese Patent Application No. 2017-095259 and is related to U.S. Appl. No. 15/977,962; with English language translation.

* cited by examiner

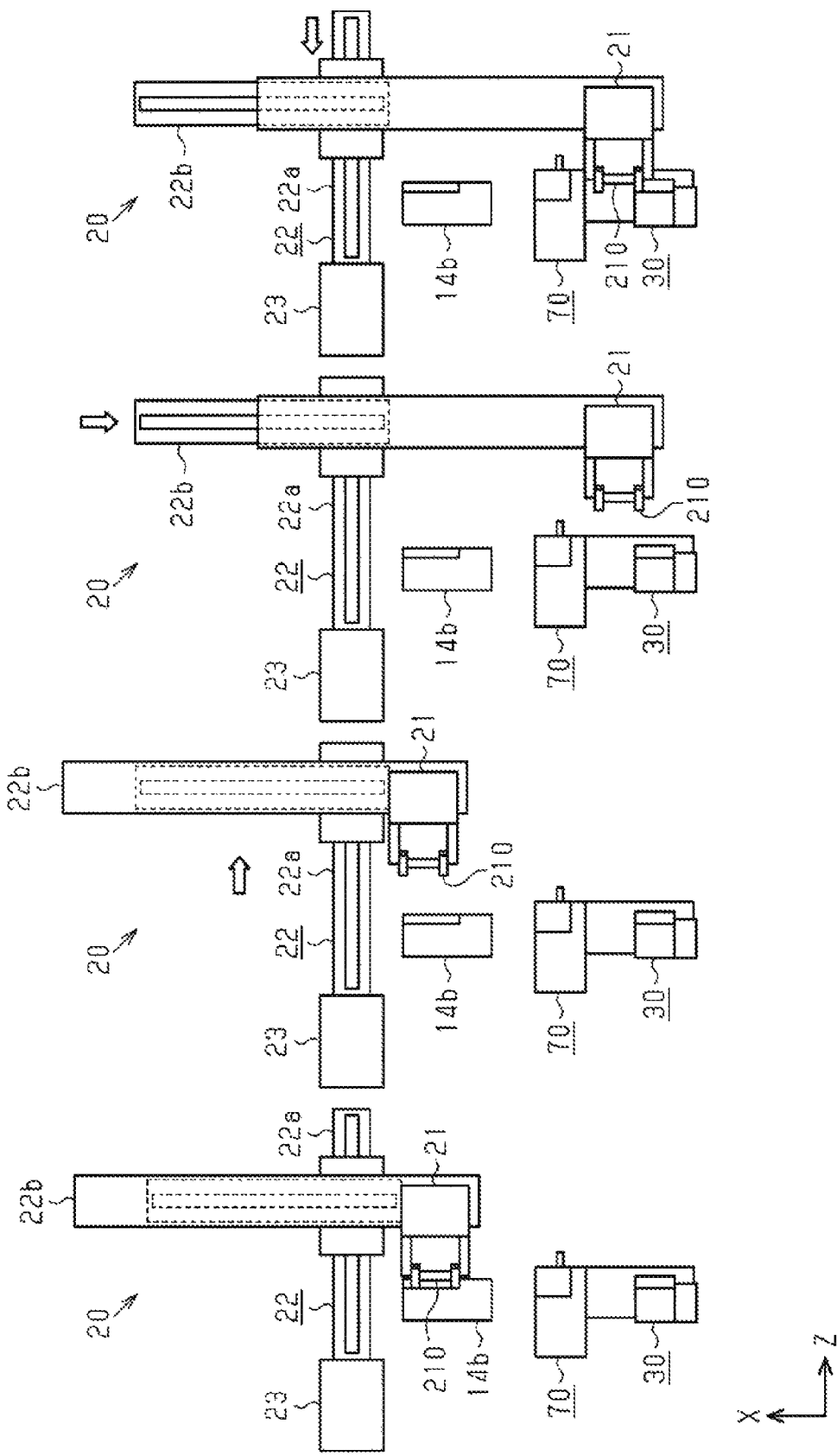

FIG. 34A
FIG. 34B
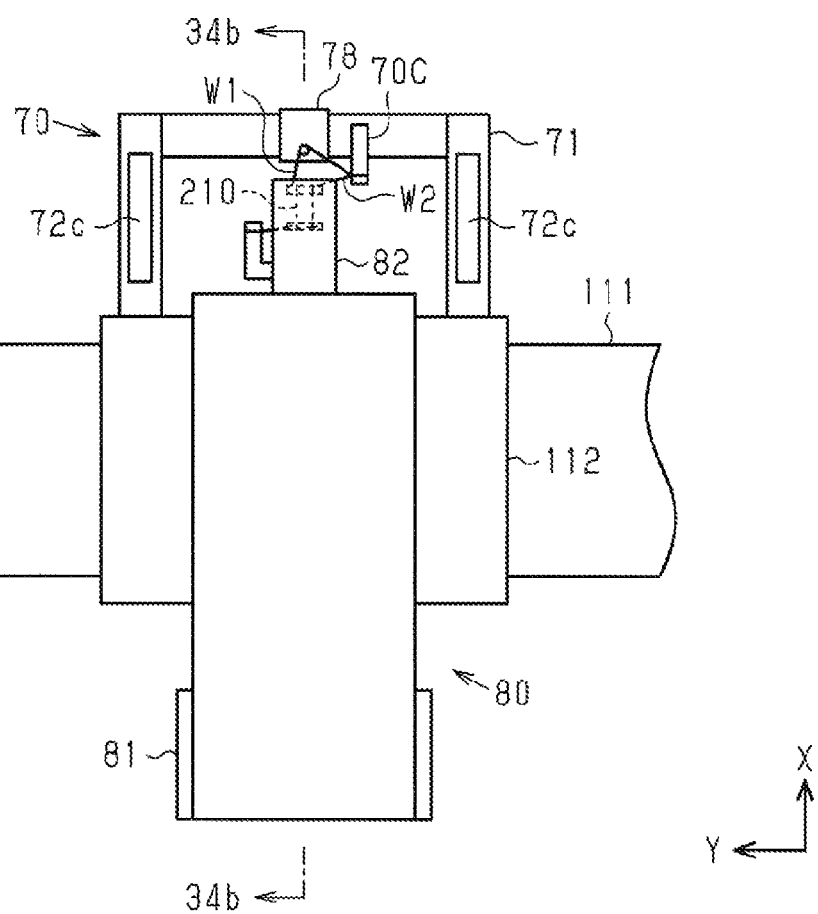
FIG. 34C
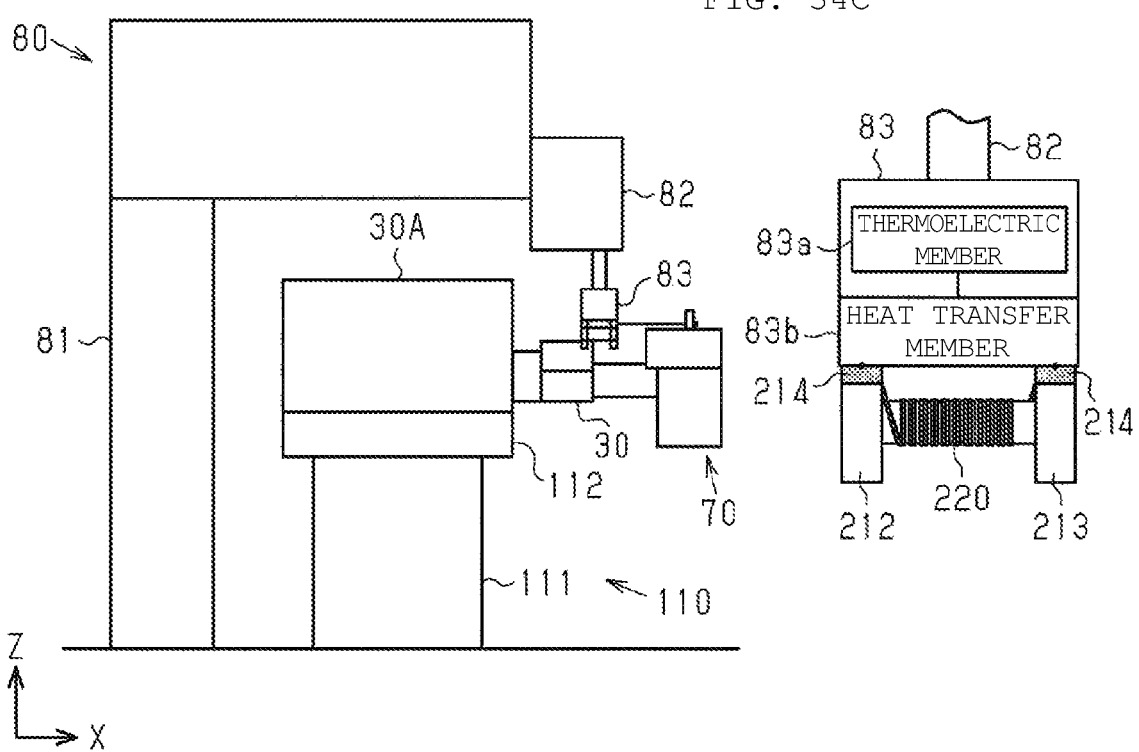

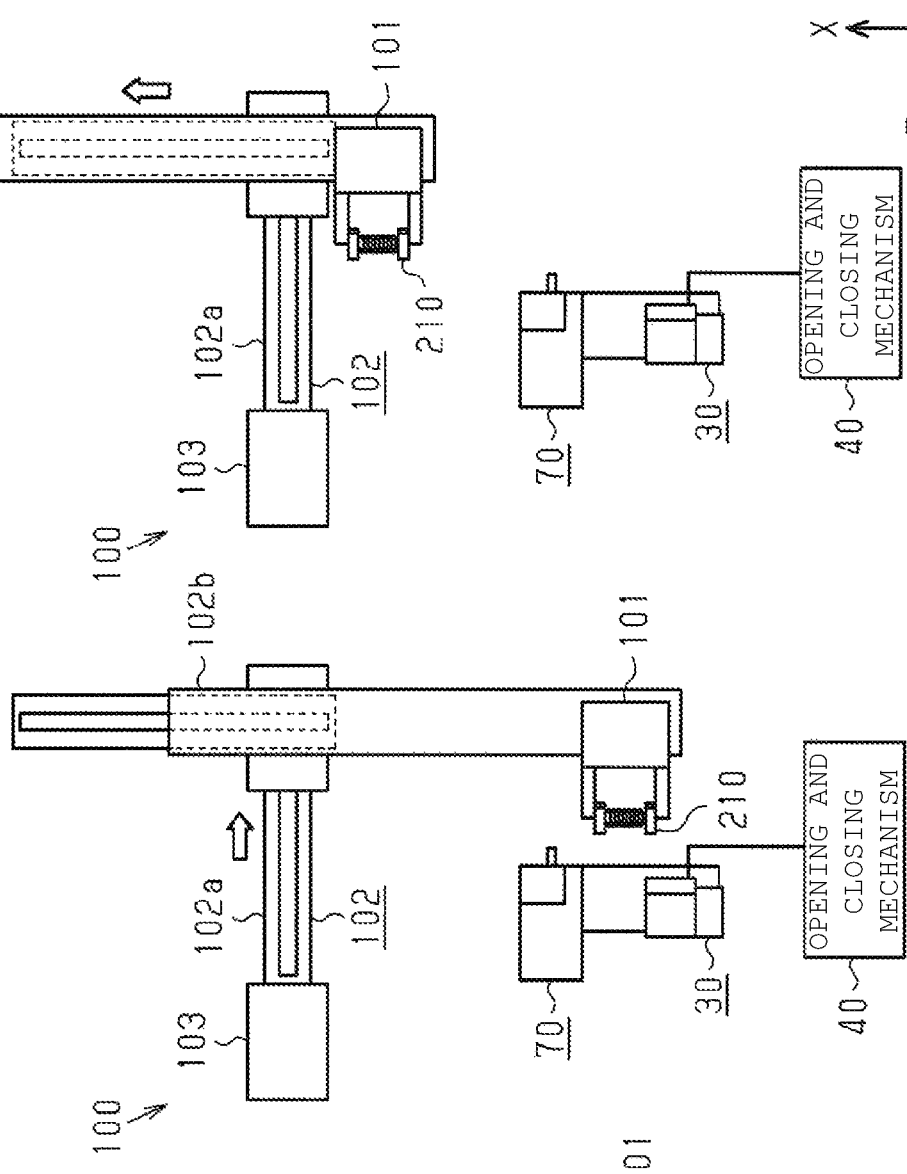
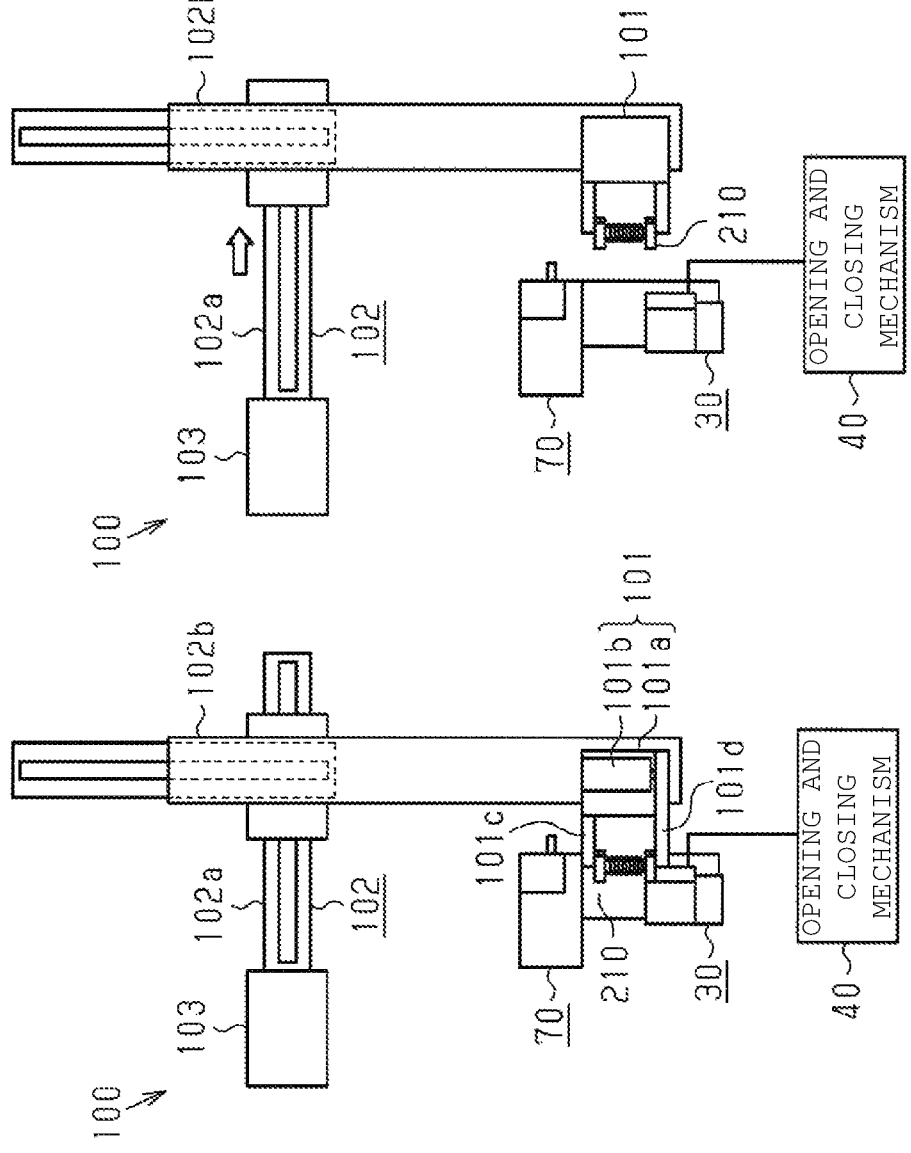

FIG. 48A
FIG. 48B
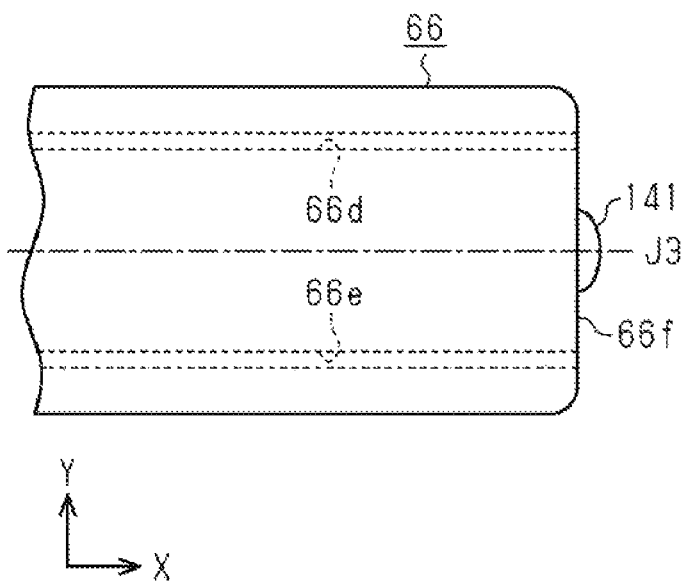
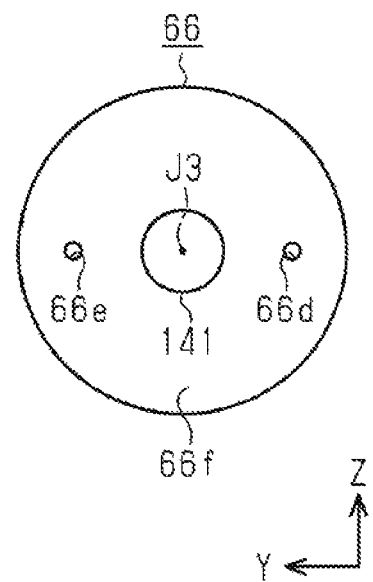

FIG. 49A
FIG. 49B
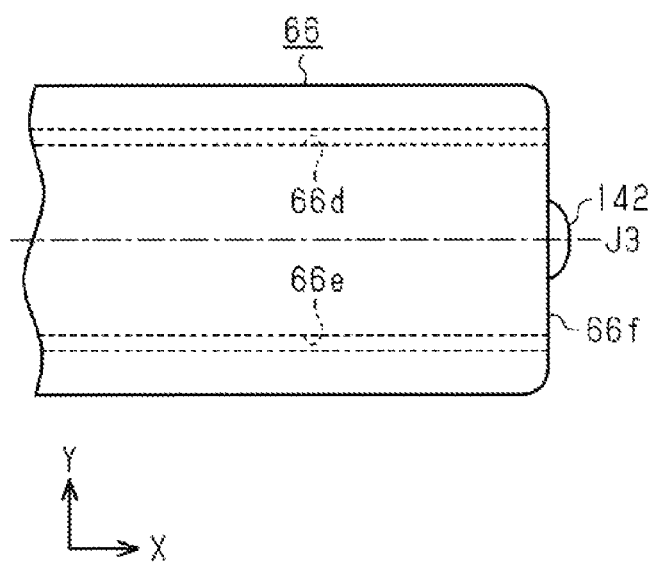
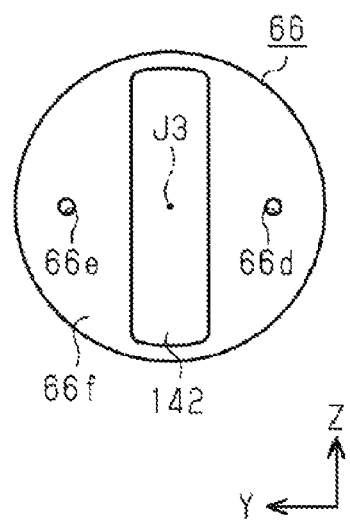

FIG. 60A
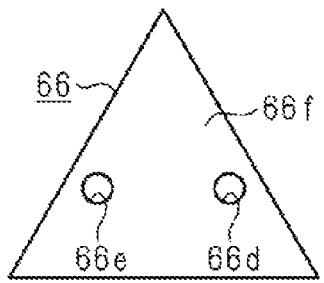
FIG. 60B
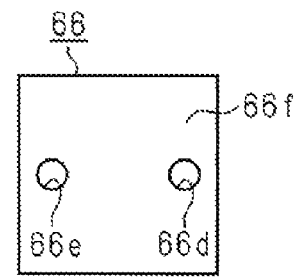
FIG. 60C
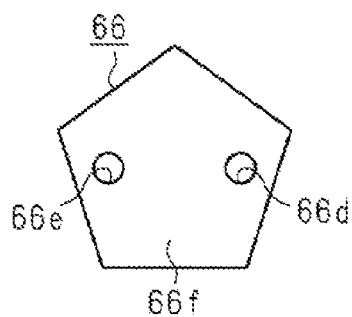
FIG. 60D
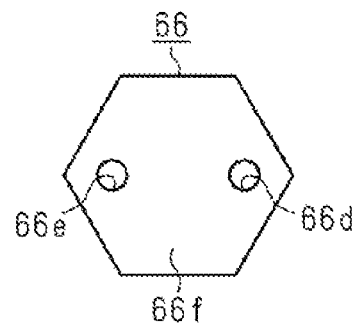
FIG. 60E
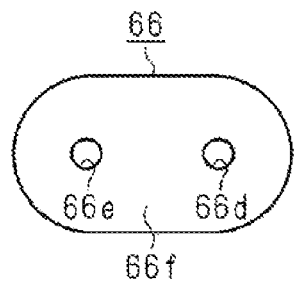
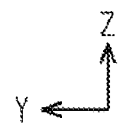

TAPING ELECTRONIC COMPONENT ARRAY

CROSS-REFERENCE TO RELATED APPLICATION

This application claims benefit of priority to Japanese Patent Application No. 2017-095259, filed May 12, 2017, the entire content of which is incorporated herein by reference.

BACKGROUND

Technical Field

The present disclosure relates to a taping electronic component array.

Background Art

A configuration, in which a plurality of recesses are covered with a cover tape provided on a carrier tape while an electronic component such as a multilayer ceramic capacitor is accommodated in a long carrier tape in which the plurality of recesses are provided along a longitudinal direction, is known as the taping electronic component array (for example, see Japanese Patent Application Laid-Open No. 2015-19117).

SUMMARY

A process of classifying the electronic component in each specification is required in the case that the manufactured electronic component is accommodated in a recess of the carrier tape in each specific specification. For this reason, sometimes manufacturing capacity of the taping electronic component array is degraded.

The disclosure provides a taping electronic component array that can prevent the degradation of the manufacturing capacity. The taping electronic component array includes a tape including a long carrier tape in which a plurality of recesses are provided along a longitudinal direction and a cover tape that is provided on the carrier tape so as to cover the plurality of recesses; and an electronic component disposed in each of the plurality of recesses. The electronic component includes a first coil component and a second coil component, the first coil component includes a first core and a first coil in which a plurality of wires are wound around the first core in a predetermined winding direction while twisted in a predetermined twist direction, the second coil component includes a second core and a second coil in which the plurality of wires are wound around the second core in the predetermined winding direction while twisted in an opposite direction to the predetermined twist direction.

In this configuration, the plurality of recesses of the carrier tape include the recess in which the first coil component is accommodated and the recess in which the second coil component is accommodated. For this reason, a process of selecting the first coil component and the second coil component is eliminated compared with a tape in which only the first coil component is accommodated or a tape in which only the second coil component is accommodated, so that degradation of manufacturing capacity of the taping electronic component array can be prevented.

In the taping electronic component array according to an embodiment, the first coil component and the second coil component are alternately disposed in the plurality of recesses in each predetermined number. In the taping electronic component array according to an embodiment, the predetermined number is one.

In the taping electronic component array according to an embodiment, the first core includes an electrode to which a winding starting end of the first coil is fixed and an electrode to which a winding ending end of the first coil is fixed, the second core includes an electrode to which a winding starting end of the second coil is fixed and an electrode to which a winding ending end of the second coil is fixed, and an arrangement direction of the electrode to which the winding starting end of the first coil is fixed with respect to the recess is matched with an arrangement direction of the electrode to which the winding starting end of the second coil is fixed with respect to the recess. In this configuration, because an arrangement direction of the winding starting end of the coil of the first coil component with respect to the recess is matched with an arrangement direction of the winding starting end of the coil of the second coil component with respect to the recess, necessity of a process of matching orientations of the first coil component and the second coil component is eliminated when the first coil component and the second coil component are mounted on, for example, a circuit board. Thus, efficiency of mounting work of the first coil component and the second coil component can be enhanced.

In the taping electronic component array according to an embodiment, the first coil component includes a magnetic first cover member that is attached to the first core so as to cover the first coil, and the second coil component includes a magnetic second cover member that is attached to the second core so as to cover the second coil. In this configuration, the first cover member prevents magnetic flux leakage of the first coil component, and the second cover member prevents magnetic flux leakage of the second coil component. Thus, inductance values (L values) of the first coil component and the second coil component can be increased.

The degradation of the manufacturing capacity can be prevented in the taping electronic component array of the disclosure.

BRIEF DESCRIPTION OF THE DRAWINGS

FIGS. 11A to 11D are schematic diagrams illustrating operation in which the core input mechanism inputs the core in a holding mechanism;

FIG. 34A is a schematic plan view illustrating a wire connection mechanism of the winding apparatus, FIG. 34B is a schematic sectional view illustrating the wire connection mechanism and its periphery, and FIG. 34C is an enlarged view illustrating a heat generator of the wire connection mechanism and the core;

FIGS. 37A to 37C are schematic diagrams illustrating core carrying operation using a core carrying mechanism;

FIG. 48A is a plan view illustrating a leading end of a wire position support member in a winding apparatus of a modification, and FIG. 48B is a front view of the wire position support member;

FIG. 49A is a plan view illustrating a leading end of a wire position support member in a winding apparatus of a modification, and FIG. 49B is a front view of the wire position support member;

FIGS. 60A to 60E are front views illustrating a wire position support member of a winding apparatus of a modification.

DETAILED DESCRIPTION

Embodiments will be described with reference to the drawings.

In the accompanying drawings, in some cases a component is illustrated while enlarged for the sake of easy understanding. In some cases, a dimension ratio of the component differs from an actual dimension ratio or a dimension ratio of another drawing. In the sectional view, in some cases hatting of a part of the components is omitted for the sake of easy understanding. Hereinafter, the term "a twist in a wire" means a state in which a plurality of wires are intersected and entangled, and the plurality of wires are wound around themselves. The term "a kink of a wire" means a state in which one wire (single wire) rotates about its longitudinal direction.

First Embodiment

Figure 1:
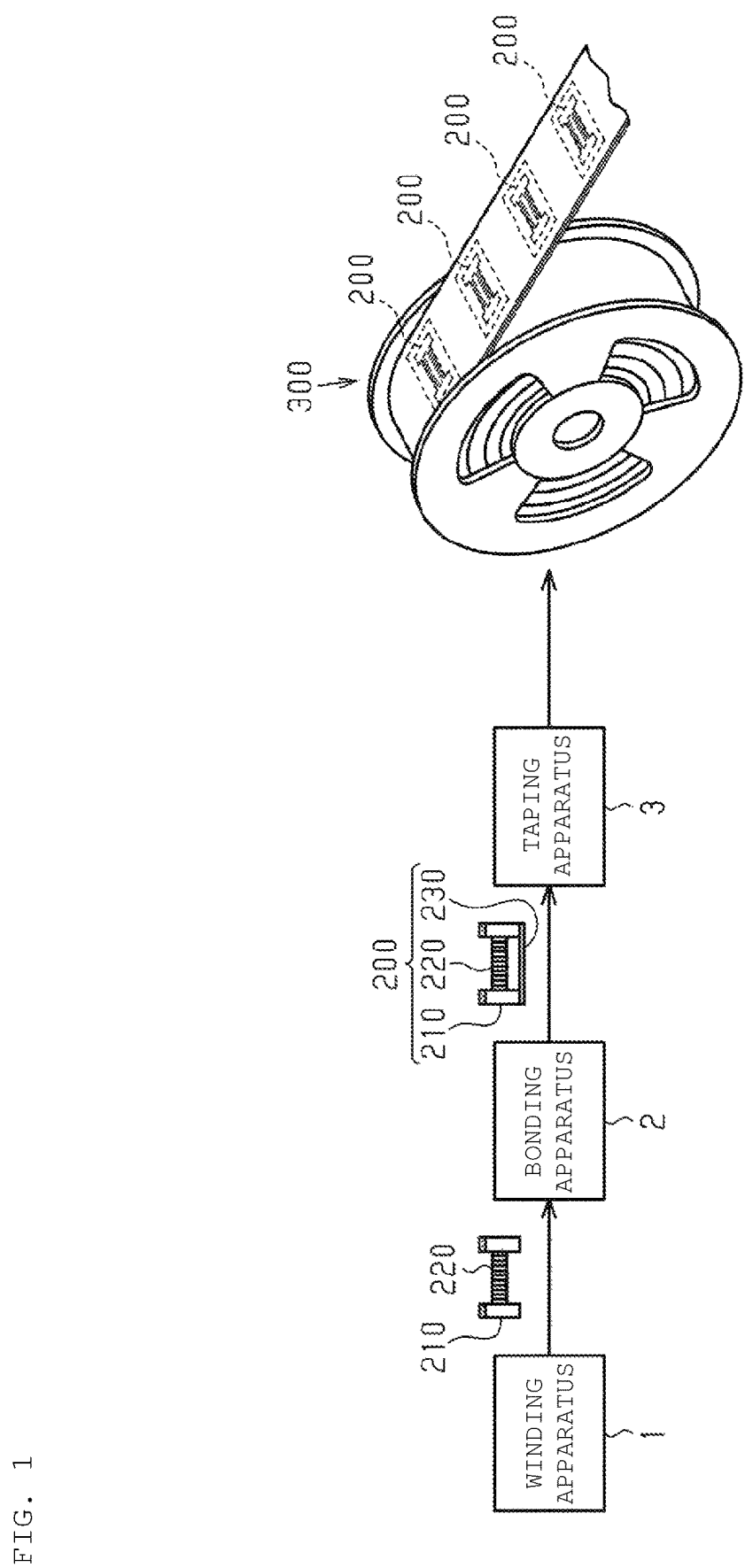
FIG. 1 is a schematic diagram illustrating a process of manufacturing a coil component and a taping component array of a first embodiment.

As illustrated in FIG. 1, a winding apparatus 1 forms a coil 220 in a core 210, and a bonding apparatus 2 fits a cover member 230 in the core 210 to manufacture a coil component 200. A taping apparatus 3 packages a plurality of manufactured coil components 200. Consequently, a taping electronic component array 300 is manufactured.

Figure 2:
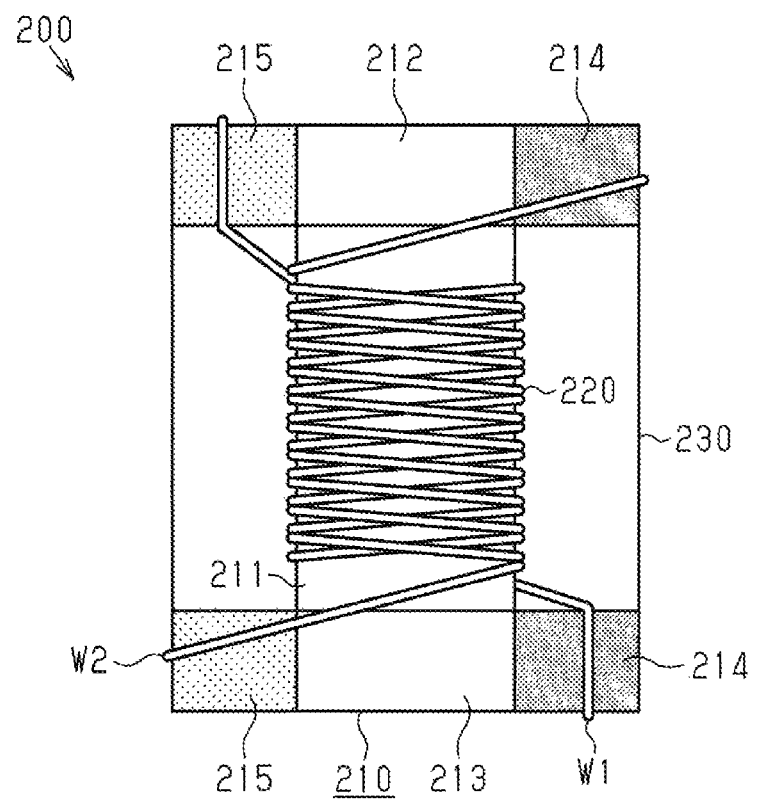
FIG. 2 is a plan view of the coil component.
Figure 3:
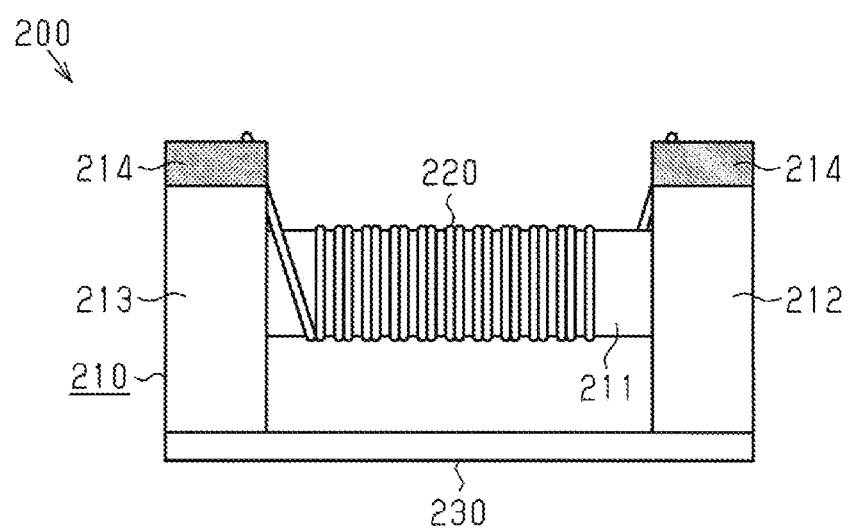
FIG. 3 is a side view of the coil component.

As illustrated in FIGS. 2 and 3, for example, the coil component 200 is a surface-mounted type common mode choke coil mounted on a circuit board. The coil component 200 includes the core 210, the coil 220 in which a first wire W1 and a second wire W2 are wound around the core 210, and the cover member 230 fitted in the core 210.

For example, a magnetic material (such as nickel (Ni)-zinc (Zn) ferrite and manganese (Mn)—Zn ferrite), a metallic magnetics, and a nonmagnetic material (such as alumina and resin) can be used as a material for the core 210. Powders of these materials are molded and sintered, thereby obtaining the core 210. The core 210 includes a winding core 211, a first flange 212, and a second flange 213. The winding core 211 is formed into a substantially rectangular parallelepiped shape. The first flange 212 extends from one end of the winding core 211 in a first direction in which the winding core 211 extends to a second direction that is a plane direction orthogonal to the first direction. The second flange 213 extends from the other end of the winding core 211 in the first direction to the second direction. The first flange 212 and the second flange 213 are formed integrally with the winding core 211. A first electrode 214 and a second electrode 215 are provided in each of the flanges 212, 213. The first electrode 214 and the second electrode 215 are located at both ends in the second direction of each of the flanges 212, 213 in planar view of the coil component 200. Each of the electrodes 214, 215 includes a metallic layer and a plated layer on a surface of the metallic layer. For example, silver (Ag) can be used as the metallic layer, and tin (Sn) plating can be used as the plated layer. Metal such as copper (Cu) or an alloy such as nickel (Ni)-chromium (Cr) and Ni—Cu may be used as the metallic layer. Ni plating or plating of at least two kinds of metals may be used as the plated layer. A dimension in the first direction and a dimension in the second direction of the core 210 can arbitrarily be changed. Preferably the dimension in the first direction of the core 210 ranges from 2.09 mm to 4.5 mm, and the dimension in the second direction of the core 210 ranges from 1.53 mm to 3.2 mm. In the first embodiment, the dimension in the first direction of the core 210 is set to 4.5 mm, the dimension in the second direction of the core 210 is set to 3.2 mm.

The coil 220 includes a primary-side coil in which the first wire W1 is wound around the winding core 211 and a secondary-side coil in which the second wire W2 is wound around the winding core 211. The first wire W1 is connected to the first electrode 214, and the second wire W2 is connected to the second electrode 215. As illustrated in FIG. 2, each of the wires W1, W2 wound around the winding core 211 is twisted (intersected). Each of the wires W1, W2 includes a core wire having a circular section and a coating material coating a surface of the core wire. A conductive material such as Cu and Ag can be used as a principal component of the material for the core wire. An insulating material such as polyurethane and polyester can be used as the coating material. In FIG. 2, the number of twists of each of the wires W1, W2 is one in planar view of the coil component 200. However, the number of twists of each of the wires W1, W2 is not limited to one. For example, the number of twists of each of the wires W1, W2 may be at least two.

As illustrated in FIG. 2, the cover member 230 is formed into a plate shape. A magnetic material such as ferrite can be used as the material for the cover member 230. As illustrated in FIG. 3, the cover member 230 is fitted in the first flange 212 and the second flange 213 using an adhesive agent so as to coat the coil 220 wound around the winding core 211. The cover member 230 is fitted on the opposite side to each of the electrodes 214, 215 with respect to each of the flanges 212, 213.

For example, when the coil component 200 is mounted on the circuit board, the cover member 230 causes a suction nozzle to surely perform suction. The cover member 230 prevents damage of each of the wires W1, W2 during the suction of the suction nozzle. A nonmagnetic material such as an epoxy resin may be used as the material for the cover member 230. Consequently, a magnetic loss is reduced, and a Q value of the coil component 200 can be enhanced.

<Winding Apparatus>

Figure 4:
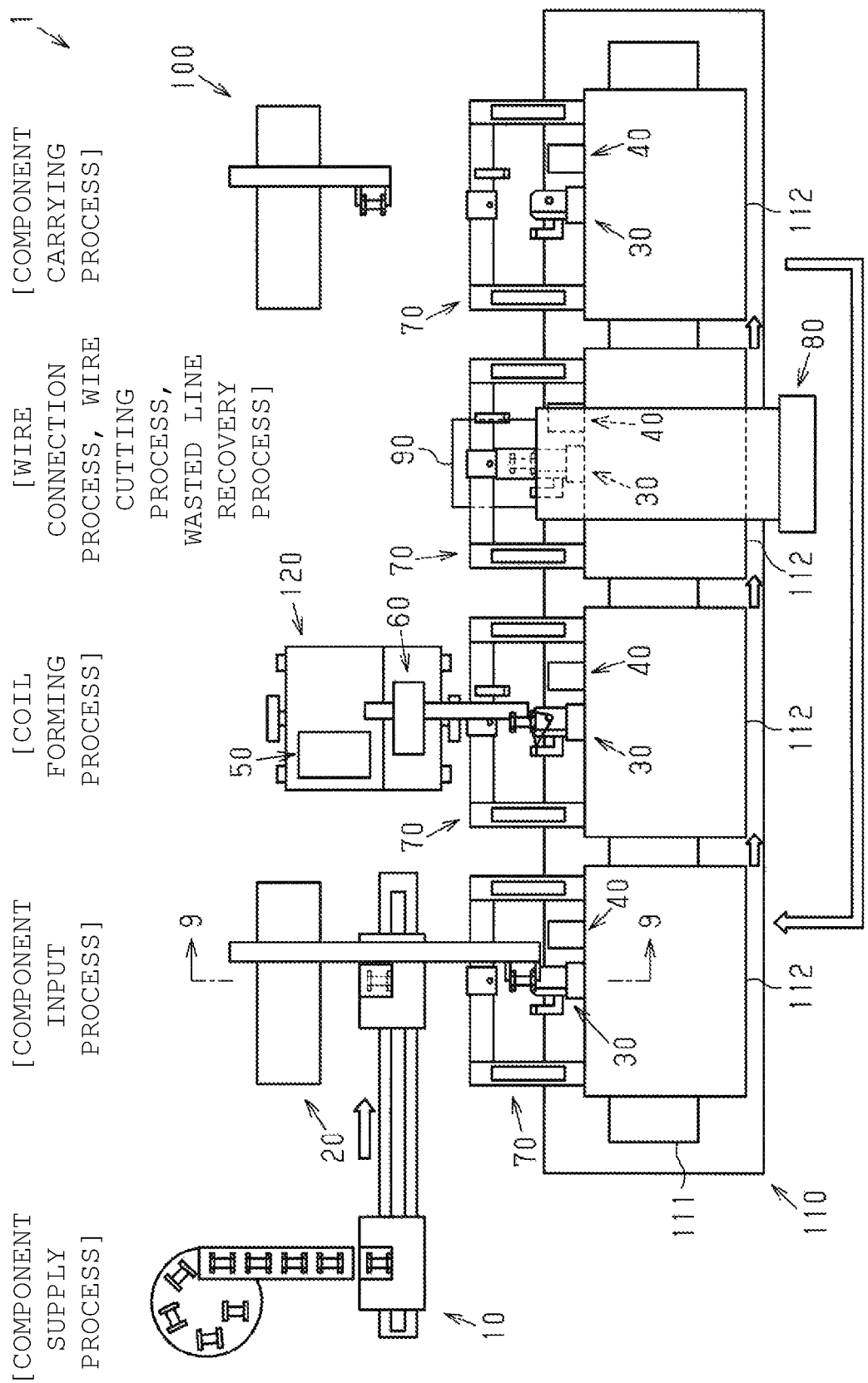
FIG. 4 is a schematic configuration diagram illustrating a winding apparatus including the process of manufacturing the coil component of the first embodiment.
Figure 5:
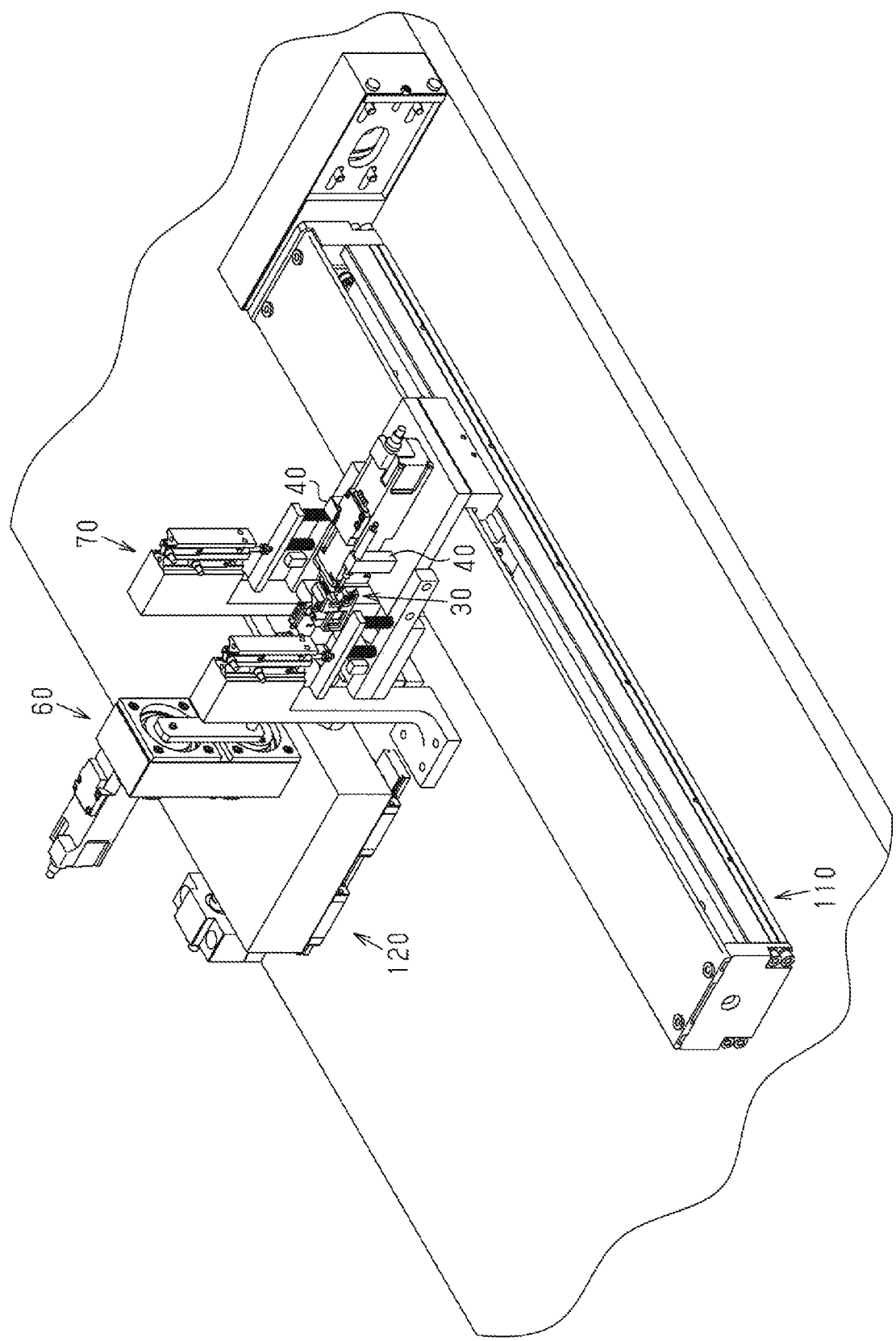
FIG. 5 is a perspective view illustrating a detailed configuration of a part of the winding apparatus.

FIG. 4 is a schematic plan view illustrating a series of operations of the winding apparatus 1. The winding apparatus 1 includes a core conveyance mechanism 10, a core input mechanism 20, a holding mechanism 30, an opening and closing mechanism 40, a wire feeding mechanism 50, a wire winding mechanism 60, a wire holding retreating mechanism 70, a wire connection mechanism 80, a wasted line recovery mechanism 90, a core carrying mechanism 100, a first moving mechanism 110, and a second moving mechanism 120. FIG. 5 illustrates examples of the holding mechanism 30, the opening and closing mechanism 40, the wire feeding mechanism 50, the wire winding mechanism 60, the wire holding retreating mechanism 70, the first moving mechanism 110, and the second moving mechanism 120 of the winding apparatus 1.

Figure 6:
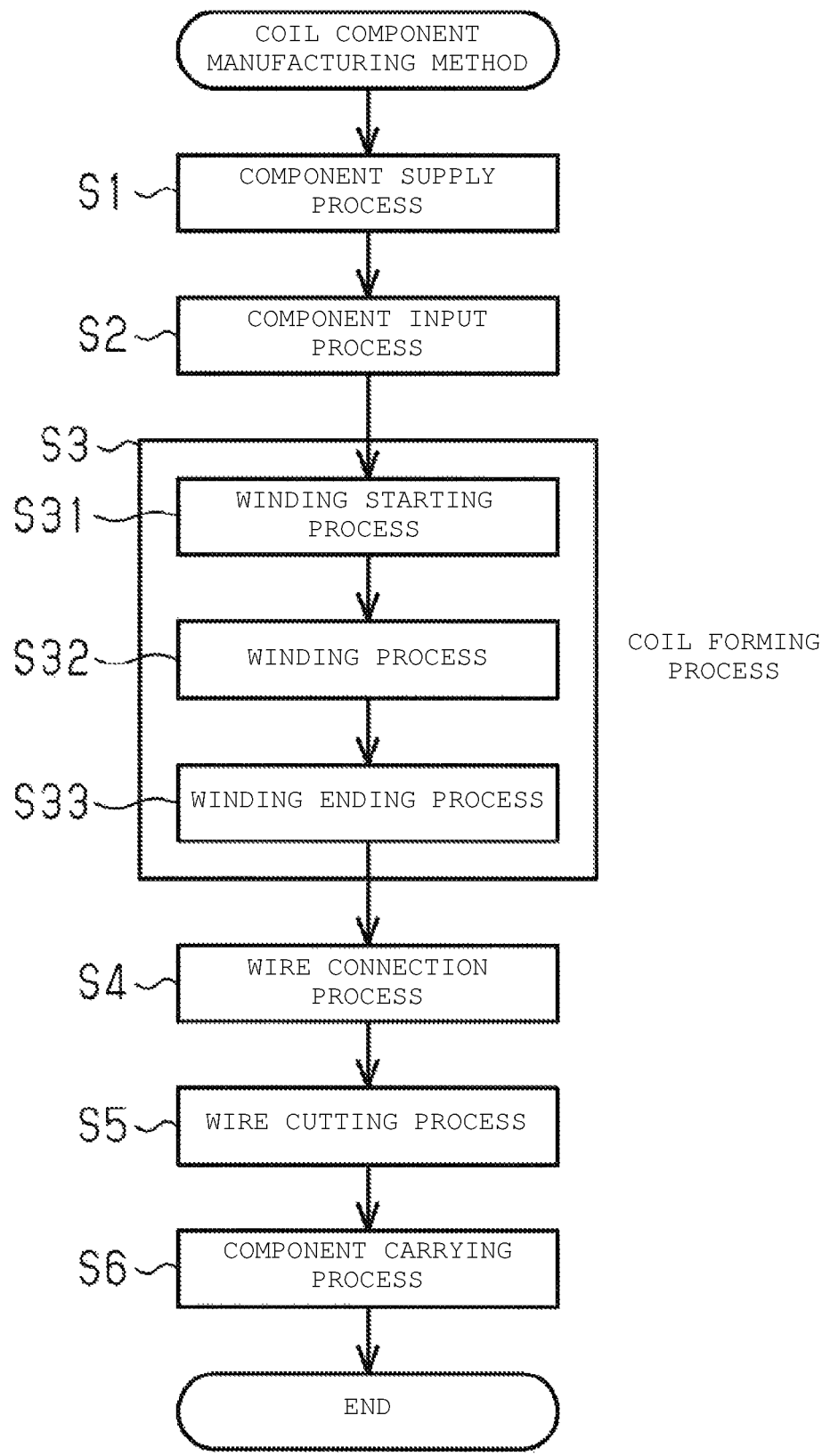
FIG. 6 is a flowchart of a coil component manufacturing method.

As illustrated in FIG. 6, the winding apparatus 1 manufactures a coil component in which the coil 220 is formed in the core 210 through a component supply process (step S1), a component input process (step S2), a coil forming process (step S3), a wire connection process (step S4), a wire cutting process (step S5), and a component carrying process (step S6) in this order. The coil component is in the state in which the cover member 230 (see FIG. 2) is not fitted. In the first embodiment, the component supply process and the component input process correspond to the core preparation process.

In the component supply process, the core conveyance mechanism 10 separately conveys the core 210 to the core input mechanism 20. In the component input process, the core input mechanism 20 inputs the core 210 to the holding mechanism 30, and the holding mechanism 30 holds the core 210.

The coil forming process is a process of forming the coil 220 in the core 210, and includes a winding starting process (step S31), a winding process (step S32), and a winding ending process (step S33). In the winding starting process, the wire winding mechanism 60 hooks winding starting ends of the first and second wires W1, W2, to which predetermined tension is provided by the wire feeding mechanism 50, on the electrodes 214, 215 (see FIG. 2) of the core 210 held by the holding mechanism 30. In the winding process, the wire winding mechanism 60 and the holding mechanism 30 winds each of the wires W1, W2 around the winding core 211 of the core 210. In the winding ending process, wire winding mechanism 60 hooks winding ends of the wires W1, W2 on the electrodes 214, 215.

In the wire connection process, the wire connection mechanism 80 connects a winding starting end of each of the wires W1, W2 to each of the electrodes 214, 215, and connects the winding ending end of each of the wires W1, W2 to each of the electrodes 214, 215. In the wire cutting process, the wire connection mechanism 80 cuts an excess portion of each of the wires W1, W2, and the wasted line recovery mechanism 90 recovers the excess portion. In the component carrying process, the core carrying mechanism 100 carries the core 210 on which the coil 220 is formed from the holding mechanism 30, and moves the core 210 to the bonding apparatus 2 (see FIG. 1).

Figure 7:
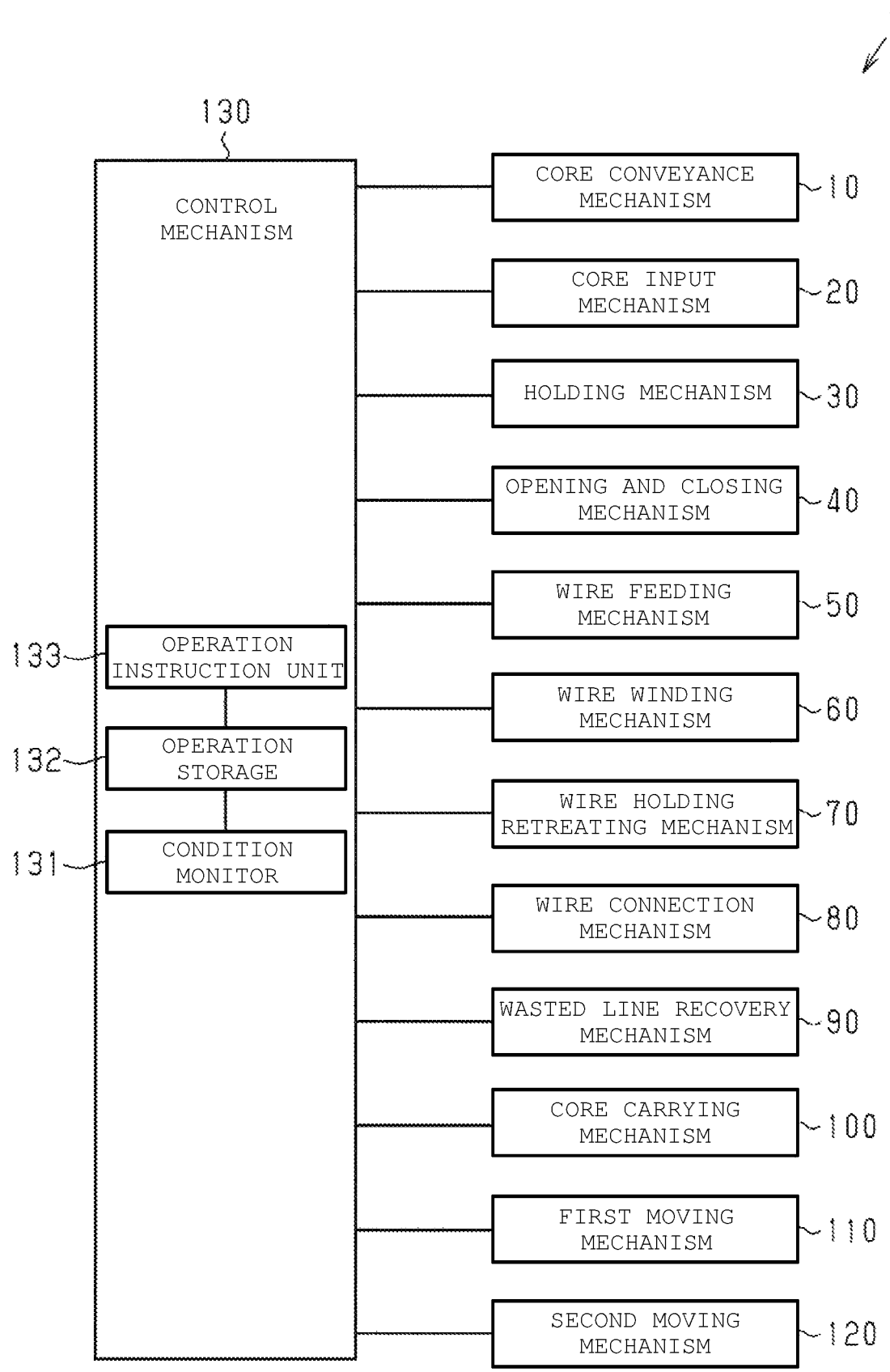
FIG. 7 is a block diagram illustrating an electric configuration of the winding apparatus.

As illustrated in FIG. 7, the winding apparatus 1 includes a control mechanism 130 that controls operations of the mechanisms 10 to 120. The control mechanism 130 includes a condition monitor 131, an operation storage 132, and an operation instruction unit 133. For example, the condition monitor 131 and the operation instruction unit 133 include a CPU (Central Processing Unit) and an MPU (Micro Processing Unit). For example, the operation storage 132 includes a nonvolatile memory and a volatile memory. The control mechanism 130 of the first embodiment corresponds to the controller.

The condition monitor 131 monitors operation conditions of the mechanisms 10 to 120. Pieces of information about the operation conditions of mechanisms 10 to 120 are input to the condition monitor 131, the operation conditions being detected by cameras and sensors, which are provided in the mechanisms 10 to 120. The condition monitor 131 outputs the current operation conditions of the mechanisms 10 to 120 to the operation storage 132 based on the pieces of information about the operation conditions of mechanisms 10 to 120.

Various control programs and pieces of information used in various pieces of processing are stored in the operation storage 132. An example of the pieces of information used in various pieces of processing is current operation conditions of the mechanisms 10 to 120, the current operation conditions being output from the condition monitor 131.

The operation instruction unit 133 outputs operation instruction signals for the mechanisms 10 to 120 to the mechanisms 10 to 120 based on the various control programs stored in the operation storage 132. By way of example, the operation instruction unit 133 performs feedback control to generate the operation instruction signals such that mechanisms 10 to 120 agree with control target values of the mechanisms 10 to 120 with respect to the current operation conditions of the mechanisms 10 to 120.

Detailed configuration and operation of the mechanism related to each process of a method for manufacturing the coil component 200 in the winding apparatus 1 will be described below.

(Component Supply Process)

Figure 8:
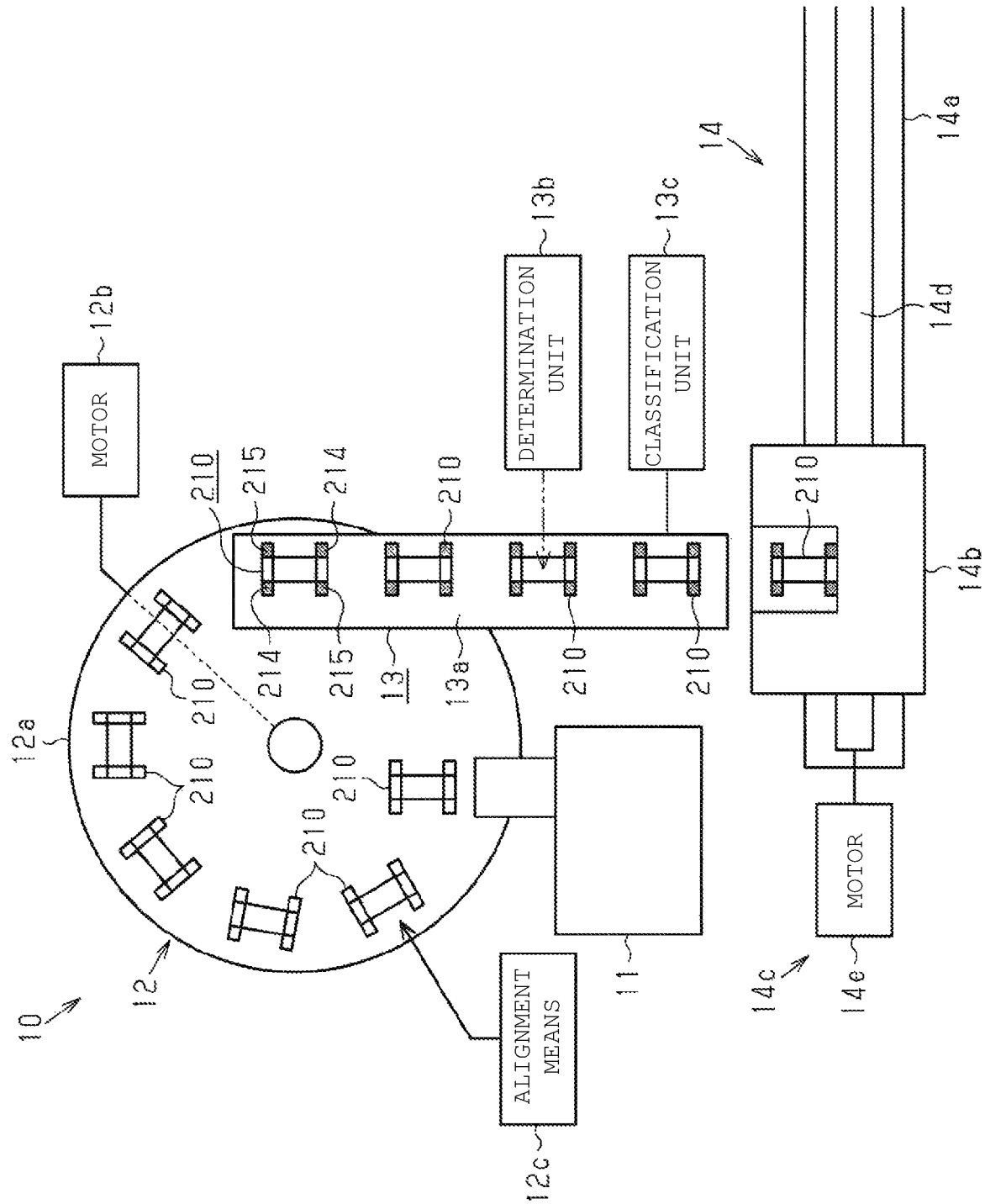
FIG. 8 is a schematic diagram illustrating a configuration of a core conveyance mechanism of the winding apparatus.

As illustrated in FIG. 8, the core conveyance mechanism 10 includes a supply unit 11, an alignment unit 12, a direction selector 13, and a separation and conveyance unit 14. The supply unit 11 supplies the core 210 to the alignment unit 12. The alignment unit 12 aligns orientations of the cores 210, and conveys the core 210 to the direction selector 13. The direction selector 13 conveys the core 210 having a predetermined orientation to the separation and conveyance unit 14, and returns the core 210 except for the core 210 having the predetermined orientation to the supply unit 11. In the first embodiment, the core 210 having the orientation in which the electrodes 214, 215 become an upper surface is defined as the core 210 having the predetermined orientation. The separation and conveyance unit 14 conveys the core 210 having the predetermined orientation to the core input mechanism 20 one by one.

The alignment unit 12 includes a rotation table 12a that holds the core 210, a motor 12b that rotates the rotation table 12a, and alignment means 12c that aligns the orientation of the core 210. The alignment means 12c changes a length direction of the core 210 to a rotation direction of the rotation table 12a in FIG. 4. Non-contact means for magnetically attracting the core 210 using a magnet (not illustrated) or contact means for changing the core 210 to the rotation direction of the rotation table 12a using a wall (not illustrated), which is provided in the rotation table 12a and extends along the rotation direction, can be used as the alignment means.

The direction selector 13 includes a conveyance unit 13a that conveys the core 210 conveyed from the alignment unit 12 toward the separation and conveyance unit 14, a determination unit 13b that determines whether or not the core 210 is oriented toward the predetermined orientation, and a classification unit 13c that returns the core 210 except for the core 210 having the predetermined orientation to the supply unit 11. For example, the conveyance unit 13a is a belt conveyer, and is driven by a motor (not illustrated). For example, the determination unit 13b includes a camera, and determines whether the electrodes 214, 215 of the core 210 are located on the upper surface based on an image captured by the camera. For example, the classification unit 13c is configured to be able to discharge compressed air to a predetermined region on the conveyance unit 13a. The classification unit 13c discharges the compressed air to return the core 210 except for the core 210 having the predetermined orientation to the supply unit 11 when the core 210 except for the core 210 having the predetermined orientation is positioned in the predetermined region on the conveyance unit 13a by the determination unit 13b.

The separation and conveyance unit 14 includes a linear rail 14a, a carrier 14b movable with respect to the rail 14a, and an actuator 14c that moves the carrier 14b. An example of the actuator 14c is a feed screw mechanism including a screw 14d extending along the longitudinal direction of the rail 14a and a motor 14e constituting a driving source that rotates the screw 14d. The carrier 14b is coupled to the screw 14d, and is reciprocally movable in an axial direction of the screw 14d in association with the rotation of the screw 14d. The core 210 conveyed from the direction selector 13 is supplied to the carrier 14b.

The control mechanism 130 (see FIG. 7) performs direction selection control to control the operation of the core conveyance mechanism 10. The direction selection control includes core supply processing, rotating processing, conveyance processing, direction selection processing, classification processing, carrier position control processing, and carrier moving processing. In the component supply process, the control mechanism 130 supplies the core 210 from the supply unit 11 to the rotation table 12a based on the core supply processing, and performs driving control on the motor 12b such that the rotation table 12a turns at a constant speed through the rotating processing. Consequently, the alignment means 12c aligns the orientation of the core 210 while the core 210 is conveyed from the rotation table 12a to the direction selector 13. The control mechanism 130 performs driving control on the motor of the direction selector 13 such that the conveyance unit 13a conveys the core 210 at a constant speed through the conveyance processing. The control mechanism 130 determines whether the core 210 is the core 210 in which the electrodes 214, 215 are located on the upper surface or not using the determination unit 13b through the direction selection processing, and returns the core 210 except for the core 210 in which the electrodes 214, 215 are located on the upper surface to the supply unit 11 using the classification unit 13c through the classification processing. Consequently, only the core 210 in which the electrodes 214, 215 are located on the upper surface is supplied to the carrier 14b. Through the carrier position control processing and the carrier moving processing, the carrier 14b is moved from a first position corresponding to the conveyance unit 13a to a second position where the core input mechanism 20 can take out the core 210.

(Component Input Process)

Figure 9:
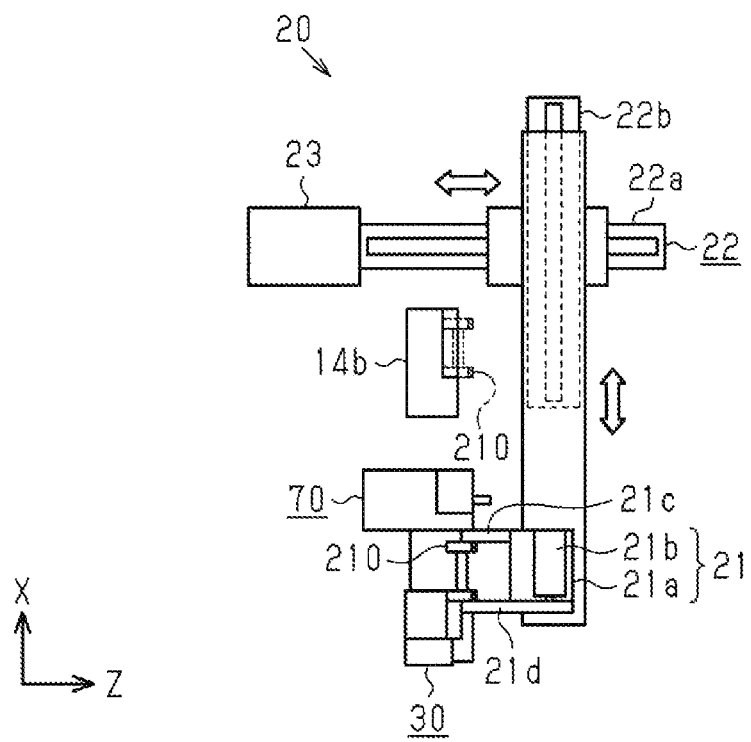
FIG. 9 is a schematic diagram illustrating a configuration of a core input mechanism of the winding apparatus.
Figure 12:
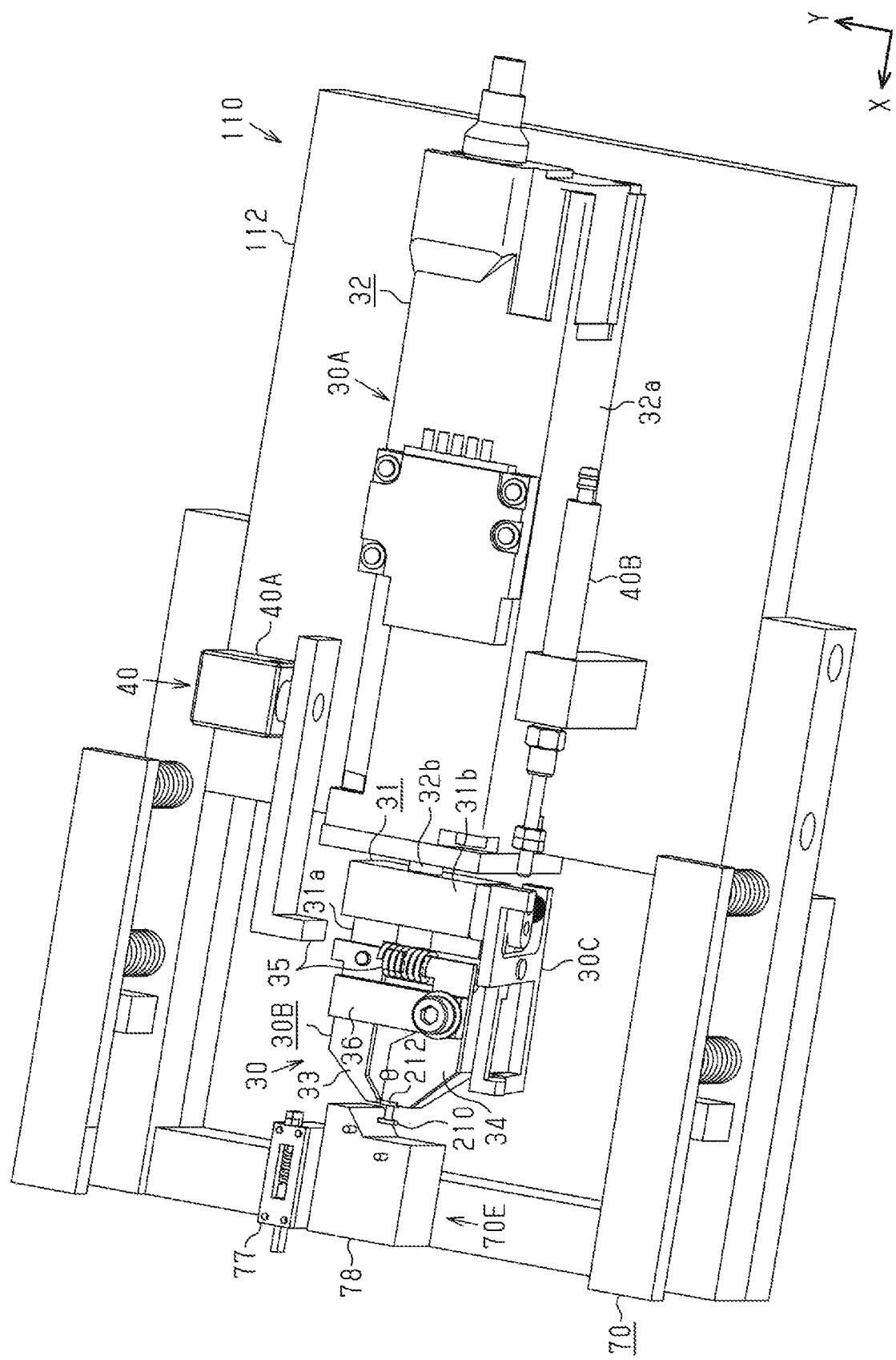
FIG. 12 is a perspective view illustrating a detailed configuration of the holding mechanism of the winding apparatus and its periphery.

The core input mechanism 20 in FIG. 9 and the holding mechanism 30 and the opening and closing mechanism 40 in FIG. 12 are used in the component input process. In FIG. 9 to FIG. 11, the rail 14a and the actuator 14c of the separation and conveyance unit 14 and parts of the core holding unit 30B and the wire holding retreating mechanism 70 are omitted for convenience.

Figure 10A:
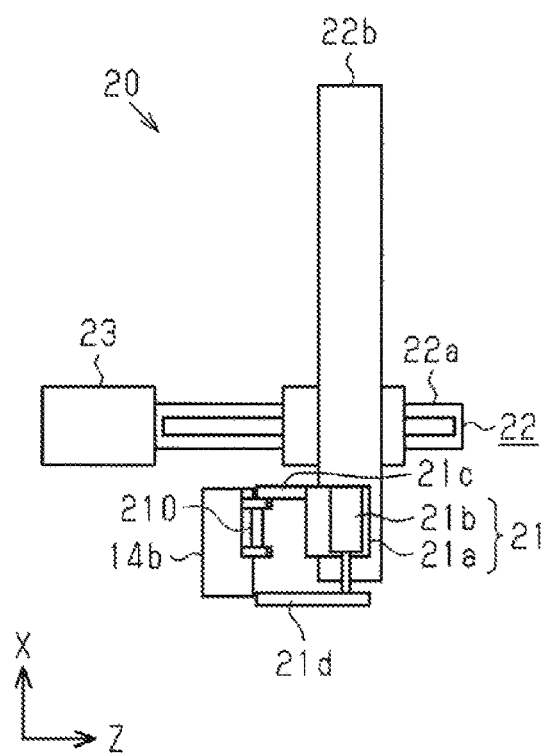
FIG. 10A is a schematic diagram illustrating a state before the core input mechanism holds a core.

As illustrated in FIG. 9, the core input mechanism 20 includes a core holding and fixing unit 21, a core conveyance unit 22, and a core attitude support unit 23. The core attitude support unit 23 is located on the opposite side to the holding mechanism 30 with respect to carrier 14b in a front-back direction X. The core conveyance unit 22 is coupled to the core attitude support unit 23. The core conveyance unit 22 includes a first electric cylinder 22a and a second electric cylinder 22b. The first electric cylinder 22a can move the second electric cylinder 22b in a vertical direction Z. The second electric cylinder 22b can be moved in the front-back direction X with respect to the first electric cylinder 22a. The core holding and fixing unit 21 is fixed to a leading end of the second electric cylinder 22b. The core holding and fixing unit 21 includes a holding member 21a and an opening and closing cylinder 21b. As illustrated in FIG. 10A, the holding member 21a includes a first arm 21c and a second arm 21d, which extend in the vertical direction Z. The second arm 21d is movable in the front-back direction X by the opening and closing cylinder 21b. The core holding and fixing unit 21 can hold the core 210 by the arms 21c, 21d moved by the opening and closing cylinder 21b.

Figure 10B:
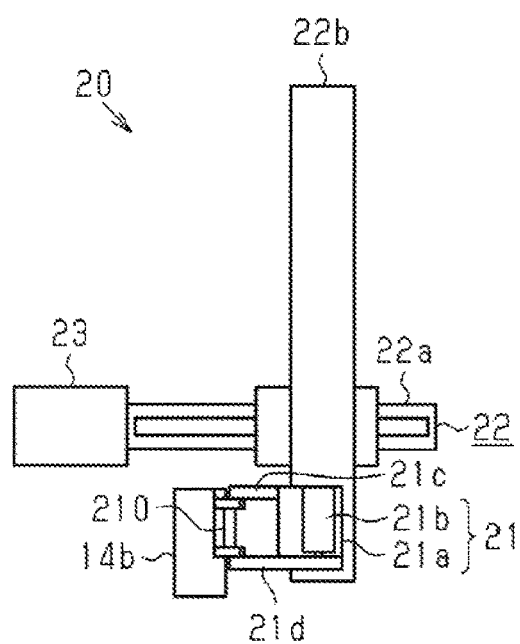
FIG. 10B is a schematic diagram illustrating a state in which the core input mechanism holds the core.

The control mechanism 130 (see FIG. 7) performs core input position control to control the operation of the core input mechanism 20. The core input position control includes holding and opening and closing processing, moving processing, and position control processing. In the component input process, as illustrated in FIG. 10A, the control mechanism 130 controls the opening and closing cylinder 21b such that the second arm 21d is separated from the first arm 21c through the holding and opening and closing processing, and the control mechanism 130 controls the electric cylinders 22a, 22b such that the core holding and fixing unit 21 is moved to face the carrier 14b through the moving processing. In FIG. 10A, the first arm 21c is in contact with the second flange 213 of the core 210 in the carrier 14b. As illustrated in FIG. 10B, through the holding and opening and closing processing, the control mechanism 130 controls the opening and closing cylinder 21b such that the second arm 21d is brought close to the first arm 21c to pinch the core 210 between the second arm 21d and the first arm 21c. Consequently, the core holding and fixing unit 21 holds the core 210.

The control mechanism 130 controls the first electric cylinder 22a such that, while the core holding and fixing unit 21 holds the core 210 as illustrated in FIG. 11A, the core holding and fixing unit 21 is moved upward through the moving processing as illustrated in FIG. 11B. Consequently, the core holding and fixing unit 21 takes out the core 210 from the carrier 14b. The control mechanism 130 controls the second electric cylinder 22b such that the core holding and fixing unit 21 is moved to a position facing the holding mechanism 30 in the vertical direction Z through the moving processing as illustrated in FIG. 11C, and the control mechanism 130 controls the first electric cylinder 22a such that the core holding and fixing unit 21 is moved upward as illustrated in FIG. 11D. Consequently, the core 210 is supplied from the carrier 14b to the holding mechanism 30 while avoiding the wire holding retreating mechanism 70.

As illustrated in FIG. 12, the holding mechanism 30 that can hold the core 210 and the wires W1, W2 and the opening and closing mechanism 40 that operates the holding mechanism 30 are attached to a carrier 112 of the first moving mechanism 110. The holding mechanism 30 includes a rotation unit 30A, a core holding unit 30B, and a start-line-side wire holding unit 30C. A part of the core holding unit 30B and the start-line-side wire holding unit 30C are attached to the rotation unit 30A. The core holding unit 30B and the start-line-side wire holding unit 30C are located outside the carrier 112 in the front-back direction X. The opening and closing mechanism 40 is disposed on both sides in a horizontal direction Y of the holding mechanism 30. The opening and closing mechanism 40 includes a core opening and closing unit 40A that opens and closes the core holding unit 30B and a start-line-side wire opening and closing unit 40B that opens and closes the start-line-side wire holding unit 30C. The start-line-side wire opening and closing unit 40B is located on the side on which the start-line-side wire holding unit 30C is located with respect to the rotation unit 30A in the horizontal direction Y. The core opening and closing unit 40A is located on the opposite side to the side on which the start-line-side wire holding unit 30C is located with respect to the rotation unit 30A in the horizontal direction Y.

The rotation unit 30A rotates a part of the core holding unit 30B and the start-line-side wire holding unit 30C. The rotation unit 30A includes a rotation table 31 to which the part of the core holding unit 30B and the start-line-side wire holding unit 30C are attached and a rotation device 32 that rotates the rotation table 31. The rotation device 32 includes a motor constituting a driving source, a speed reducer that reduces a rotation speed of the motor, a case 32a in which the motor and the speed reducer are accommodated, and an output shaft 32b that outputs a torque of the rotation device 32. The case 32a extends in the front-back direction X. In the case 32a, the motor and the speed reducer are arranged in the front-back direction X. The output shaft 32b that takes out output from the speed reducer is coupled to the rotation table 31 while projecting from the case 32a. That is, the rotation table 31 rotates integrally with the output shaft 32b. The rotation table 31 is formed into a substantial L-shape when viewed from the horizontal direction Y. The rotation table 31 includes a placing table 31a on which a part of the core holding unit 30B is placed and a coupling wall 31b projecting upward from the placing table 31a. The output shaft 32b is coupled to the coupling wall 31b. The placing table 31a is located below the output shaft 32b. The start-line-side wire holding unit 30C is fixed to a side surface in the horizontal direction Y of the coupling wall 31b.

The core holding unit 30B holds the core 210 conveyed from the core input mechanism 20 (see FIG. 11). The core holding unit 30B includes a movable-side holding member 33, a fixed-side holding member 34, an opening and closing body 35, and a pressing plate 36. The first flange 212 of the core 210 is pinched between the movable-side holding member 33 and the fixed-side holding member 34. The movable-side holding member 33 and the fixed-side holding member 34 are arranged in the horizontal direction Y. A center axis of the winding core 211 of the core 210 pinched between the movable-side holding member 33 and the fixed-side holding member 34 is coaxial with a center axis of the output shaft 32b of the rotation unit 30A. That is, the core 210 rotates about the center axis of the winding core 211 in association with the rotation of the rotation unit 30A.

Figure 13A:
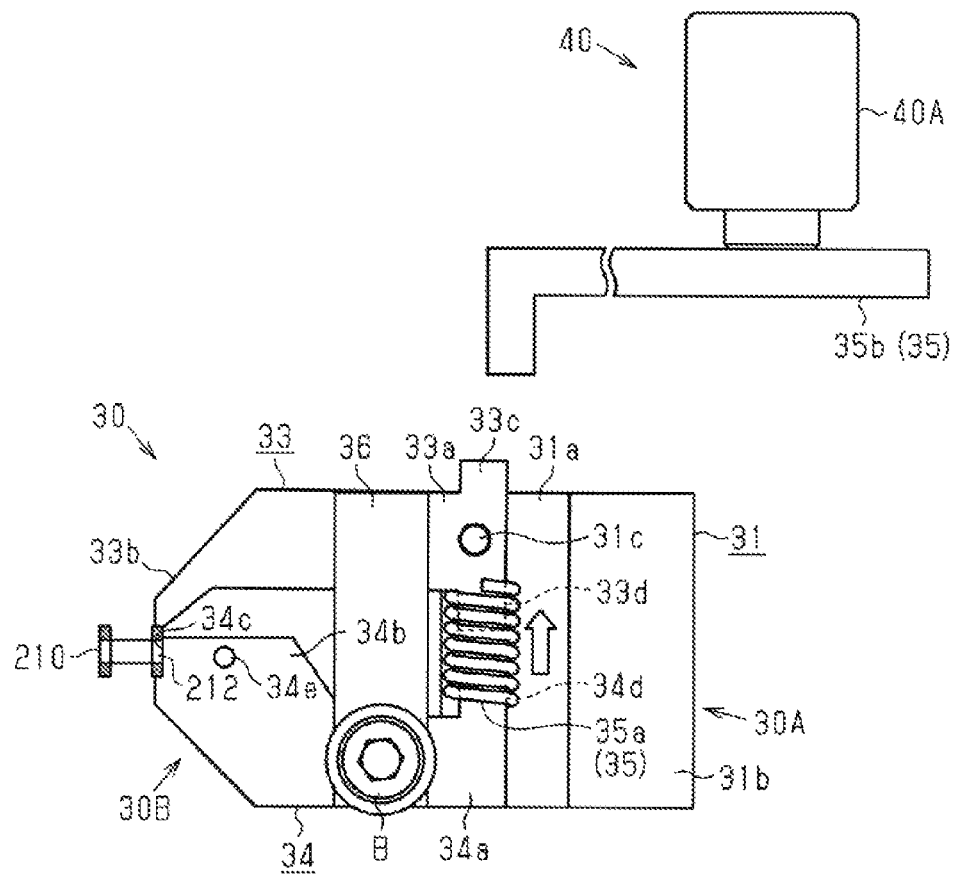
FIG. 13A is a plan view illustrating the holding mechanism and a core opening and closing unit when the holding mechanism is in a holding state.

As illustrated in FIG. 13A, the movable-side holding member 33 is attached so as to be rotatable with respect to a rotation shaft body 31c provided in the placing table 31a. The movable-side holding member 33 includes a main body unit 33a, a holding pawl 33b, a pressed unit 33c, and an attaching unit 33d. The main body unit 33a, the holding pawl 33b, the pressed unit 33c, and the attaching unit 33d are integrally formed. The holding pawl 33b is inclined onto the side of the fixed-side holding member 34 from the main body unit 33a toward the leading end. The pressed unit 33c and the attaching unit 33d extend in the horizontal direction Y from the end of the main body unit 33a on the side of the coupling wall 31b. The pressed unit 33c extends from the opposite side to the fixed-side holding member 34 in the horizontal direction Y in the main body unit 33a toward the core opening and closing unit 40A. The attaching unit 33d extends from the side of the fixed-side holding member 34 in the horizontal direction Y in the main body unit 33a toward the fixed-side holding member 34.

The fixed-side holding member 34 and the pressing plate 36 are fixed to the placing table 31a with a bolt B in the state in which the fixed-side holding member 34 and the pressing plate 36 overlap each other while the pressing plate 36 is located above the fixed-side holding member 34. The fixed-side holding member 34 includes a main body unit 34a, a bulge unit 34b, an accommodation unit 34c, and an attaching unit 34d. The main body unit 34a, the bulge unit 34b, the accommodation unit 34c, and the attaching unit 34d are integrally formed. The main body unit 34a is formed into a rectangular shape extending in the front-back direction X, and the pressing plate 36 is placed on the main body unit 34a. The bulge unit 34b extends from the main body unit 34a toward the holding pawl 33b of the movable-side holding member 33. A columnar hook member 34e extending upward from the bulge unit 34b is provided in a portion of the bulge unit 34b on the side of the movable-side holding member 33. The accommodation unit 34c is formed at the leading end of the bulge unit 34b. The first flange 212 of the core 210 can be accommodated in the accommodation unit 34c. The attaching unit 34d extends from the end of the main body unit 34a on the side of the coupling wall 31b toward the movable-side holding member 33.

The pressing plate 36 extends in the horizontal direction Y. The pressing plate 36 covers the movable-side holding member 33 from above. Consequently, the upward movement of the movable-side holding member 33 is regulated.

The opening and closing body 35 is a component that rotates the movable-side holding member 33 about the rotation shaft body 31c. The opening and closing body 35 includes an elastic body 35a and a pressing member 35b. The elastic body 35a can be compressed in the horizontal direction Y. An example of the elastic body 35a is a coil spring. The elastic body 35a is attached to the attaching unit 33d of the movable-side holding member 33 and the attaching unit 34d of the fixed-side holding member 34. The pressing member 35b is formed into an L-shape in planar view. The pressing member 35b is disposed at a position separated from the rotation unit 30A (see FIG. 12) and a position facing the pressed unit 33c of the movable-side holding member 33 in the horizontal direction Y. The pressing member 35b is coupled to the core opening and closing unit 40A, and is movable in the horizontal direction Y by the core opening and closing unit 40A. For example, the core opening and closing unit 40A is an electric cylinder.

Figure 13B:
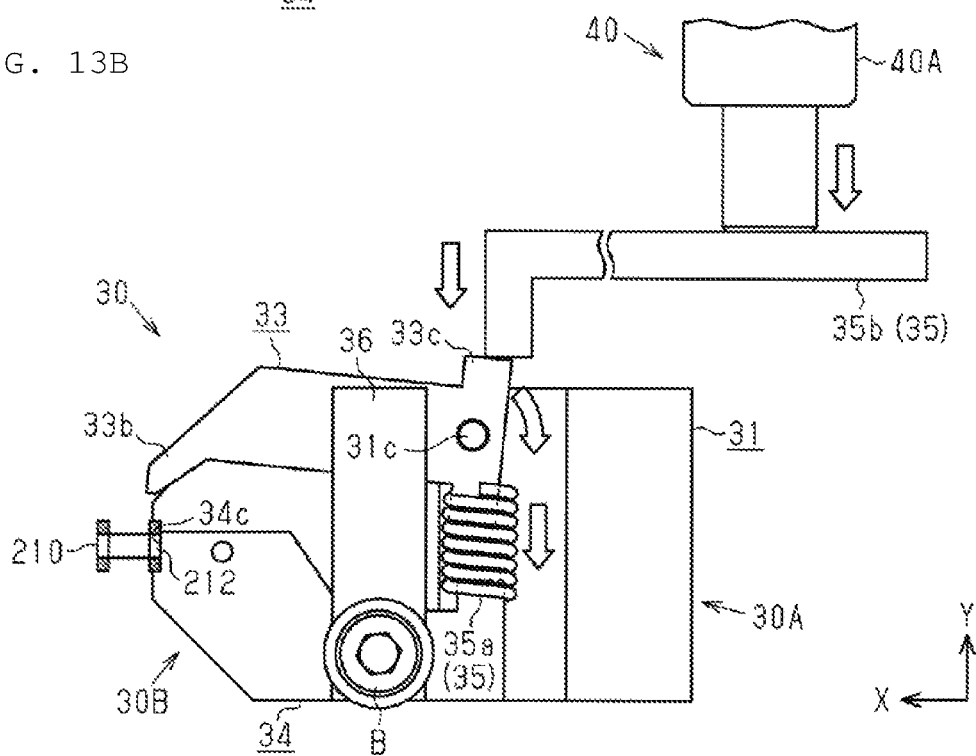
FIG. 13B is a plan view illustrating the holding mechanism and the core opening and closing unit when the holding mechanism is in a holding release state.

The core opening and closing unit 40A can switch the core holding unit 30B between a core holding state in FIG. 13A and a core holding release state in FIG. 13B. As illustrated in FIG. 13A, in the core holding state, the pressing member 35b does not press the movable-side holding member 33. Consequently, in the movable-side holding member 33, the holding pawl 33b is pressed against the accommodation unit 34c of the fixed-side holding member 34 by elastic force of the elastic body 35a. Thus, the first flange 212 of the core 210 is pinched between the holding pawl 33b and the accommodation unit 34c. As illustrated in FIG. 13B, the pressing member 35b presses the movable-side holding member 33 using the core opening and closing unit 40A, whereby the movable-side holding member 33 rotates clockwise about the rotation shaft body 31c. As a result, the holding pawl 33b is separated from the accommodation unit 34c, namely, the holding pawl 33b is separated from the first flange 212 of the core 210, so that the core holding state is changed to the core holding release state.

The control mechanism 130 (see FIG. 7) performs core holding control to control the operation of the core holding unit 30B. The control mechanism 130 maintains the core holding unit 30B in the core holding release state before the core input mechanism 20 disposes the first flange 212 of the core 210 in the accommodation unit 34c of the fixed-side holding member 34. That is, the control mechanism 130 maintains the state in which the electric cylinder that is of the core opening and closing unit 40A is driven to press the pressing member 35b against the movable-side holding member 33. When determining that the core input mechanism 20 accommodates the first flange 212 of the core 210 in the accommodation unit 34c of the fixed-side holding member 34, the control mechanism 130 drives the core opening and closing unit 40A to separate the pressing member 35b from the movable-side holding member 33. Consequently, because the elastic body 35a presses a rear portion of the movable-side holding member 33, the holding pawl 33b moves toward the accommodation unit 34c, and the first flange 212 of the core 210 is pinched between the holding pawl 33b and the accommodation unit 34c. For example, the control mechanism 130 determines whether or not the first flange 212 of the core 210 is accommodated in the accommodation unit 34c based on an image of the accommodation unit 34c captured by the camera.

Figure 14:
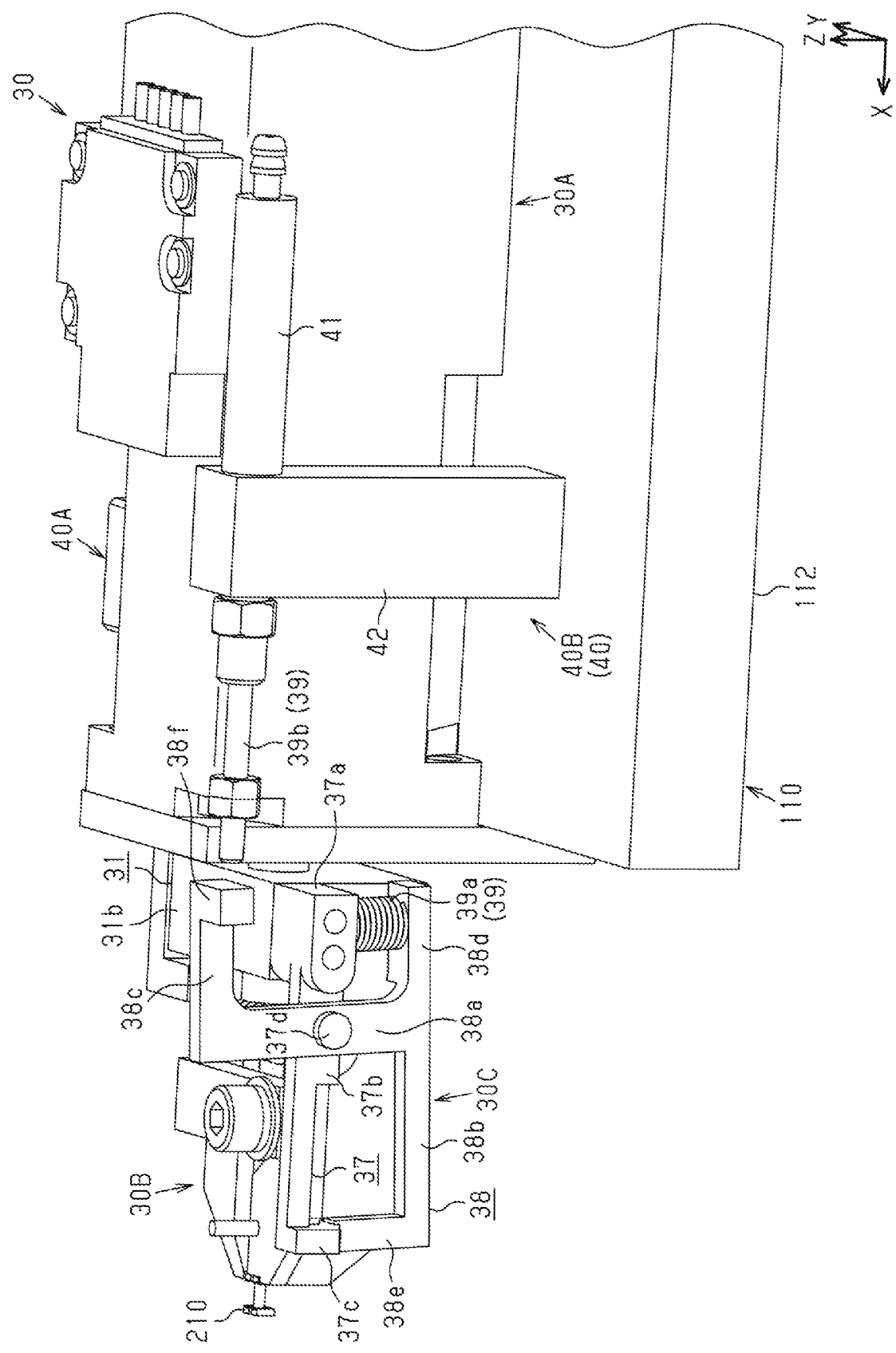
FIG. 14 is a perspective view illustrating a detailed configuration of a start-line-side wire holding unit of the winding apparatus and its periphery.

As illustrated in FIG. 14, the start-line-side wire holding unit 30C includes a fixed-side holding member 37, a movable-side holding member 38, and an opening and closing body 39.

The fixed-side holding member 37 is fixed to a side surface of the coupling wall 31b of the rotation table 31 with a plurality of bolts (not illustrated). The fixed-side holding member 37 includes a fixed unit 37a, an arm unit 37b, a holding unit 37c, and a rotation shaft body 37d. The fixed unit 37a, the arm unit 37b, and the holding unit 37c are integrally formed. The rotation shaft body 37d is fixed to the arm unit 37b. The fixed unit 37a is a portion fixed to the coupling wall 31b. The arm unit 37b extends forward from the fixed unit 37a. The holding unit 37c is formed at the leading end of the arm unit 37b.

The movable-side holding member 38 includes a coupling unit 38a, a holding arm unit 38b, a first arm unit 38c, and a second arm unit 38d. The rotation shaft body 37d rotatably couples the coupling unit 38a to the arm unit 37b of the fixed-side holding member 37. The coupling unit 38a extends in the vertical direction Z. The holding arm unit 38b extends in a direction separating from the carrier 112 in the front-back direction X from a lower end of the coupling unit 38a. The holding arm unit 38b is formed into a substantial L-shape in side view. A holding unit 38e extending upward is formed at a front end of the holding arm unit 38b. The holding unit 38e faces the holding unit 37c in the vertical direction Z. The first arm unit 38c extends from the upper end of the coupling unit 38a toward the side of the carrier 112 in the front-back direction X. The first arm unit 38c is located above the coupling unit 38a, and faces the coupling unit 38a in the vertical direction Z. The first arm unit 38c is formed into a substantial L-shape in planar view. A pressed unit 38f pressed by the start-line-side wire opening and closing unit 40B is formed at the end on the side of the carrier 112 in the first arm unit 38c. The second arm unit 38d extends from the lower end of the coupling unit 38a toward the side of the carrier 112 in the front-back direction X. The second arm unit 38d is located below the coupling unit 38a, and faces the coupling unit 38a in the vertical direction Z.

The opening and closing body 39 is a component that rotates the movable-side holding member 38 about the rotation shaft body 37d. The opening and closing body 39 includes an elastic body 39a and a pressing bar 39b. The elastic body 39a can be compressed in the vertical direction Z. An example of the elastic body 39a is a coil spring. The elastic body 39a is sandwiched in the vertical direction Z between the second arm unit 38d and the coupling unit 38a. The pressing bar 39b is located on the side of the carrier 112 with respect to the pressed unit 38f of the first arm unit 38c, and faces the pressed unit 38f in the front-back direction X. The pressing bar 39b is coupled to the start-line-side wire opening and closing unit 40B. The pressing bar 39b pushes the pressed unit 38f using the start-line-side wire opening and closing unit 40B.

The start-line-side wire opening and closing unit 40B includes a cylinder 41 and a support member 42 supporting the cylinder 41. An example of the cylinder 41 is a pneumatic cylinder. The start-line-side wire opening and closing unit 40B can move the pressing bar 39b in the front-back direction X by the operation of the cylinder 41.

Figure 15A:
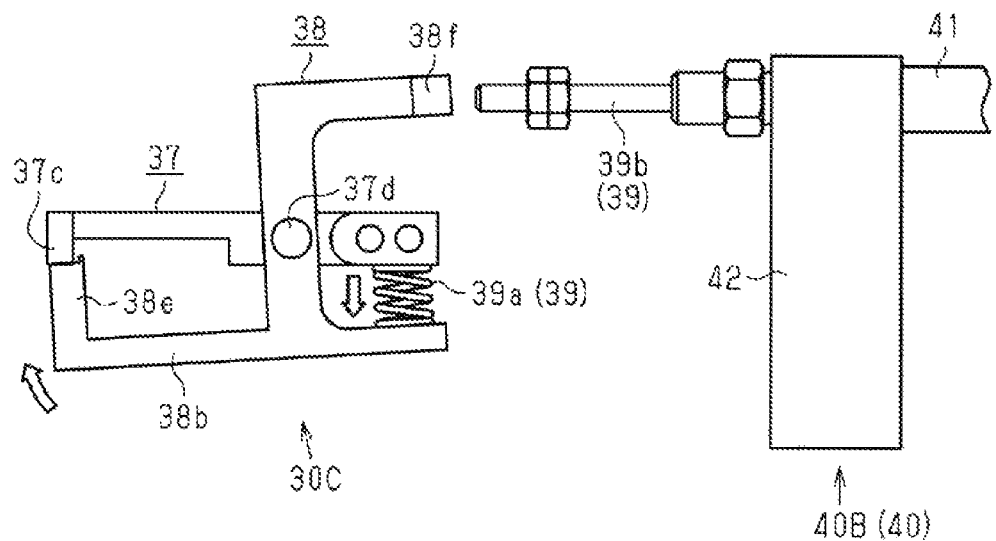
FIG. 15A is a side view illustrating a start-line-side wire holding unit and a start-line-side wire opening and closing unit when the start-line-side wire holding unit is in a wire holding state.
Figure 15B:
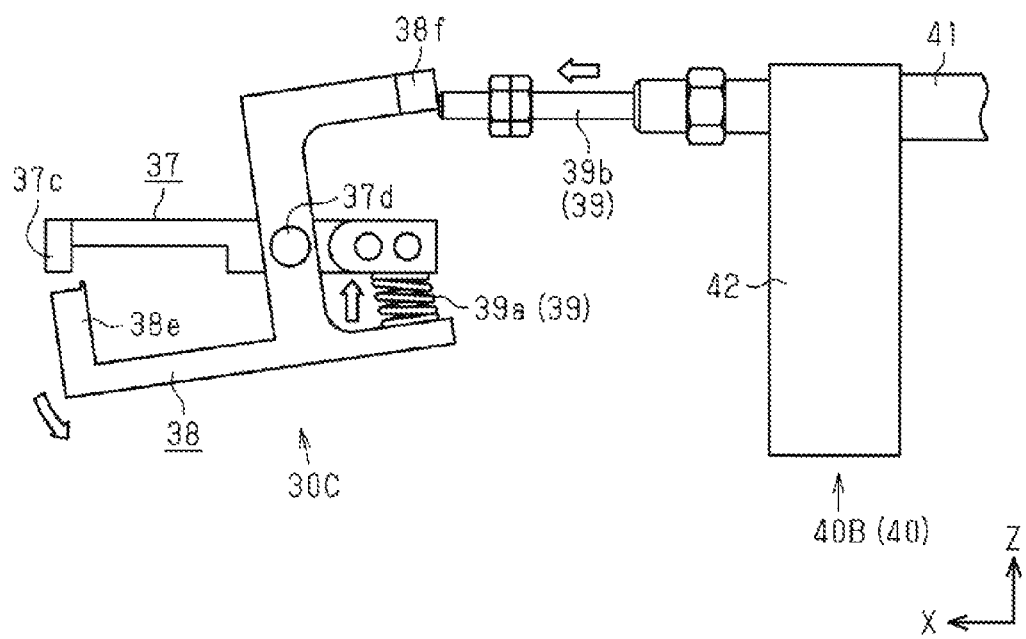
FIG. 15B is a side view illustrating the start-line-side wire holding unit and the start-line-side wire opening and closing unit when the start-line-side wire holding unit is in a wire holding release state.

The start-line-side wire opening and closing unit 40B can switch between the wire holding state in FIG. 15A and the wire holding release state in FIG. 15B using the start-line-side wire holding unit 30C. As illustrated in FIG. 15A, in the wire holding state, the pressing bar 39b does not press the movable-side holding member 38. Consequently, in the movable-side holding member 38, because the elastic body 39a presses the second arm unit 38d onto the opposite side to the coupling unit 38a, the holding unit 38e of the holding arm unit 38b moves toward the holding unit 37c of the fixed-side holding member 37. As illustrated in FIG. 15B, the pressing bar 39b presses the movable-side holding member 38 using the start-line-side wire opening and closing unit 40B, whereby the movable-side holding member 38 rotates counterclockwise about the rotation shaft body 37d in side view of the start-line-side wire holding unit 30C. Consequently, the wire holding state is changed to the wire holding release state because the holding unit 38e of the movable-side holding member 38 is separated downward from the holding unit 37c of the fixed-side holding member 37.

The control mechanism 130 (see FIG. 7) performs wire holding control to control the operation of the start-line-side wire holding unit 30C. The control mechanism 130 maintains the start-line-side wire holding unit 30C in the wire holding release state before the wire winding mechanism 60 (see FIG. 4) disposes the first and second wires W1, W2 (see FIG. 2) between the holding unit 37c of the fixed-side holding member 37 and the holding unit 38e of the movable-side holding member 38. That is, the control mechanism 130 maintains the state in which the cylinder 41 of the start-line-side wire opening and closing unit 40B is driven to press the pressing bar 39b against the movable-side holding member 38. When determining that the wire winding mechanism 60 disposes the first and second wires W1, W2 between the holding unit 37c of the fixed-side holding member 37 and the holding unit 38e of the movable-side holding member 38, the control mechanism 130 drives the start-line-side wire opening and closing unit 40B to separate the pressing bar 39b from the movable-side holding member 38. Consequently, because the elastic body 39a presses the second arm unit 38d of the movable-side holding member 38, the holding unit 38e of the movable-side holding member 38 moves toward the holding unit 37c of the fixed-side holding member 37, and the first and second wires W1, W2 are pinched between the holding units 37c, 38e. For example, the control mechanism 130 determines whether or not the first and second wires W1, W2 are disposed between the holding units 37c, 38e based on the image between the holding units 37c, 38e captured by the camera.

(Coil Forming Process)

Figure 16A:
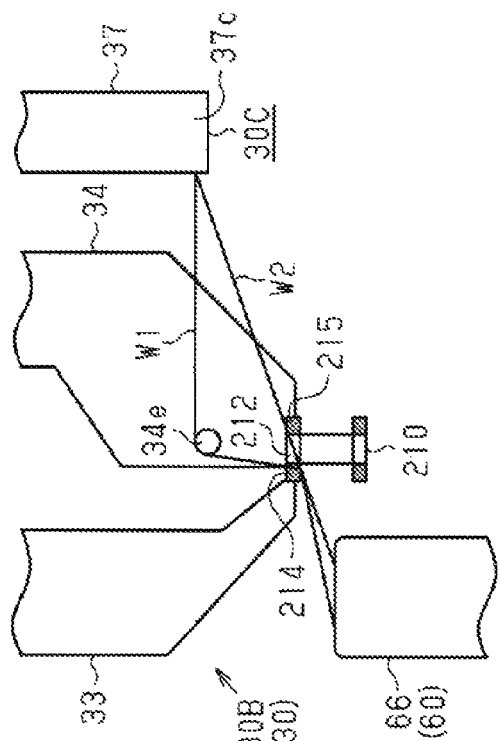
FIGS. 16A to 16D are schematic diagram illustrating operation of the winding apparatus in a coil forming process.
Figure 16B:
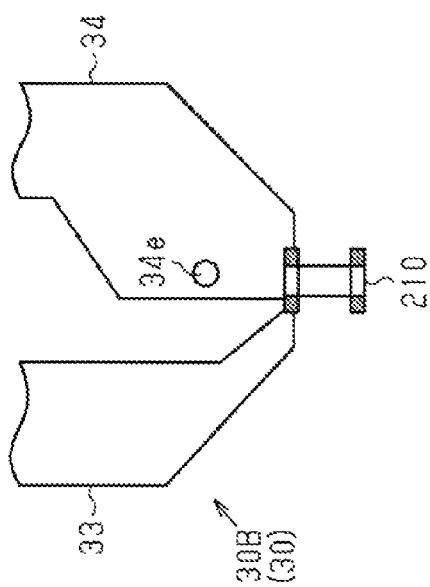
Figure 16C:
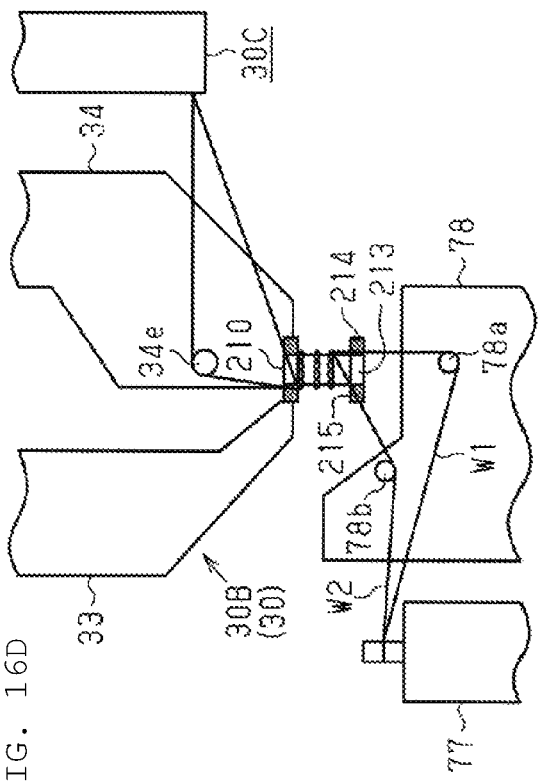
Figure 16D:
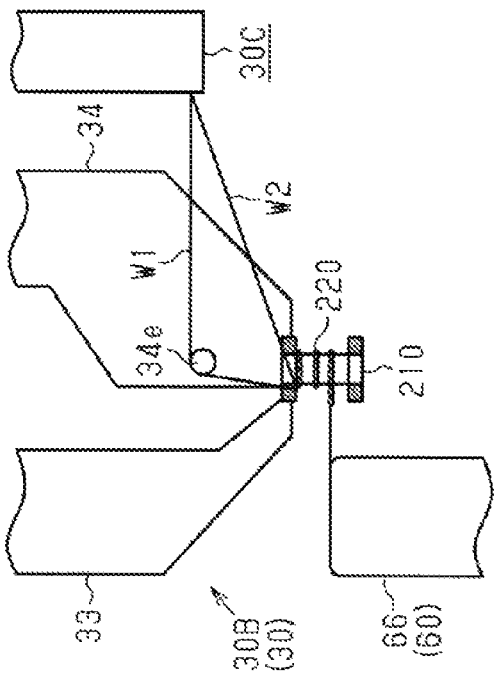

In the coil forming process, the coil 220 is formed on the core 210 as illustrated in FIGS. 16A to 16D. As illustrated in FIG. 16A, with respect to the core 210 held by the holding mechanism 30, the first and second wires W1, W2 are pulled around on the electrodes 214, 215 of the first flange 212 of the core 210 as illustrated in FIG. 16B (winding starting process). As illustrated in FIG. 16C, each of the wires W1, W2 is wound around the winding core 211 (winding process). As illustrated in FIG. 16D, the wires W1, W2 are fixed after the wires W1, W2 are pulled around on the electrodes 214, 215 of the second flange 213 of the core 210 (winding ending process). Details of the winding starting process, the winding process, and the winding ending process will be described in detail below.

(Winding Starting Process)

Figure 17:
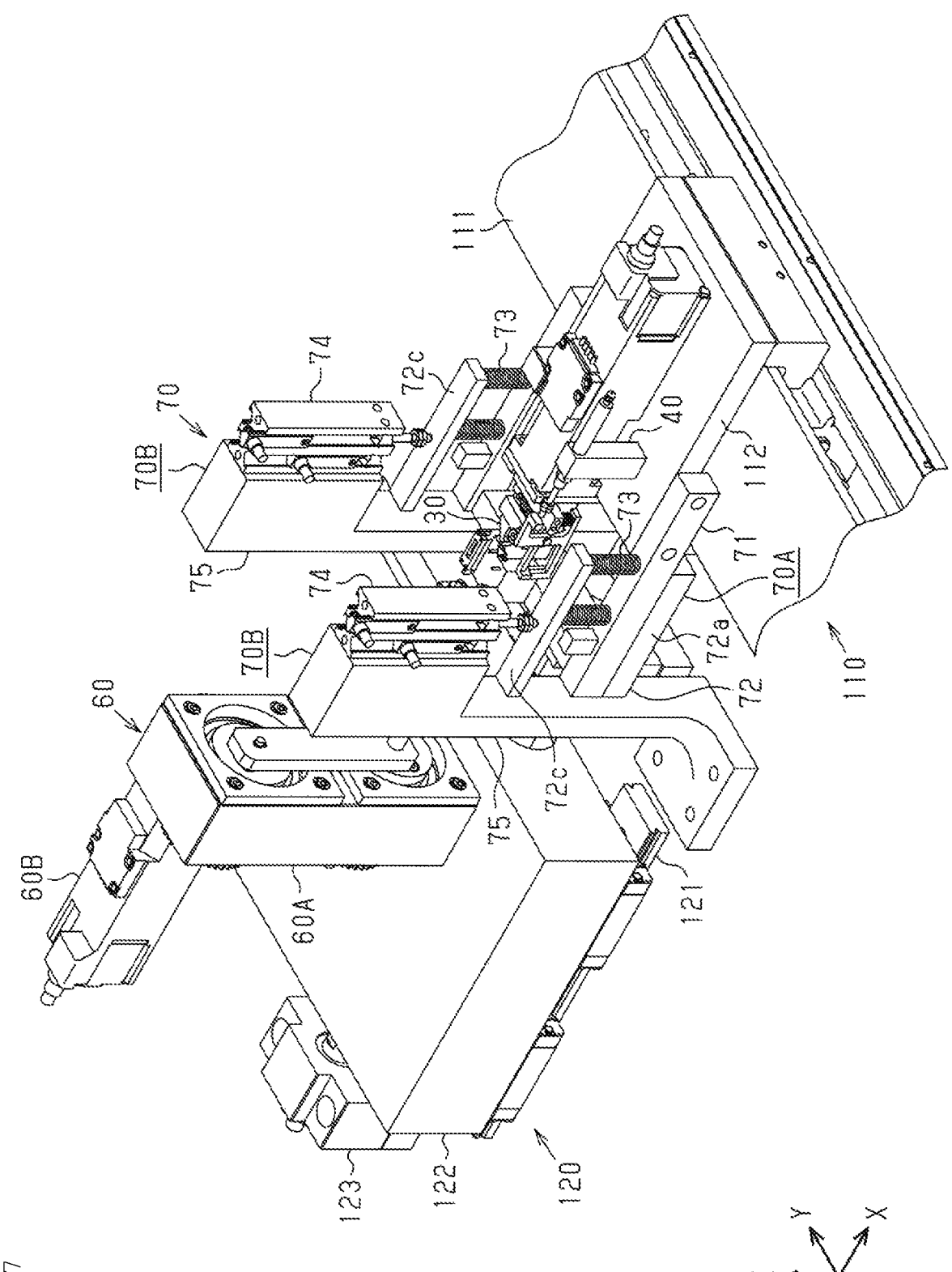
FIG. 17 is a perspective view illustrating a detailed configuration of the holding mechanism, an opening and closing mechanism, a wire winding mechanism, a wire holding retreating mechanism, a first moving mechanism, and a second moving mechanism of the winding apparatus.
Figure 18:
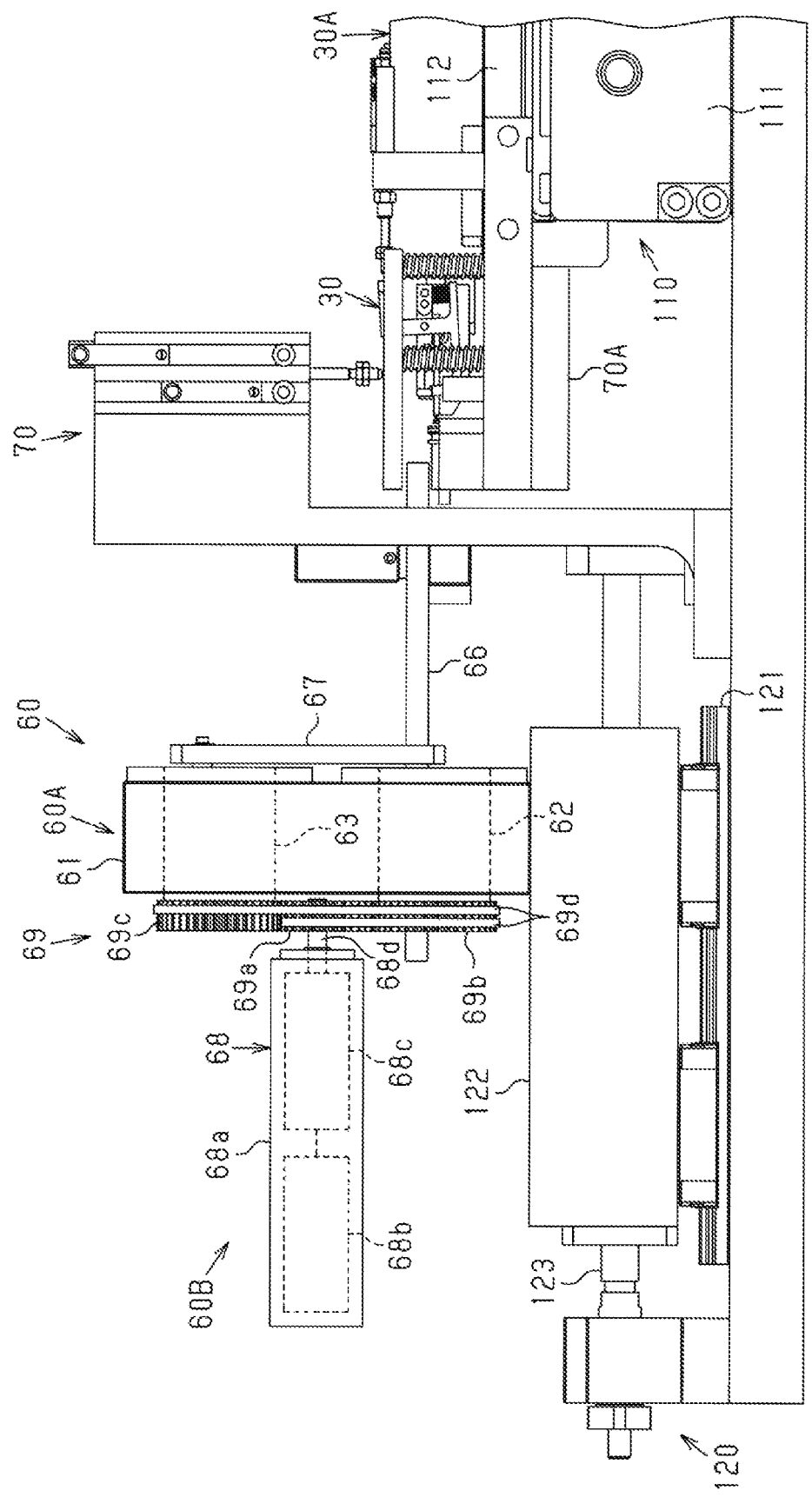
FIG. 18 is a side view of FIG. 17.

The first moving mechanism 110 and the second moving mechanism 120 in FIG. 17 are used in the winding starting process. In FIGS. 17 and 18, the wire feeding mechanism 50 is omitted for convenience.

As illustrated in FIG. 17, the first moving mechanism 110 includes a rail 111 extending in the horizontal direction Y, a carrier 112 that is movably attached to the rail 111, and an actuator (not illustrated) that moves the carrier 112. The holding mechanism 30, the opening and closing mechanism 40, and a movable unit 70A of the wire holding retreating mechanism 70 are attached to the carrier 112. Consequently, the first moving mechanism 110 can move the holding mechanism 30, the opening and closing mechanism 40, and the movable unit 70A in the horizontal direction Y. An example of the actuator is a feed screw mechanism including a screw extending along the longitudinal direction (in the first embodiment, the horizontal direction Y) of the rail 111 and a motor constituting a driving source that rotates the screw. The screw is provided inside the rail 111, and the motor is provided outside the rail 111. The actuator may further include a transmission mechanism that transmits rotating force of the motor to the screw. The transmission mechanism is provided outside the rail 111. An example of the transmission mechanism includes a first pulley coupled to an output shaft of the motor, a second pulley coupled to the screw, and an endless belt entrained about the first pulley and the second pulley.

As illustrated in FIG. 18, the second moving mechanism 120 includes a pair of rails 121 extending in the front-back direction X, a carrier 122 that is movably attached to the rail 121, and an actuator 123 that moves the carrier 122. The wire feeding mechanism 50 (see FIG. 26) and the wire winding mechanism 60 are attached to the carrier 122. Consequently, the second moving mechanism 120 can move the wire feeding mechanism 50 and the wire winding mechanism 60 in the front-back direction X. An example of the actuator 123 is a feed screw mechanism including a screw extending along the longitudinal direction of the rail 121 and a motor constituting a driving source that rotates the screw.

The control mechanism 130 (see FIG. 7) moves the carrier 112 such that the first moving mechanism 110 causes the holding mechanism 30, the opening and closing mechanism 40, and the movable unit 70A to face the wire winding mechanism 60 in the front-back direction X. The control mechanism 130 performs the winding starting process after the first and second wires W1, W2 are held by the wire holding control. The control mechanism 130 relatively moves a wire position support member 66 of the wire winding mechanism 60 and the core holding unit 30B using the second moving mechanism 120 and the first moving mechanism 110 such that the first wire W1 is tangled in the hook member 34e of the fixed-side holding member 34 of the core holding unit 30B. The control mechanism 130 relatively moves the wire position support member 66 of the wire winding mechanism 60 and the core holding unit 30B using the second moving mechanism 120 and the first moving mechanism 110 such that the first wire W1 is hooked on the first electrode 214 of the first flange 212 of the core 210, and such that the second wire W2 is hooked on the second electrode 215 of the first flange 212.

In the winding starting process, the control mechanism 130 may control, instead of the first moving mechanism 110 and the second moving mechanism 120, an arm (not illustrated) that holds and moves the first and second wires W1, W2. In this case, the actuator of the first moving mechanism 110 and the actuator 123 of the second moving mechanism 120 are not driven in the winding starting process.

(Winding Process)

Figure 26A:
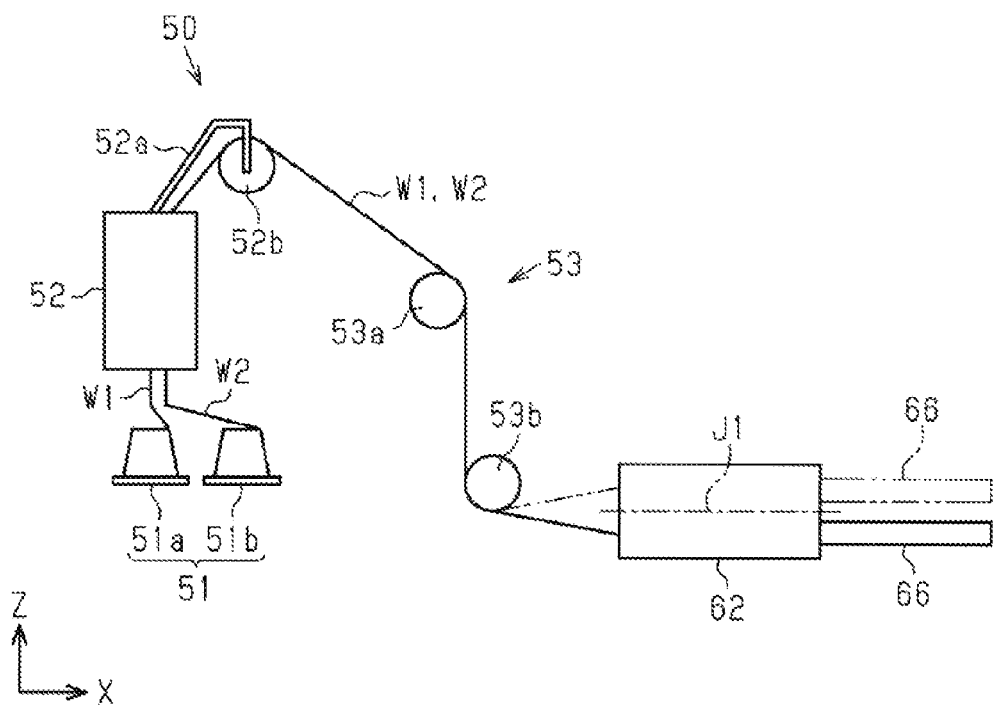
FIG. 26A is a schematic configuration diagram illustrating a wire feeding mechanism of the winding apparatus.
Figure 26B:
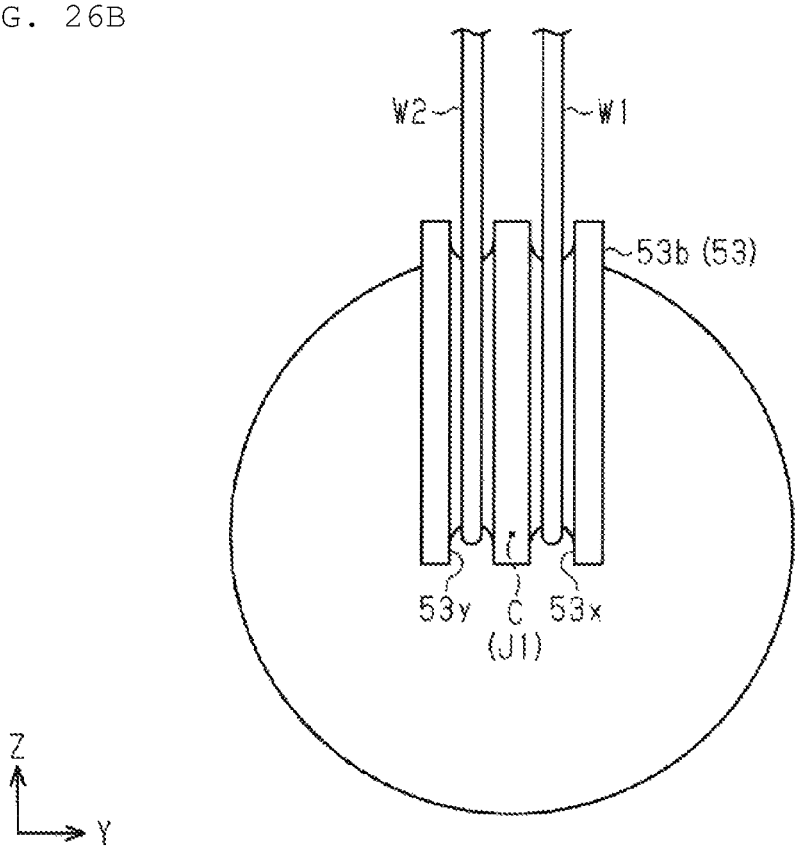
FIG. 26B is a rear view illustrating a positional relationship between the wire position support member and a pulley that feeds a wire to the wire position support member in a wire feeding mechanism.
Figure 27:
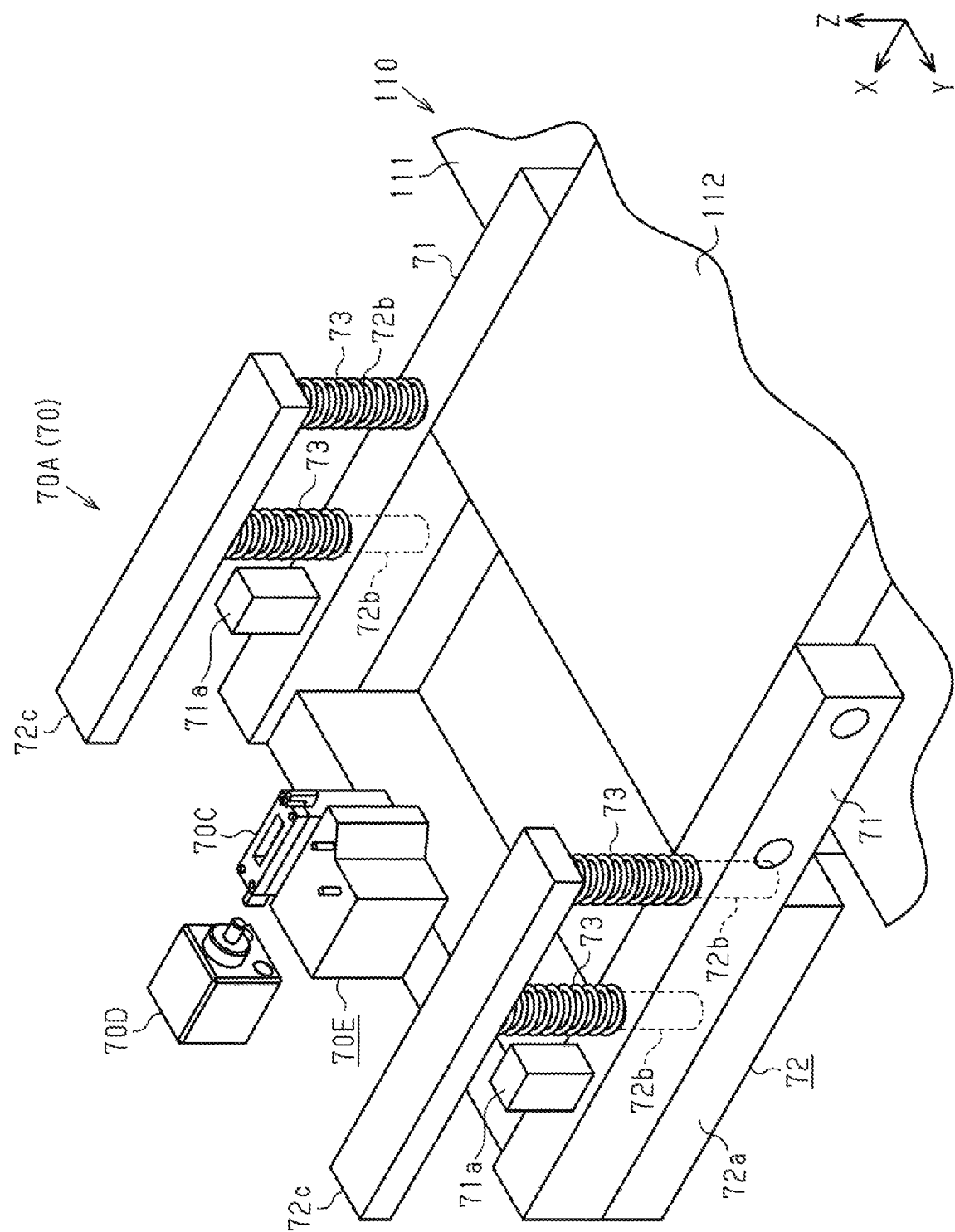
FIG. 27 is a perspective view illustrating a detailed configuration of a part of a wire holding retreating mechanism.

The wire winding mechanism 60 in FIG. 18, the wire feeding mechanism 50 in FIG. 26, and the wire holding retreating mechanism 70 in FIGS. 17 and 27 are used in the winding process.

As illustrated in FIG. 18, the wire winding mechanism 60 includes a winding unit 60A and a winding driving unit 60B. The winding unit 60A includes a housing 61, a first rotation body 62, a second rotation body 63, a plurality of first bearing units 64, a plurality of second bearing units 65 (see FIG. 20), the wire position support member 66, and a synchronous rotation component 67. The winding unit 60A rotates the first rotation body 62 and the second rotation body 63 to orbitally revolve the wire position support member 66, thereby winding the first and second wires W1, W2 around the core 210. The winding driving unit 60B provides a torque to the first rotation body 62 and the second rotation body 63 to rotate the first rotation body 62 and the second rotation body 63. The winding driving unit 60B is disposed on the opposite side to the holding mechanism 30 with respect to the winding unit 60A in the front-back direction X. The winding driving unit 60B includes an actuator 68 and a transmission mechanism 69.

Figure 19:
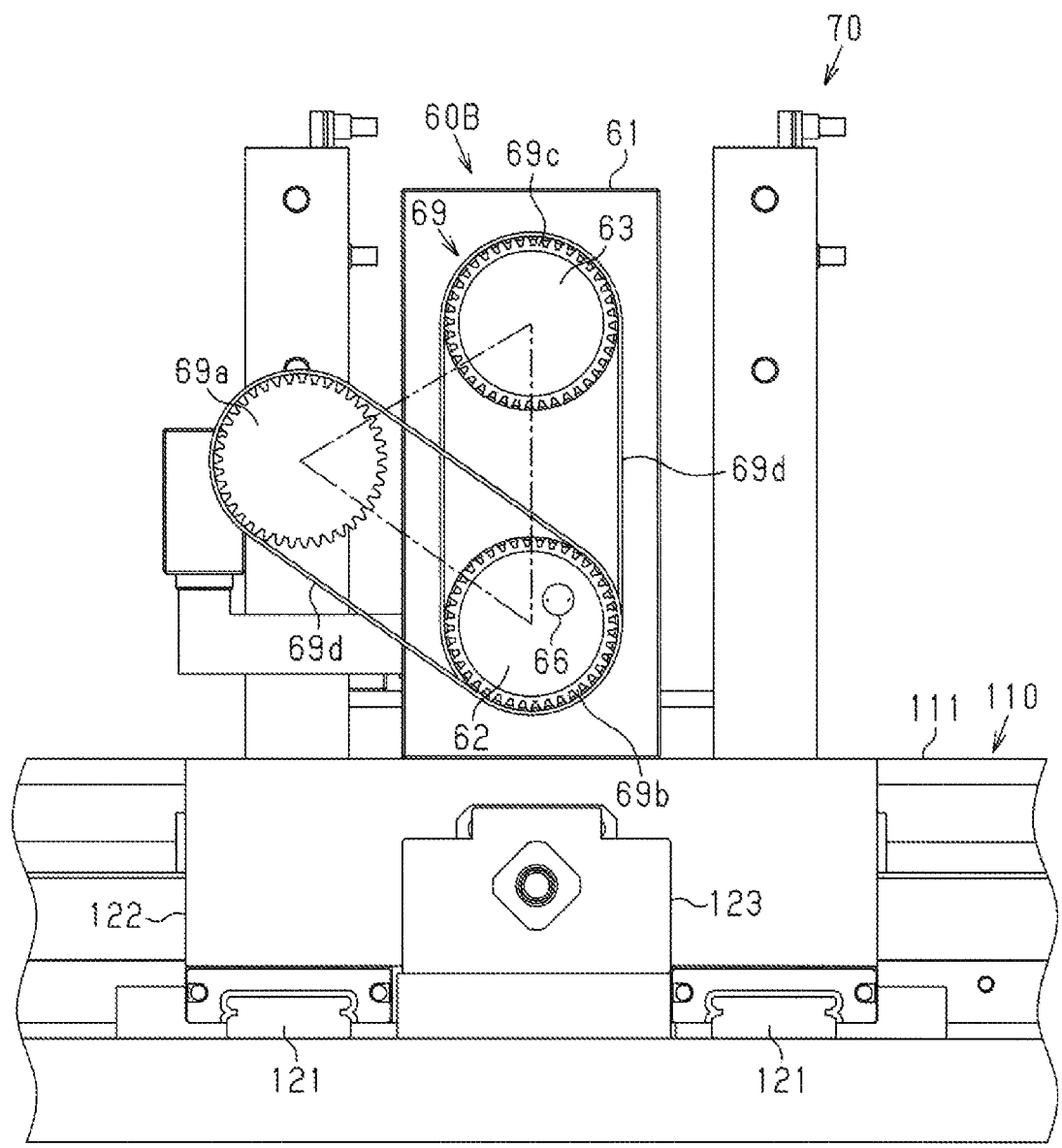
FIG. 19 is a rear view of FIG. 18.
Figure 20:
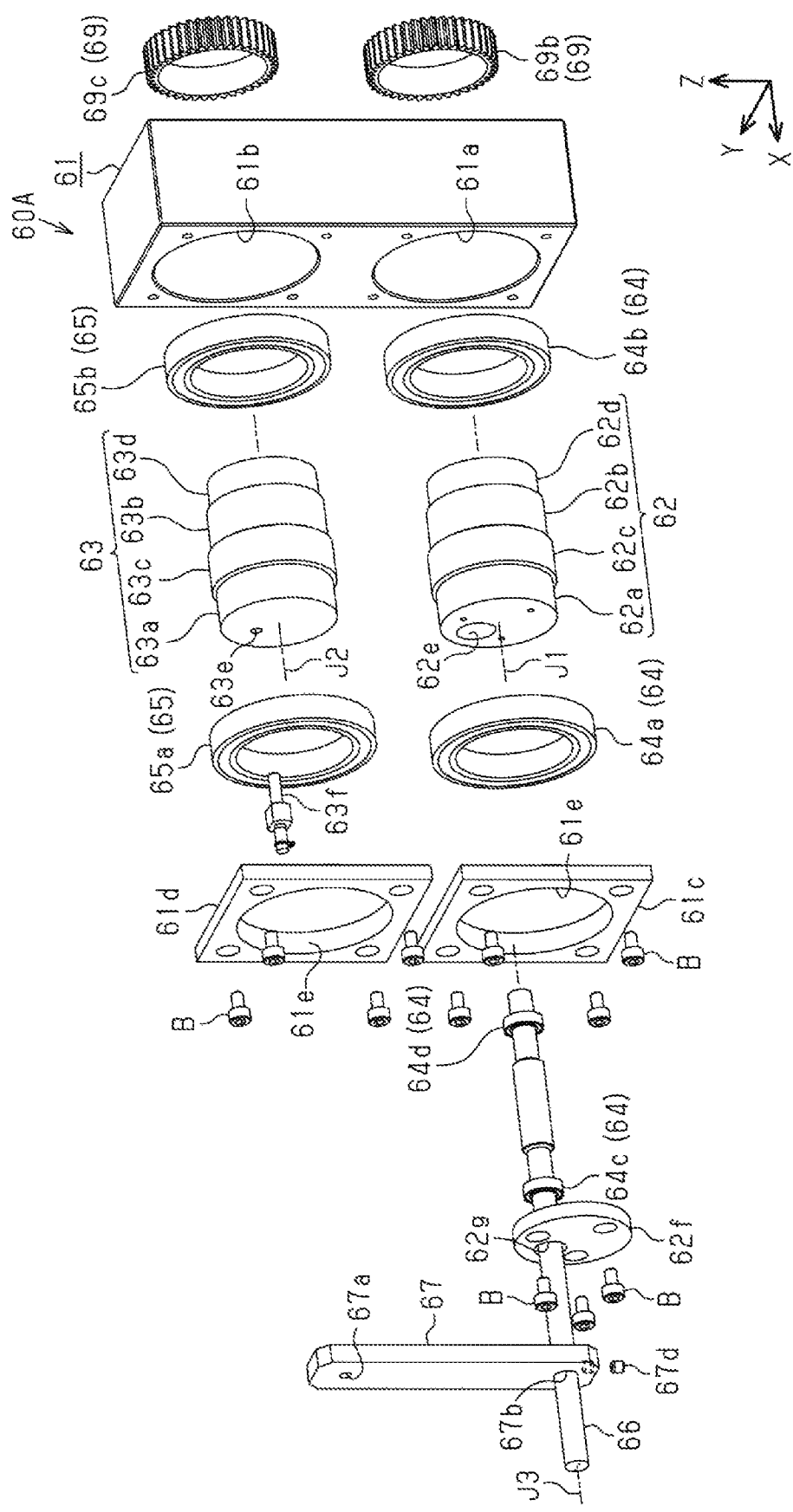
FIG. 20 is an exploded perspective view illustrating a winding unit of a wire winding mechanism.

The housing 61 is placed on the carrier 112 of the first moving mechanism 110. As illustrated in FIGS. 18 and 19, the housing 61 is formed into a rectangular parallelepiped shape in which the vertical direction Z becomes the longitudinal direction with respect to the front-back direction X and the horizontal direction Y. The first rotation body 62, the second rotation body 63, the first bearing unit 64, and the second bearing unit 65 are accommodated in the housing 61 as illustrated in FIG. 20.

The first rotation body 62 and the second rotation body 63 are arranged in the vertical direction Z. The first rotation body 62 is located below the second rotation body 63. The first rotation body 62 and the second rotation body 63 are rotatable about an axis along the front-back direction X with respect to the housing 61. The wire position support member 66 is inserted in the first rotation body 62. The wire position support member 66 projects forward from the first rotation body 62. The synchronous rotation component 67 is formed into a plate shape extending in the vertical direction Z. The synchronous rotation component 67 couples the first rotation body 62 (wire position support member 66) to the second rotation body 63 to synchronize the rotation of the first rotation body 62 with the rotation of the second rotation body 63.

As illustrated in FIG. 18, the actuator 68 includes a housing 68a, a motor 68b and a speed reducer 68c, which are accommodated in the housing 68a, and an output shaft 68d that takes out the output of the speed reducer 68c. The motor 68b is coupled to the speed reducer 68c. The driving force of the motor 68b is transmitted to the output shaft 68d through the speed reducer 68c.

As illustrated in FIG. 19, the transmission mechanism 69 transmits the output of the actuator 68 (the output of the speed reducer 68c) to the first rotation body 62 and the second rotation body 63. The transmission mechanism 69 includes a first gear 69a, a second gear 69b, a third gear 69c, and two endless toothed timing belts 69d. The first gear 69a is coupled to the output shaft 68d of the actuator 68. The second gear 69b is coupled to the first rotation body 62. The third gear 69c is coupled to the second rotation body 63. The first to third gears 69a to 69c are disposed so as to draw a triangle (in the first embodiment, an equilateral triangle) when rotation centers of the first to third gears 69a to 69c are connected. More particularly, the second gear 69b and the third gear 69c are arranged in the vertical direction Z and at the same position in the horizontal direction Y. The first gear 69a is disposed at a different position in the horizontal direction Y with respect to the second gear 69b and the third gear 69c and a position between the second gear 69b and the third gear 69c in the vertical direction Z. The numbers of teeth of the first to third gears 69a to 69c are equal to one another, and outer diameters of the first to third gears 69a to 69c are equal to one another. One of the timing belts 69d is hooked on the first gear 69a and the second gear 69b, and the other timing belt 69d is hooked on the second gear 69b and the third gear 69c. The rotation force of the first gear 69a that is rotated by driving the actuator 68 is transmitted to the second gear 69b and the third gear 69c by the two timing belts 69d. The transmission mechanism 69 may be configured such that one endless timing belt 69d is entrained about the first to third gears 69a to 69c.

A detailed configuration of the winding unit 60A will be described below. Hereinafter, a direction from the wire winding mechanism 60 toward the holding mechanism 30 in the front-back direction X is defined as forward, and a direction from the holding mechanism 30 toward the wire winding mechanism 60 is defined as backward.

Figure 21:
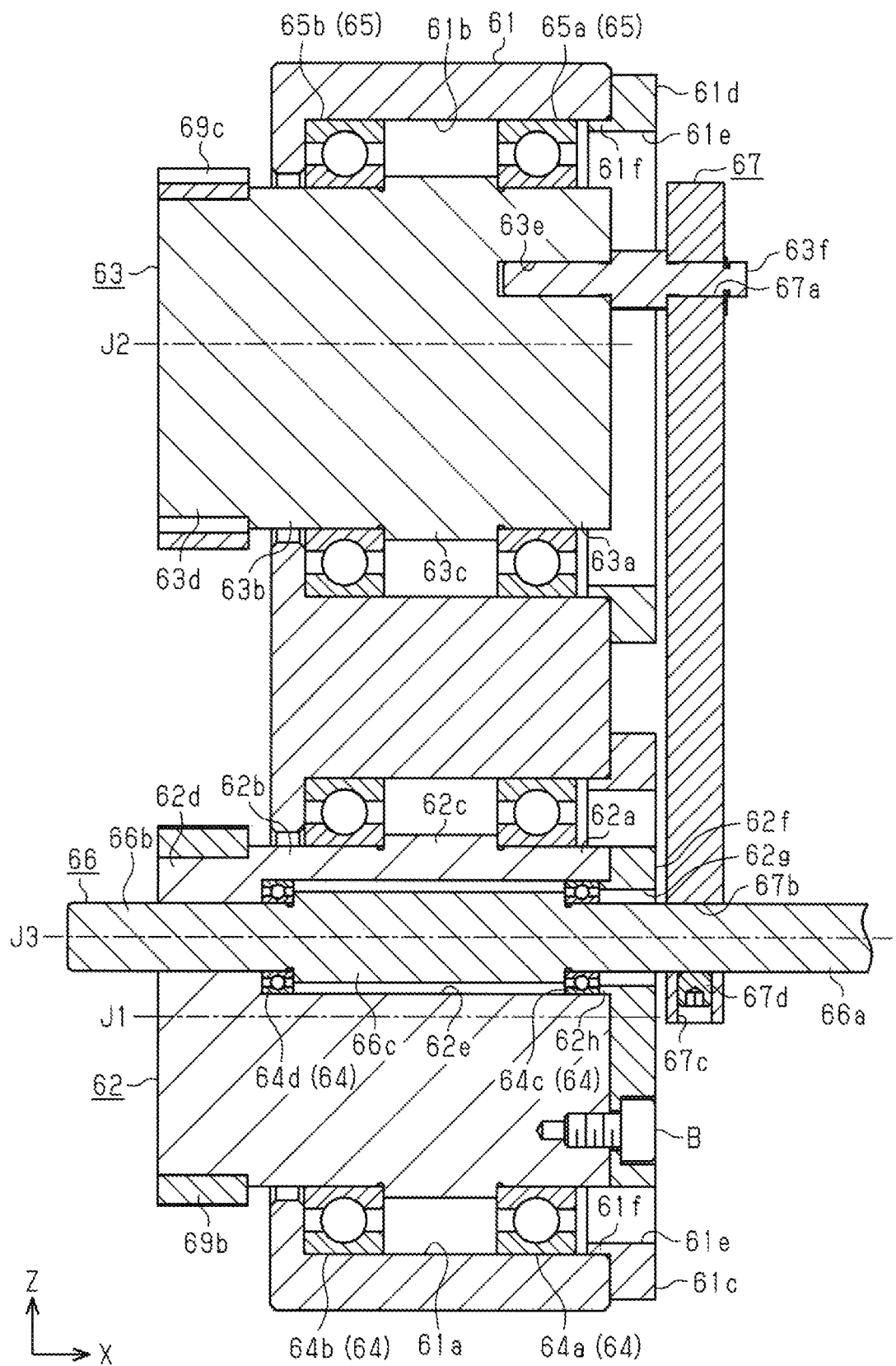
FIG. 21 is a sectional view of the winding unit.

A first accommodation hole 61a and a second accommodation hole 61b, which are two through-holes, are made in the housing 61 as illustrated in FIGS. 20 and 21. The first rotation body 62 and the first bearing unit 64 are accommodated in the first accommodation hole 61a. The second rotation body 63 and the second bearing unit 65 are accommodated in the second accommodation hole 61b. A first regulation plate 61c that regulates forward movement of the front-side first bearing unit 64 (first bearing 64a) and a second regulation plate 61d that regulates forward movement of the front-side second bearing unit 65 (first bearing 65a) are fixed to a front surface of the housing 61 using a plurality of bolts B (in FIG. 19, each four bolts B). The first regulation plate 61c and the second regulation plate 61d have the same shape. The first regulation plate 61c and the second regulation plate 61d are formed into a square frame shape including a circular through-hole 61e. A cylindrical fitting unit 61f projecting backward is provided at a circumferential edge of the through-hole 61e. The fitting units 61f of the first regulation plate 61c and the second regulation plate 61d are fitted in the first accommodation hole 61a and the second accommodation hole 61b, respectively, thereby deciding the positions of the first regulation plate 61c and the second regulation plate 61d with respect to the housing 61.

The first bearing unit 64 includes two outer bearings 64a, 64b in which the first rotation body 62 is journaled with respect to the housing 61 and two inner bearings 64c, 64d in which the wire position support member 66 is journaled with respect to the first rotation body 62. The outer bearings 64a, 64b have the same shape. For example, a rolling bearing is used as the outer bearings 64a, 64b. The inner bearings 64c, 64d have the same shape. For example, a rolling bearing is used as the inner bearings 64c, 64d. The rolling bearing includes an inner ring, an outer ring covering the inner ring from the outside, and a plurality of rolling elements disposed in a space between the inner ring and the outer ring. An example of the plurality of rolling elements is a ball or a roller. In the first embodiment, the inner bearings 64c, 64d correspond to the first inner bearing.

The second bearing unit 65 includes two outer bearings 65a, 65b in which the second rotation body 63 is journaled with respect to the housing 61. The outer bearings 65a, 65b have the same shape. For example, a rolling bearing is used as the outer bearings 65a, 65b. In the first embodiment, the same outer bearings as the outer bearings 64a, 64b are used as the outer bearings 65a, 65b.

The first rotation body 62 is formed into a shape in which a plurality of columnar units having different outer diameters are laminated in the front-back direction X. The first rotation body 62 includes a front support unit 62a, a rear support unit 62b, a bulge unit 62c, and a gear attaching unit 62d. The front support unit 62a is provided at the front end of the first rotation body 62. The outer diameter of the front support unit 62a is equal to the outer diameter of the rear support unit 62b, is smaller than the outer diameter of the bulge unit 62c, and is larger than the outer diameter of the gear attaching unit 62d. The front support unit 62a is fitted in the inner ring of the outer bearing 64a. The rear support unit 62b is provided behind the front support unit 62a. The rear support unit 62b is fitted in the inner ring of the outer bearing 64b. The bulge unit 62c is provided between the front support unit 62a and the rear support unit 62b.

The inner ring of the outer bearing 64a contacts with a front end surface of the bulge unit 62c, and the inner ring of the outer bearing 64b contacts with a rear end surface of the bulge unit 62c, thereby positioning the outer bearings 64a, 64b with respect to the first rotation body 62. The gear attaching unit 62d is provided at the rear end of the first rotation body 62. The second gear 69b is attached to the gear attaching unit 62d. The outer rings of the outer bearings 64a, 64b are attached to an inner circumferential surface constituting the first accommodation hole 61a of the housing 61.

The first rotation body 62 is formed outside a center axis J1 of the first rotation body 62, and an insertion hole 62e piercing the first rotation body 62 in the front-back direction X is made. The wire position support member 66 is inserted in the insertion hole 62e, and the inner bearings 64c, 64d are accommodated in the insertion hole 62e. The wire position support member 66 is formed into a columnar shape. The wire position support member 66 includes a front support unit 66a, a rear support unit 66b, and a bulge unit 66c. The bulge unit 66c is provided between the front support unit 66a and the rear support unit 66b. A length in the front-back direction X of the front support unit 66a is longer than a length in the front-back direction X of each of the rear support unit 66b and bulge unit 66c. The outer diameter of the front support unit 66a is equal to the outer diameter of the rear support unit 66b. The outer diameter of the bulge unit 66c is larger than the outer diameter of the front support unit 66a. The front support unit 66a is fitted in the inner ring of the inner bearing 64c. The rear support unit 66b is fitted in the inner ring of the inner bearing 64d. The inner ring of the inner bearing 64c contacts with the front end surface of the bulge unit 66c, and the inner ring of the inner bearing 64d contacts with the rear end surface of the bulge unit 66c, thereby positioning the inner bearings 64c, 64d in the front-back direction X with respect to the wire position support member 66. The outer rings of the inner bearings 64c, 64d are attached to the inner circumferential surface constituting the insertion hole 62e of the first rotation body 62.

A regulation plate 62f is attached to the front end surface of the front support unit 66a in the first rotation body 62 using the bolt B. The regulation plate 62f includes an insertion hole 62g in which the wire position support member 66 is inserted. A fitting unit 62h fitted in the insertion hole 62e of the first rotation body 62 is provided at the circumferential edge of the insertion hole 62g in the regulation plate 62f. The fitting unit 62h is formed into a cylindrical shape. The fitting unit 62h is fitted in the insertion hole 62e, thereby positioning the regulation plate 62f with respect to the front support unit 66a.

The second rotation body 63 is formed into a shape in which a plurality of columnar units having different outer diameters are laminated in the front-back direction X. The second rotation body 63 includes a front support unit 63a, a rear support unit 63b, a bulge unit 63c, and a gear attaching unit 63d. An outer-diameter shape of the second rotation body 63 is equal to an outer-diameter shape of the first rotation body 62. Particularly, the outer diameter of the front support unit 62a is equal to the outer diameter of the front support unit 63a, the outer diameter of the rear support unit 62b is equal to the outer diameter of the rear support unit 63b, the outer diameter of the bulge unit 62c is equal to the outer diameter of the bulge unit 63c, and the outer diameter of the gear attaching unit 62d is equal to the outer diameter of the gear attaching unit 63d. The front support unit 63a is fitted in the inner ring of the outer bearing 65a, and the rear support unit 63b is fitted in the inner ring of the outer bearing 65b. The outer rings of the outer bearings 65a, 65b are attached to the inner circumferential surface of the second accommodation hole 61b.

In the front support unit 63a of the second rotation body 63, a fitting hole 63e is made outside a center axis J2 of the second rotation body 63. A bar-shaped shaft body 63f is fitted in the fitting hole 63e.

A first insertion hole 67a is formed at one end in the longitudinal direction of the synchronous rotation component 67. The shaft body 63f is inserted in the first insertion hole 67a. That is, the synchronous rotation component 67 is rotatably attached to the shaft body 63f. The synchronous rotation component 67 is pinched between the shaft body 63f and a snap ring such as a C-ring in the front-back direction X, thereby regulating the movement in the front-back direction X of the synchronous rotation component 67 with respect to the shaft body 63f.

A second insertion hole 67b is made at the other end in the longitudinal direction of the synchronous rotation component 67. The wire position support member 66 is inserted in the second insertion hole 67b. A fitting hole 67c communicating with the second insertion hole 67b is made in the other end in the longitudinal direction of the synchronous rotation component 67. The fitting hole 67c includes a female screw. A screw member 67d is fitted in the fitting hole 67c. The screw member 67d presses the wire position support member 66 inserted in the second insertion hole 67b.

Consequently, the rotation (the rotation of the wire position support member 66 about a center axis J3) of the wire position support member 66 with respect to the synchronous rotation component 67 is prevented.

Figure 22:
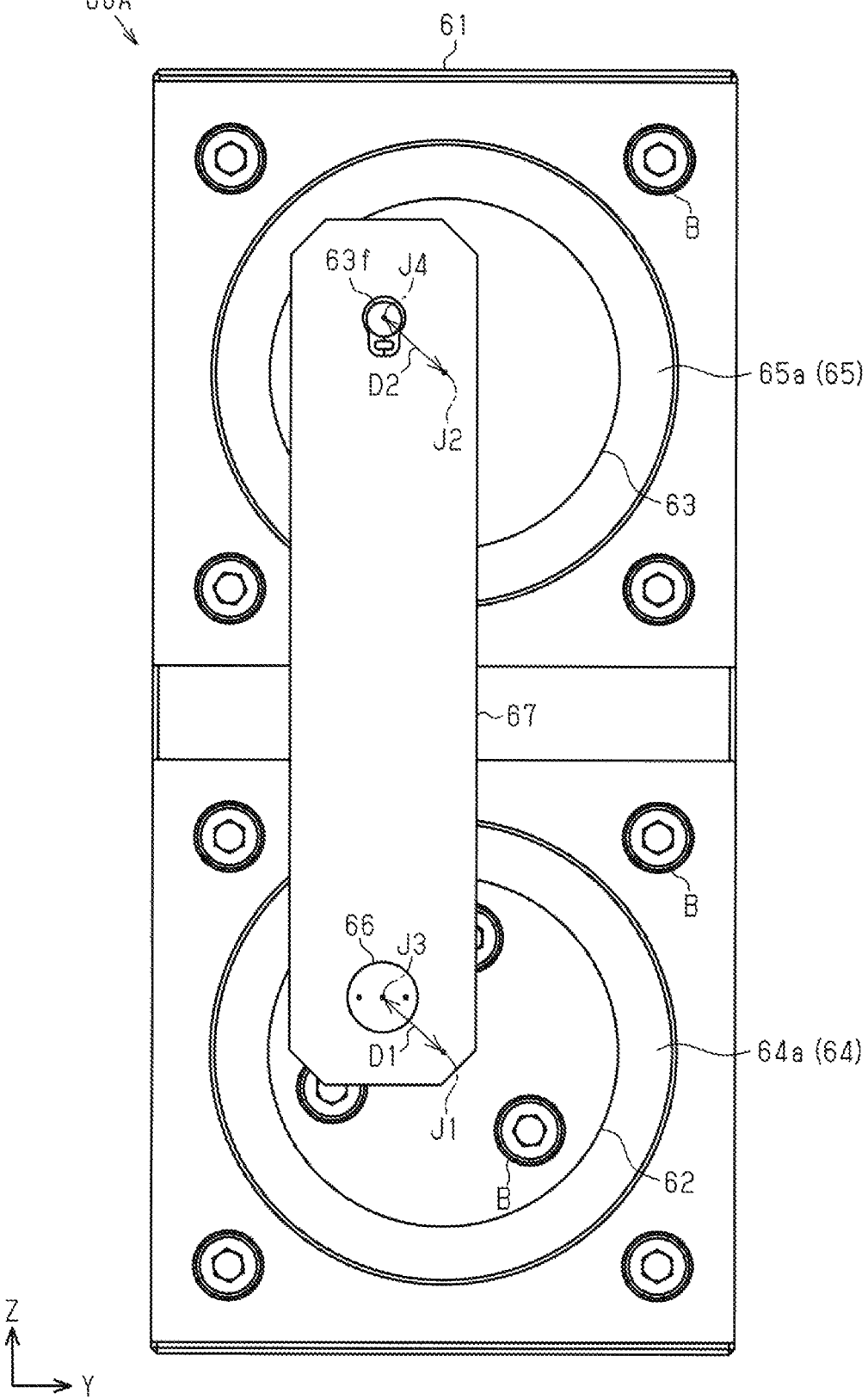
FIG. 22 is a front view of the winding unit.

As illustrated in FIG. 22, a distance D1 between the center axis J1 of the first rotation body 62 and the center axis J3 of the wire position support member 66 is equal to a distance D2 between the center axis J2 of the second rotation body 63 and a center axis J4 of the shaft body 63f. As illustrated in FIG. 21, the position of the wire position support member 66 with respect to the center axis J1 of the first rotation body 62 in the rotation direction of the first rotation body 62 is identical to the position of the shaft body 63f with respect to the center axis J3 of the second rotation body 63 in the rotation direction of the second rotation body 63. Consequently, the synchronous rotation component 67 is attached to the wire position support member 66 and the shaft body 63f such that the longitudinal direction of the synchronous rotation component 67 is matched with the vertical direction Z.

A detailed shape of the leading end of the wire position support member 66 will be described.

Figure 23A:
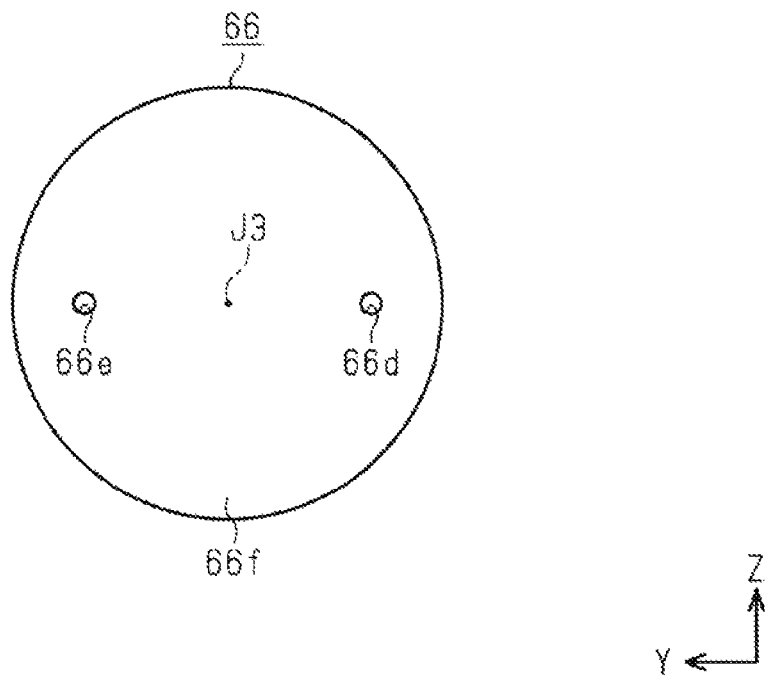
FIG. 23A is a front view illustrating a wire position support member of the winding unit.

As illustrated in FIG. 23A, the wire position support member 66 has the circular outer shape when viewed in the front-back direction X. A first wire route hole 66d constituting a feeding route of the first wire W1 and a second wire route hole 66e constituting a feeding route of the second wire W2 are formed in the wire position support member 66. The wire route holes 66d, 66e pierce the wire position support member 66 in the front-back direction X. The wire route holes 66d, 66e are made outside the center axis J3 of the wire position support member 66, and made in point symmetry with respect to the center axis J3 when the wire position support member 66 is viewed from the front.

Figure 23B:
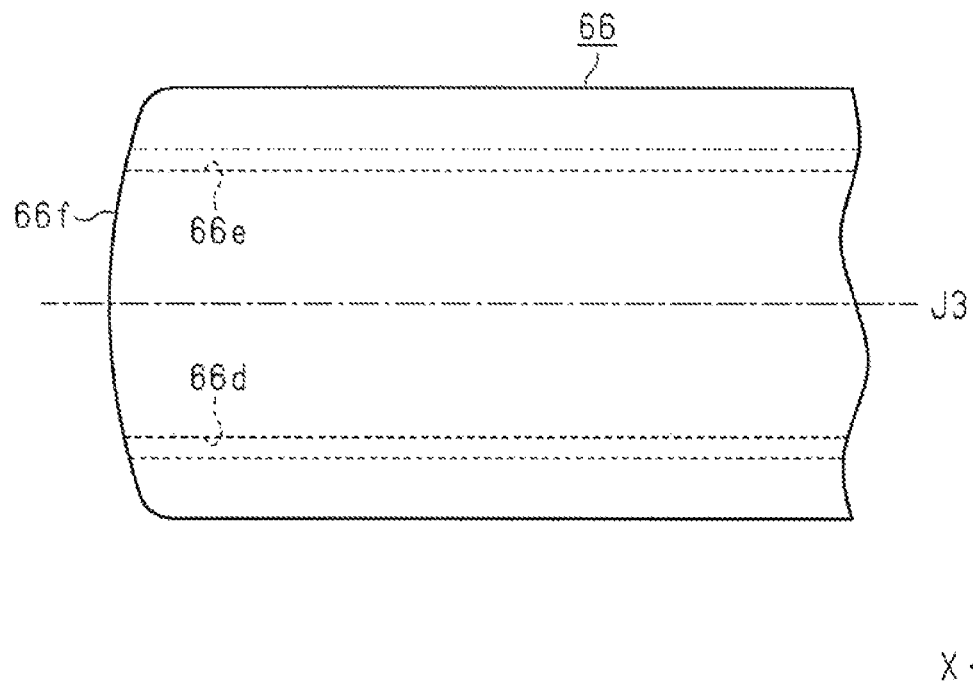
FIG. 23B is a plan view illustrating a leading end of a wire support member.
Figure 24A:
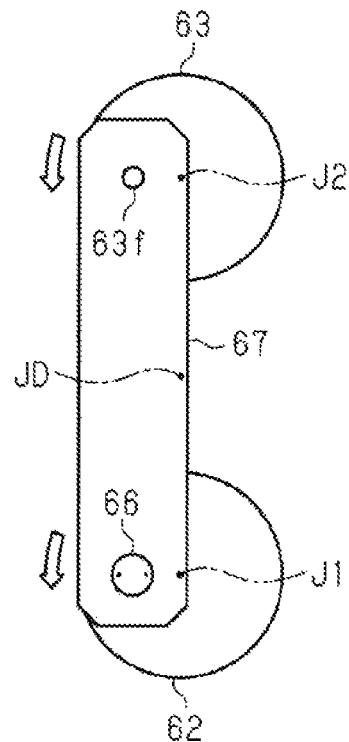
FIGS. 24A to 24D are schematic views illustrating operation of the winding unit.
Figure 24B:
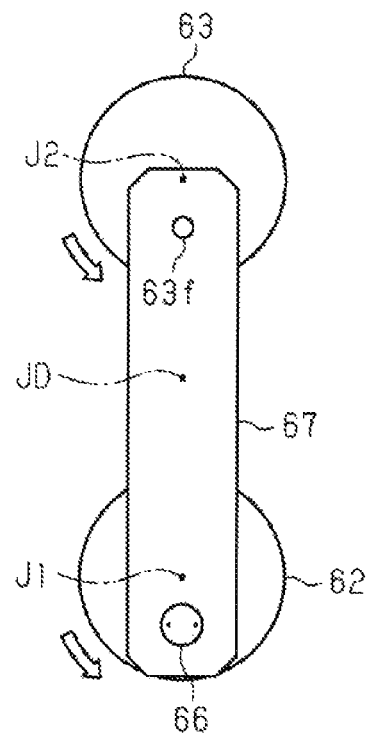
Figure 24C:
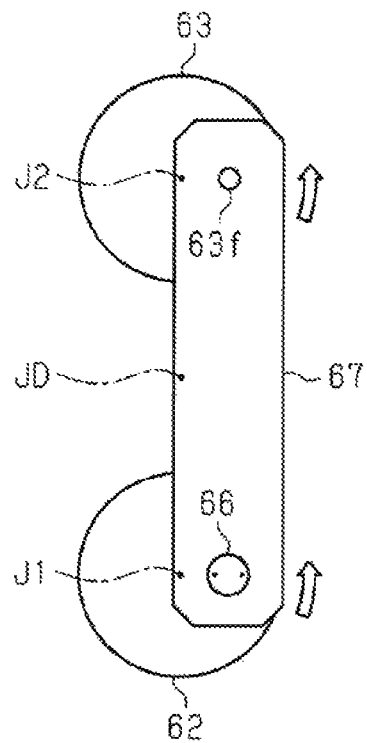
Figure 24D:
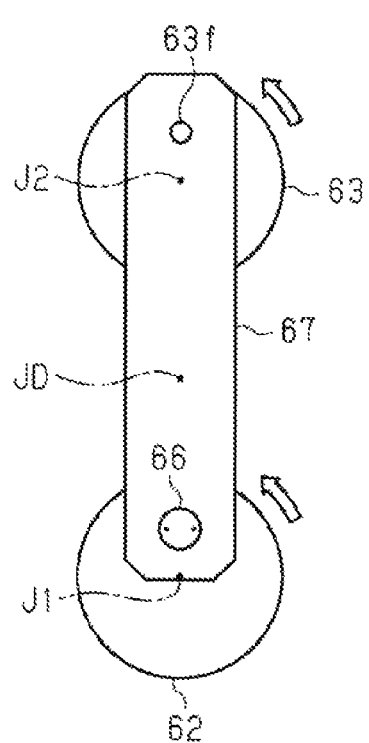

As illustrated in FIG. 23B, a front end surface 66f of the wire position support member 66 is formed into a spherical shape projecting forward. That is, in the front end surface 66f, a portion between the first wire route hole 66d and the second wire route hole 66e projects forward from the circumferential edges of the first wire route hole 66d and the second wire route hole 66e. The wire position support member 66 includes a curved surface connecting the outer circumferential edge of the front end surface 66f and the outer circumferential surface of the wire position support member 66. The curved surface is formed by R-chamfering of the outer circumferential edge of the front end surface 66f. Preferably the curved surface is formed over a whole circumference about the center axis J3 of the front end surface 66f.

Operations of the first rotation body 62 and the second rotation body 63 will be described.

As illustrated successively in FIGS. 24A to 24D, by driving the winding driving unit 60B, the first rotation body 62 rotates in the counterclockwise direction about the center axis J1, and the second rotation body 63 rotates in the counterclockwise direction about the center axis J2. At this point, the first rotation body 62 and the second rotation body 63 rotate synchronously. Because the wire position support member 66 attached to the first rotation body 62 is located outside the center axis J1 of the first rotation body 62, the wire position support member 66 revolves orbitally in the counterclockwise direction about the center axis J1. Because the shaft body 63f attached to the second rotation body 63 of the first rotation body 62 is located outside the center axis J2 of the second rotation body 63, the shaft body 63*f* revolves orbitally in the counterclockwise direction about the center axis J2. Because the first rotation body 62 and the second rotation body 63 rotate synchronously, an orbital revolution speed of the wire position support member 66 is equal to an orbital revolution speed of the shaft body 63*f*. The synchronous rotation component 67 couples the wire position support member 66 to the shaft body 63*f*, so that deviation between a rotation angle of the wire position support member 66 with respect to the center axis J1 and a rotation angle of the shaft body 63*f* with respect to the center axis J2 can be prevented. The first rotation body 62 and the second rotation body 63 may rotate clockwise. In this case, the wire position support member 66 revolves orbitally in the clockwise direction about the center axis J1.

As illustrated in FIGS. 24A to 24D, the synchronous rotation component 67 revolves orbitally in the clockwise direction about a center axis JD that is the center of a distance between the center axis J1 and the center axis J2 in association with the rotation of each of the rotation bodies 62, 63. At this point, the synchronous rotation component 67 revolves orbitally while maintaining an attitude along the vertical direction Z. The rotation of the wire position support member 66 with respect to the synchronous rotation component 67 is prevented. Consequently, in the case that the wire position support member 66 revolves orbitally about the center axis J1, a change in rotation position about the center axis J3 of the first wire route hole 66*d* and the second wire route hole 66*e* is prevented.

Figure 25:
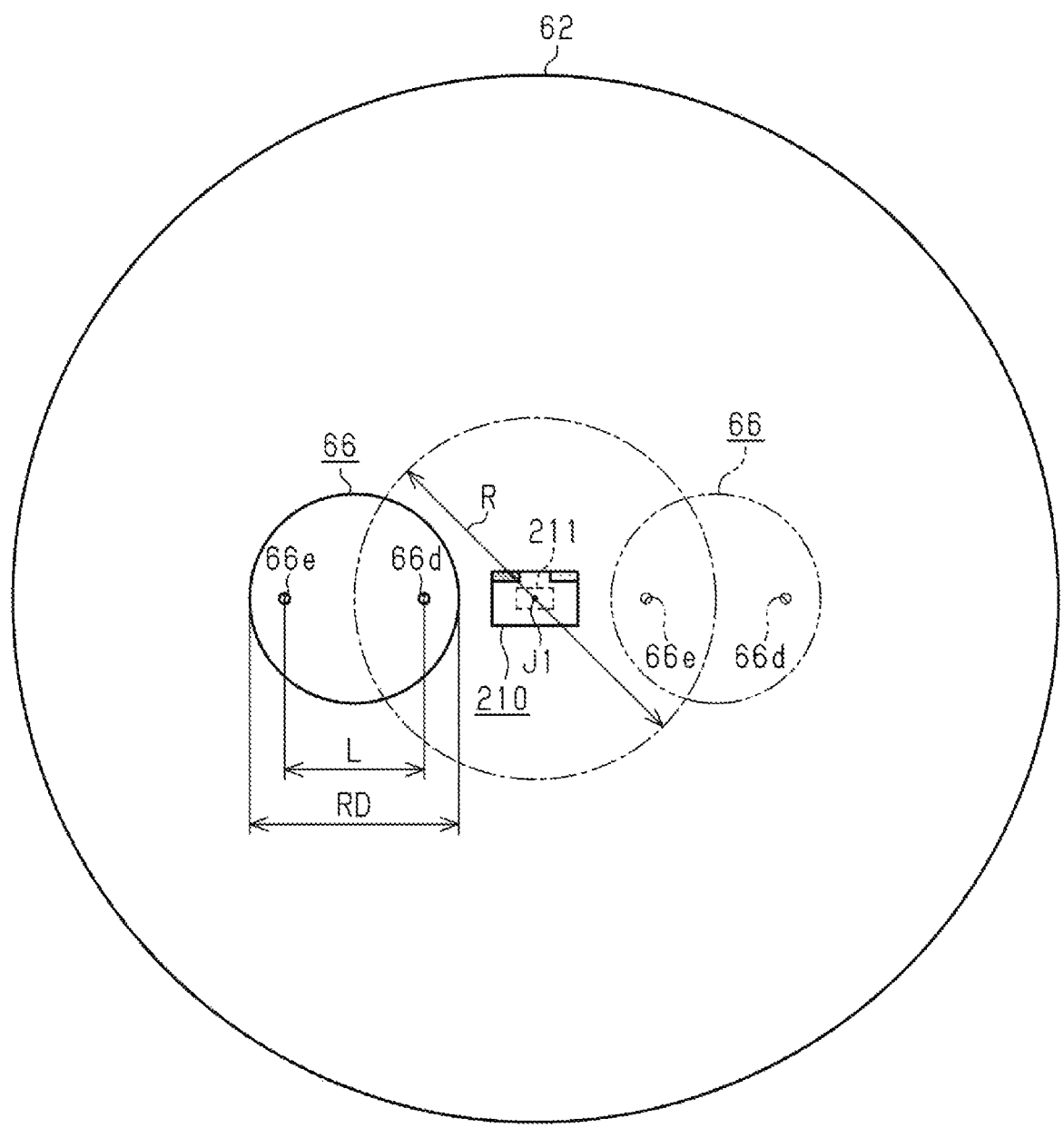
FIG. 25 is a front view of a part of the winding unit illustrating a positional relationship among a first rotation body, the wire position support member of the winding unit and a core.

As illustrated in FIG. 25, in the winding process, the wire position support member 66 revolves orbitally around the core 210 while the core 210 is disposed such that the center axis of the winding core 211 of the core 210 becomes coaxial with the center axis J1 of the first rotation body 62. Consequently, the first and second wires W1, W2 (not illustrated in FIG. 25) are wound around the winding core 211 of the core 210. For example, an outer diameter RD of the wire position support member 66 ranges from 3 mm to 52 mm. The wire position support member 66 of the first embodiment has the outer diameter RD of 8 mm. For example, a distance L between the first wire route hole 66*d* and the second wire route hole 66*e* of the wire position support member 66 ranges from 1 mm to 50 mm. The distance L between the first wire route hole 66*d* and the second wire route hole 66*e* is 3 mm in the first embodiment. For example, an orbital revolution diameter R of the wire position support member 66 ranges from 12 mm to 60 mm. Preferably the orbital revolution diameter R of the wire position support member 66 ranges from 12 mm to 40 mm. The wire position support member 66 of the first embodiment has the orbital revolution diameter R of 28 mm. The distance L between the first wire route hole 66*d* and the second wire route hole 66*e* is defined by the shortest distance that connects the center of the first wire route hole 66*d* and the center of the second wire route hole 66*e* when the wire position support member 66 is viewed from the front.

As illustrated in FIG. 26A, the wire feeding mechanism 50 includes a wire winding support unit 51, a wire tension controller 52, and a wire route support unit 53.

An example of the wire winding support unit 51 includes a bobbin. The wire winding support unit 51 includes a first support 51*a* in which the first wire W1 is wound around the bobbin and a second support 51*b* in which the second wire W2 is wound around the bobbin. The wires W1, W2 of the first support 51*a* and the second support 51*b* are fed to the wire tension controller 52.

The wire tension controller 52 controls tension of each of the wires W1, W2 such that the tension of each of the wires W1, W2 from the wire winding support unit 51 becomes previously-set tension by a hysteresis brake (not illustrated). The wire tension controller 52 includes a tension arm 52*a* and a pulley 52*b*. The pulley 52*b* is attached to a leading end of the tension arm 52*a*. The first and second wires W1, W2 are entrained about the pulley 52*b*.

The wire route support unit 53 supports the wires W1, W2 fed from the wire tension controller 52, and includes a first pulley 53*a* and a second pulley 53*b*. The first pulley 53*a* and the second pulley 53*b* downwardly feed the wires W1, W2 fed from the wire tension controller 52. The wires W1, W2 is fed forward by the second pulley 53*b*, and inserted in the wire position support member 66.

As illustrated in FIG. 26B, the second pulley 53*b* includes a first groove 53*x* and a second groove 53*y*, which are formed while arranged in the horizontal direction Y. The first wire W1 is entrained about the first groove 53*x*, and the second wire W2 is entrained about the second groove 53*y*.

As illustrated in FIG. 26A, the second pulley 53*b* is disposed at a position where lengths of the first and second wires W1, W2 from the second pulley 53*b* to the wire position support member 66 can be prevented from being changed by the orbital revolution of the wire position support member 66. More particularly, as illustrated in FIG. 26B, a center C in the horizontal direction Y between the lower end of the first wire W1 entrained about the first groove 53*x* and the lower end of the second wire W2 entrained about the second groove 53*y* is identical to the center axis J1 of the first rotation body 62.

As illustrated in FIGS. 17, 27, and 28, the wire holding retreating mechanism 70 includes a movable unit 70A and a driving unit 70B. The movable unit 70A includes a pair of coupling arms 71 coupled to the side surface in the horizontal direction Y of the carrier 112 of the first moving mechanism 110, a moving body 72 movable in the vertical direction Z with respect to the coupling arm 71, and an elastic body 73 that can bias the coupling arm 71 and the moving body 72 in the vertical direction Z. The coupling arm 71 extends toward the outside from the carrier 112 in the front-back direction X. The moving body 72 is located outside the carrier 112. The moving body 72 includes a placing table 72*a* located below the coupling arm 71. The placing table 72*a* is formed into a rectangular shape in planar view. That is, the placing table 72*a* includes a pair of arm units facing the pair of coupling arms 71 in the vertical direction Z and a connection arm unit connecting the rear ends of the pair of arm units. Two posts 72*b* are provided in each of the pair of arm units. The post 72*b* extends upward from the pair of arms, and is inserted in the insertion hole of the pair of coupling arms 71. In the two posts 72*b*, a pressed unit 72*c* coupling the two posts 72*b* is provided at the upper ends projecting upward from the pair of coupling arms 71. The elastic body 73 is attached to each post 72*b*. An example of the elastic body 73 is a coil spring. A columnar stopper 71*a* is provided in the coupling arm 71. The stopper 71*a* contacts with the pressed unit 72*c* to regulate the downward movement of the moving body 72.

Figure 28A:
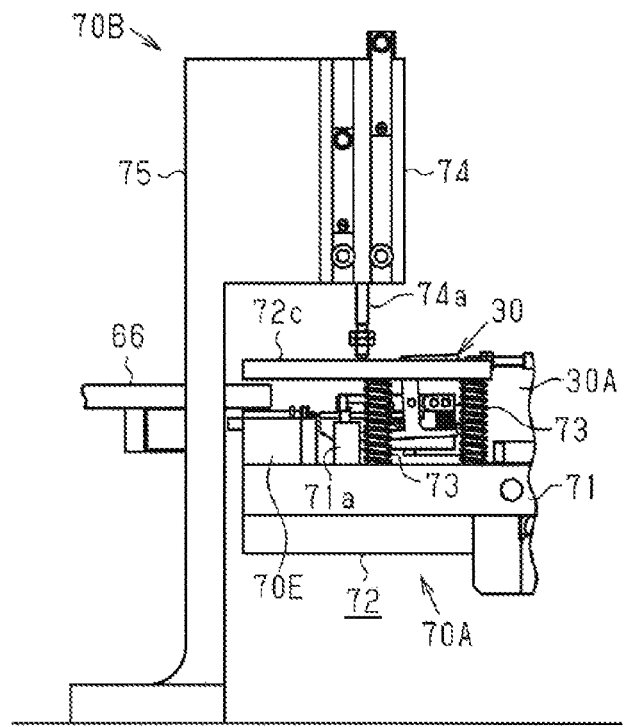
FIGS. 28A and 28B are side views illustrating operation of the wire holding retreating mechanism.

As illustrated in FIG. 17, the two driving units 70B are provided while separated from each other in the horizontal direction Y. As illustrated in FIG. 28A, the driving unit 70B includes a pushing unit 74 that downwardly pushes the moving body 72 and a support member 75 supporting the pushing unit 74. An example of the pushing unit 74 is an electric cylinder. The support member 75 is disposed between the wire winding mechanism 60 (see FIG. 17) and the coupling arm 71 in the front-back direction X. The pushing unit 74 is disposed above the movable unit 70A. Particularly, the pushing unit 74 is disposed so as to face the pressed unit 72c of the movable unit 70A in the vertical direction Z.

The wire holding retreating mechanism 70 also includes an end-line-side wire holding unit 70C, an end-line-side wire opening and closing unit 70D, and a wire route support unit 70E. The end-line-side wire holding unit 70C and the wire route support unit 70E are attached on the placing table 72a of the movable unit 70A while arranged in the horizontal direction Y. On the other hand, the end-line-side wire opening and closing unit 70D is not attached to the placing table 72a, but disposed at the position facing the end-line-side wire holding unit 70C in the front-back direction X. The wire route support unit 70E hooks the wires W1, W2 such that the wires W1, W2 wound around the core 210 have predetermined tension. The end-line-side wire holding unit 70C switches between the state in which the wires W1, W2 passing through the wire route support unit 70E are held and the state in which the holding of each of the wires W1, W2 is released. The end-line-side wire opening and closing unit 70D switches between the state in which the wires W1, W2 are held by the end-line-side wire holding unit 70C and the state in which the holding of each of the wires W1, W2 is released.

Figure 28B:
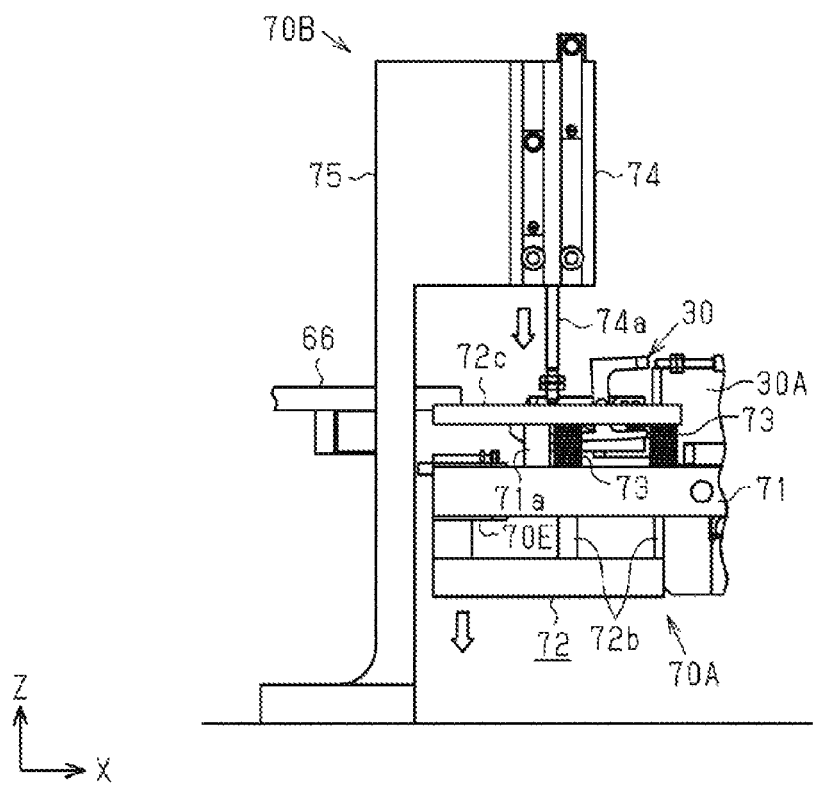

In the wire holding retreating mechanism 70, an arm 74a of the pushing unit 74 of the driving unit 70B downwardly pushes the pressed unit 72c of the movable unit 70A, whereby the moving body 72 moves downward. At this point, the pressed unit 72c comes close to the coupling arm 71 to compress the elastic body 73. As illustrated in FIG. 28B, the downward movement of the moving body 72 is stopped when the pressed unit 72c contacts with the stopper 71a. On the other hand, the moving body 72 moves upward by restoring force of the elastic body 73 as the arm 74a of the pushing unit 74 moves upward from the state in FIG. 28B.

The control mechanism 130 (see FIG. 7) performs wire tension constant control, retreating control, and winding control in the winding process. The winding control is performed after the retreating control. In the wire tension constant control, the control mechanism 130 controls the hysteresis brake of the wire feeding mechanism 50 such that the tension of each of the first and second wires W1, W2 fed to the wire position support member 66 becomes the previously-set tension. In the retreating control, the control mechanism 130 downwardly retreats the end-line-side wire holding unit 70C, the end-line-side wire opening and closing unit 70D, and the wire route support unit 70E such that the end-line-side wire holding unit 70C, the end-line-side wire opening and closing unit 70D, and the wire route support unit 70E do not interfere with the wire position support member 66. The winding control includes core rotation speed control and orbital revolution speed control. In the winding control, the control mechanism 130 rotates the core 210 using the rotation unit 30A of the holding mechanism 30 by the core rotation speed control, and orbitally revolves the wire position support member 66 around the core 210 using the winding driving unit 60B of the wire winding mechanism 60 by the orbital revolution speed control. Consequently, the first and second wires W1, W2 are wound around the core 210 while twisted.

The control mechanism 130 can arbitrarily change the rotation speed and the rotation direction of the core 210 in the core rotation speed control and the orbital revolution speed and the orbital revolution direction of the wire position support member 66 in the orbital revolution speed control. The control mechanism 130 performs two pieces of control (first control and second control) in which the rotation speed and the rotation direction of the core 210 differ from the orbital revolution speed and the orbital revolution direction of the wire position support member 66.

Figure 29:
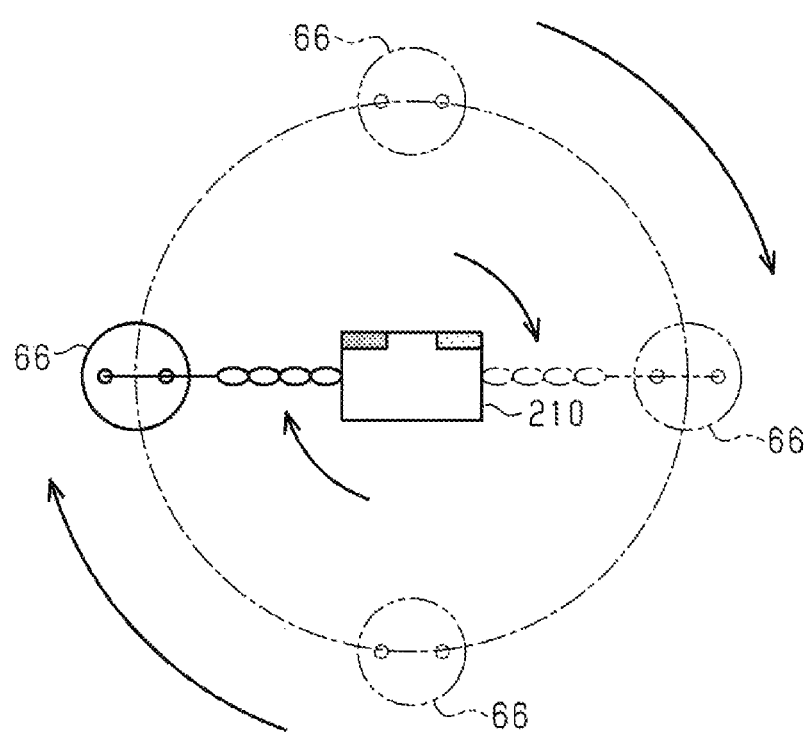
FIG. 29 is a schematic diagram illustrating a relationship between rotation of the core and orbital revolution of the wire position support member by first control of the winding apparatus.

As illustrated in FIG. 29, in the first control, the control mechanism 130 rotates the core 210 in the clockwise direction, and orbitally revolves the wire position support member 66 in the clockwise direction. That is, the rotation direction of the core 210 is matched with the orbital revolution direction of the wire position support member 66. The control mechanism 130 controls the rotation of the core 210 and the orbital revolution of the wire position support member 66 such that the orbital revolution speed of the wire position support member 66 becomes faster than the rotation speed of the core 210.

Figure 30:
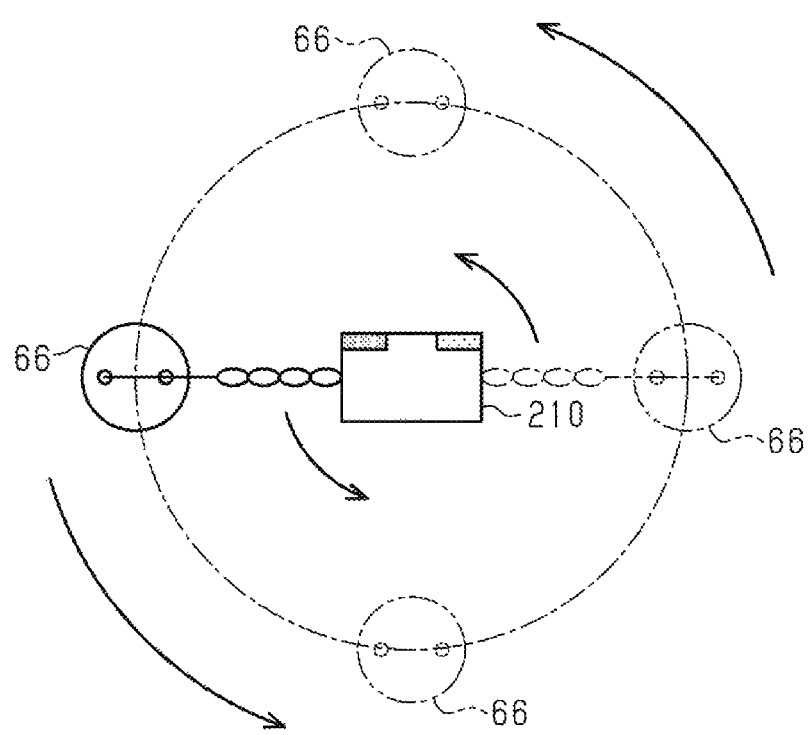
FIG. 30 is a schematic diagram illustrating the relationship between the rotation of the core and the orbital revolution of the wire position support member by second control of the winding apparatus.

As illustrated in FIG. 30, in the second control, the control mechanism 130 rotates the core 210 in the counterclockwise direction, and orbitally revolves the wire position support member 66 in the counterclockwise direction. That is, even in the second control, the rotation direction of the core 210 is matched with the orbital revolution direction of the wire position support member 66. The control mechanism 130 controls the rotation of the core 210 and the orbital revolution of the wire position support member 66 such that the rotation speed of the core 210 becomes faster than the orbital revolution speed of the wire position support member 66. In the second control, because the rotation speed of the core 210 is faster than the orbital revolution speed of the wire position support member 66 although the orbital revolution direction of the wire position support member 66 is opposite to the orbital revolution direction of the wire position support member 66 of the first control, winding directions of the wires W1, W2 around the core 210 in the second control are matched with winding directions of the wires W1, W2 around the core 210 in the first control.

When the control mechanism 130 performs only the first control, or when the control mechanism 130 performs only the second control, each of the wires W1, W2 is kinked in association with the orbital revolution of the wire position support member 66. As a result, a kink is likely to be generated in each of the wires W1, W2.

In consideration of the current situation, the control mechanism 130 of the first embodiment performs switching control to switch between the first control and the second control based on a predetermined condition. An example of the predetermined condition is the number of products of the coil component 200. In the first embodiment, the number of products of the coil component 200 is one. That is, the control mechanism 130 switches between the first control and the second control every time the coil 220 is formed in one core 210. For example, in the case that the coil 220 is formed in the core 210 by the first control, the coil 220 is formed in the next core 210 by the second control. That is, the control mechanism 130 repeats a cycle, in which the wires W1, W2 are wound around one core 210 by the first control and the wires W1, W2 are wound around the next core 210 by the second control.

The control mechanism 130 controls the rotation of the core 210 and the orbital revolution of the wire position support member 66 such that the number of rotations of the core 210 and the number of orbital revolutions of the wire position support member 66 in the first control are equal to the number of rotations of the core 210 and the number of orbital revolutions of the wire position support member 66 in the second control. Additionally, the control mechanism 130 controls the rotation speed of the core 210 and the orbital revolution speed of the wire position support member 66 such that an absolute value of a speed of the wire position support member 66 relative to the core 210 in the first control is equal to an absolute value of a speed of the wire position support member 66 relative to the core 210 in the second control. The absolute value of the speed of the wire position support member 66 relative to the core 210 is expressed by an absolute value of a speed difference (B-A) between a rotation speed A of the core 210 and an orbital revolution speed B of the wire position support member 66.

More particularly, information about combinations of the rotation speeds of the core 210 and the orbital revolution speeds of the wire position support member 66 in the first control and the second control is previously stored in the operation storage 132 (see FIG. 7) of the control mechanism 130 as illustrated in Table 1. The control mechanism 130 controls the combinations of the rotation speeds of the core 210 and the orbital revolution speeds of the wire position support member 66 in the first control and the second control using Table 1 stored in the operation storage 132. In Table 1, the rotation speed and the orbital revolution speed are expressed in terms of rpm (rotation per minute).

TABLE 1

|  | First control | | Second control | |
| --- | --- | --- | --- | --- |
|  | Orbital revolution speed of wire position support member | Rotation speed of core | Orbital revolution speed of wire position support member | Rotation speed of core |
| Combination 1 | 200 | 100 | 200 | 300 |
| Combination 2 | 300 | 200 | 300 | 400 |
| Combination 3 | 400 | 300 | 400 | 500 |
| Combination 4 | 500 | 400 | 500 | 600 |

As can be seen from Table 1, as expressed by a combination 1, the absolute value of the relative speed becomes "100" because of the wire position support member 66 having the orbital revolution speed of "200" with respect to the core 210 having the rotation speed of "100" in the first control, and the absolute value of the relative speed becomes "100" because of the wire position support member 66 having the orbital revolution speed of "300" with respect to the core 210 having the rotation speed of "200" in the second control. In the first embodiment, the control mechanism 130 maintains the orbital revolution speeds of the wire position support member 66 in the first control and the second control, and variably controls the rotation speeds of the core 210 in the first control and the second control. The control mechanism 130 may maintain the rotation speeds of the core 210 in the first control and the second control, and variably control the orbital revolution speeds of the wire position support member 66 in the first control and the second control.

For example, the control mechanism 130 selects the combination of the rotation speeds of the core 210 and the orbital revolution speeds of the wire position support member 66 in the first control and the second control according to a product lot or a product type. By way of example, the control mechanism 130 selects the combination of the rotation speeds of the core 210 and the orbital revolution speeds of the wire position support member 66 in the first control and the second control based on a specification (such as a size or a shape of the core 210 and diameters of the wires W1, W2) of the coil component 200. That is, the control mechanism 130 changes the combination of the rotation speeds of the core 210 and the orbital revolution speeds of the wire position support member 66 in the first control and the second control when the coil component 200 in which the specification is changed is manufactured.

Figure 31:
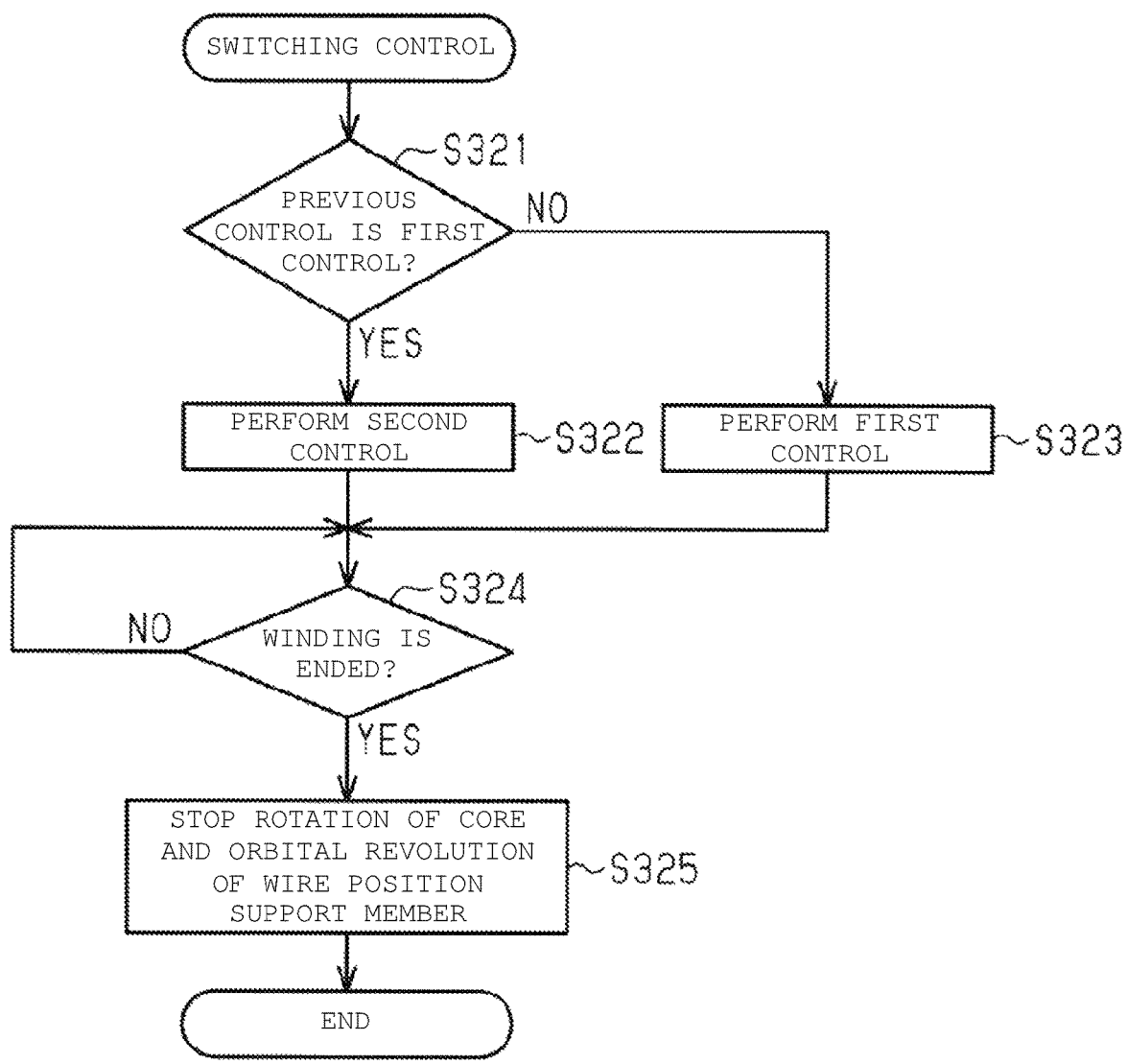
FIG. 31 is a flowchart illustrating a procedure of switching control performed by a control mechanism of the winding apparatus.

A procedure of the switching control will be described with reference to FIG. 31. The switching control is repeatedly performed.

In step S321, the control mechanism 130 determines whether or not the coil 220 is formed in the previous core 210 by the first control. The control mechanism 130 performs a determination in step S321 based on information about the previous winding process stored in the operation storage 132. The control mechanism 130 makes a negative determination in step S321 in the case that the coil 220 is formed for the initial core 210 immediately after the manufacturing of the coil component 200 is started, namely, in the case that the previous core 210 does not exist.

The control mechanism 130 performs the second control in step S322 when the coil 220 is formed in the previous core 210 by the first control. On the other hand, the control mechanism 130 performs the first control in step S323 when the coil 220 is not formed in the previous core 210 by the first control.

After selecting the first control or the second control, the control mechanism 130 determines whether or not the winding of each of the wires W1, W2 around the core 210 is ended in step S324. For example, the control mechanism 130 makes the determination in step S324 based on whether or not the number of turns of each of the wires W1, W2 reaches a predetermined number. That is, the control mechanism 130 determines that the winding of each of the wires W1, W2 around the core 210 is ended in the case that the number of turns of each of the wires W1, W2 reaches the predetermined number, and the control mechanism 130 determines that the winding of each of the wires W1, W2 around the core 210 is not ended in the case that the number of turns of each of the wires W1, W2 does not reach the predetermined number. When determining that the winding of each of the wires W1, W2 around the core 210 is ended, the control mechanism 130 stops the rotation of the core 210 and the orbital revolution of the wire position support member 66 in step S325, and temporarily ends the processing. On the other hand, when determining that the winding of each of the wires W1, W2 around the core 210 is not ended, the control mechanism 130 returns to the determination in step S324. That is, the first control or the second control is maintained until the winding of each of the wires W1, W2 around the core 210 by the first control or the second control is ended.

(Winding Ending Process)

The wire holding retreating mechanism 70 (in particular, the end-line-side wire holding unit 70C, the end-line-side wire opening and closing unit 70D, and the wire route support unit 70E), the first moving mechanism 110, and the second moving mechanism 120 are used in the winding ending process.

Figure 32:
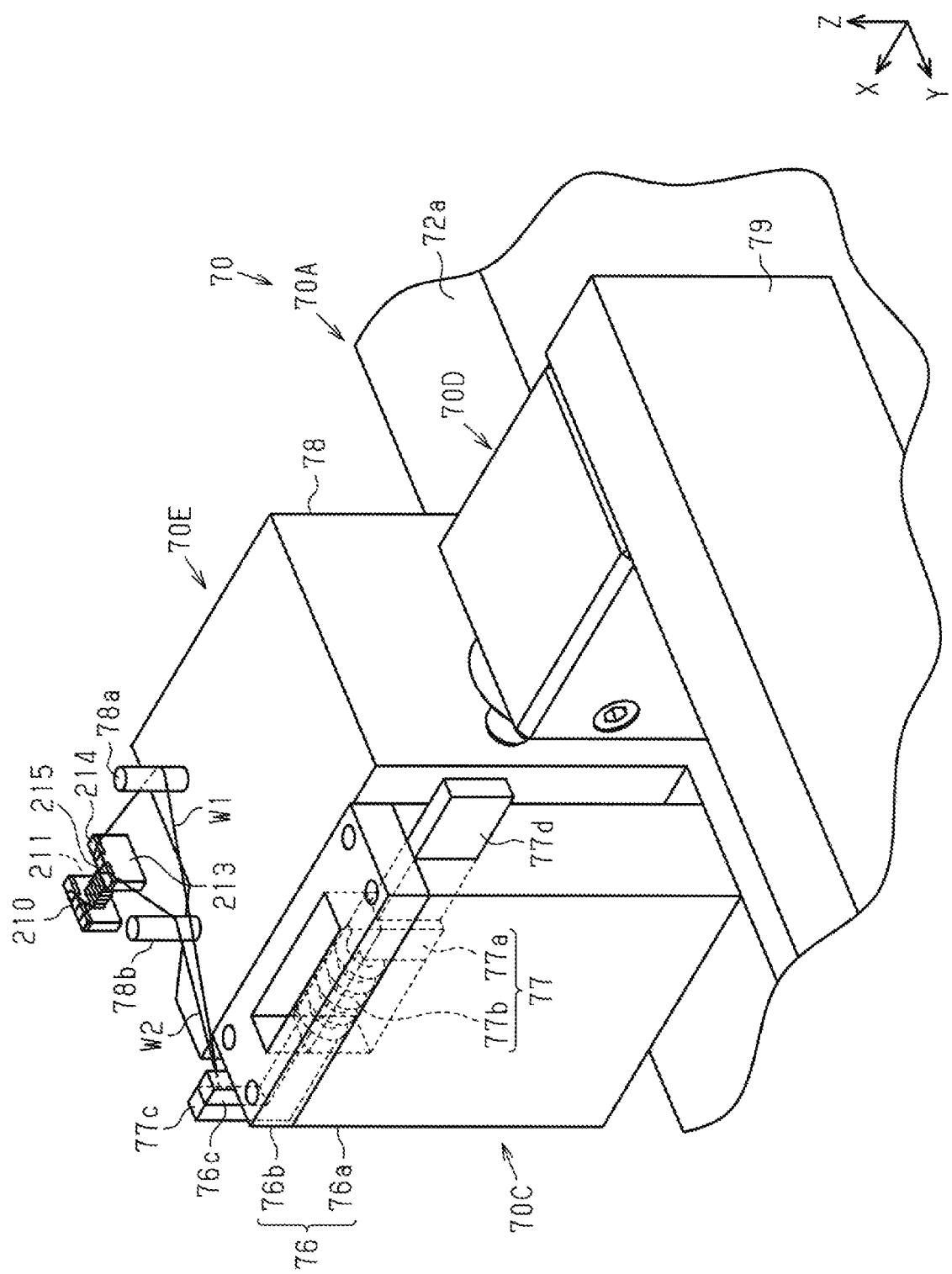
FIG. 32 is a perspective view illustrating a detailed configuration of an end-line-side wire holding unit and a wire route support unit of the wire holding retreating mechanism.

As illustrated in FIG. 32, the wire route support unit 70E includes a support base 78 having a substantially rectangular parallelepiped shape and two hook members 78a, 78b. The support base 78 is attached on the placing table 72a. The hook members 78a, 78b project from the upper end surface of the support base 78. The hook member 78a is provided at the position facing the core 210 in the front-back direction X. The hook member 78b is provided on the side of the end-line-side wire holding unit 70C with respect to the core 210.

The end-line-side wire holding unit 70C holds the first and second wires W1, W2, which are wound around the winding core 211 of the core 210 and hooked on the electrodes 214, 215 of the second flange 213. The end-line-side wire holding unit 70C includes a holding member 76 and an opening and closing member 77. The holding member 76 includes a base 76a having a rectangular parallelepiped shape and a fixed-side holding member 76b attached to the upper end of the base 76a. The base 76a is attached on the placing table 72a. A square-bar-shaped contact unit 76c is provided at the rear end of the fixed-side holding member 76b. The opening and closing member 77 includes a movable-side holding member 77a and an elastic body 77b. The elastic body 77b is attached to the movable-side holding member 77a. The movable-side holding member 77a is inserted so as to be movable in the front-back direction X with respect to the holding member 76. The movable-side holding member 77a includes a contact unit 77c projecting from the holding member 76 toward the side of the core 210 in the front-back direction X and a pressed unit 77d projecting from the holding member 76 toward the side of the end-line-side wire opening and closing unit 70D in the front-back direction X. The contact unit 77c faces the contact unit 76c in the front-back direction X. The wires W1, W2 are pinched between the contact units 76c, 77c. The elastic body 77b biases the movable-side holding member 77a while orienting the movable-side holding member 77a toward the front. The elastic body 77b is accommodated in a space surrounded by the base 76a and the fixed-side holding member 76b.

The end-line-side wire opening and closing unit 70D is attached at the leading end of the arm 79 provided in the driving unit 70B (see FIG. 28) of the wire holding retreating mechanism 70. An example of the end-line-side wire opening and closing unit 70D is an electric cylinder. The end-line-side wire opening and closing unit 70D presses the pressed unit 77d of the movable-side holding member 77a.

Figure 33A:
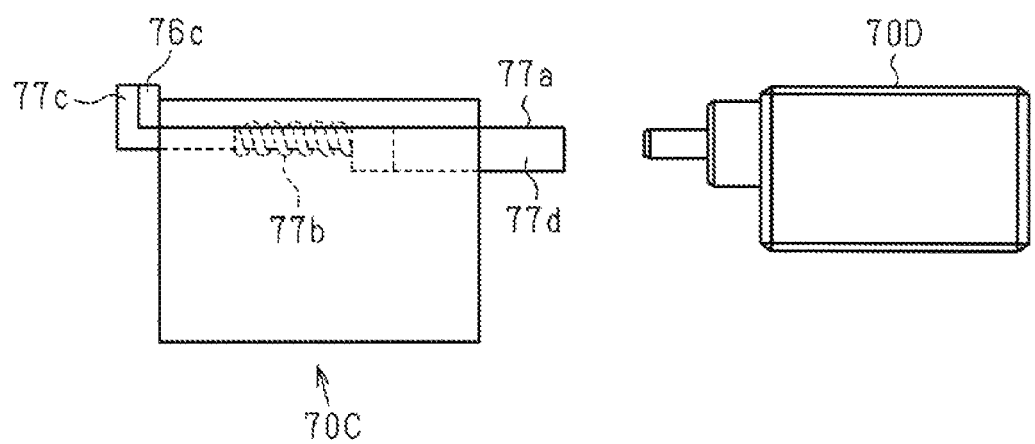
FIG. 33A is a side view illustrating the end-line-side wire holding unit and an end-line-side wire opening and closing unit when the end-line-side wire holding unit is in the wire holding state.
Figure 33B:
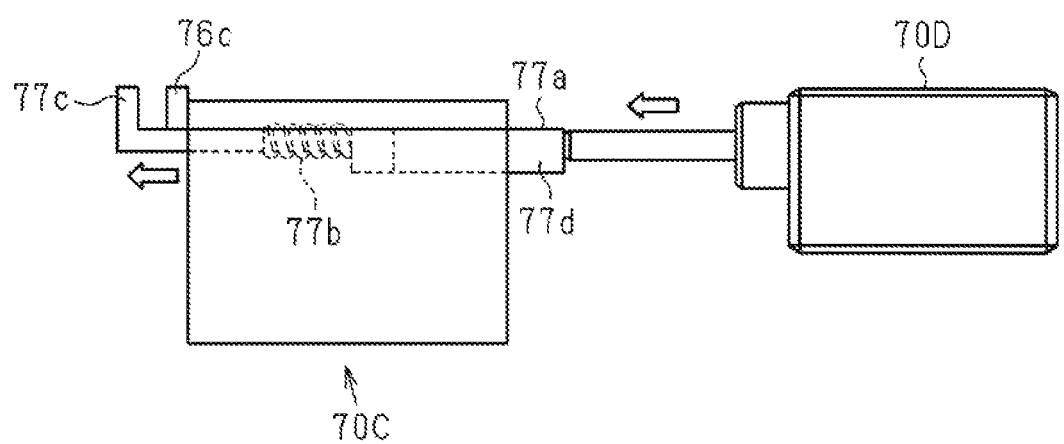
FIG. 33B is a side view illustrating the end-line-side wire holding unit and the end-line-side wire opening and closing unit when the end-line-side wire holding unit is in the wire holding release state.

The end-line-side wire holding unit 70C can switch between the wire holding state in FIG. 33A and the wire holding release state in FIG. 33B using the end-line-side wire opening and closing unit 70D. As illustrated in FIG. 33A, in the wire holding state, the end-line-side wire opening and closing unit 70D does not press the movable-side holding member 77a. For this reason, the elastic body 77b biases the movable-side holding member 77a onto the side of the end-line-side wire opening and closing unit 70D. At this point, the elastic body 77b presses the contact unit 77c against the contact unit 76c. As illustrated in FIG. 33B, in the wire holding release state, the end-line-side wire opening and closing unit 70D presses the movable-side holding member 77a, whereby the movable-side holding member 77a moves against the biasing force of the elastic body 77b so as to compress the elastic body 77b. Consequently, the contact unit 77c is separated from the contact unit 76c.

The control mechanism 130 (see FIG. 7) performs winding ending control. The winding ending control includes moving processing and holding and opening and closing processing. In the moving processing, the control mechanism 130 relatively moves the wire position support member 66 of the wire winding mechanism 60 and the core holding unit 30B to feed the wires W1, W2 using the first moving mechanism 110 and the second moving mechanism 120. That is, in the core 210 after the coil 220 is formed, the first wire W1 is hooked on the first electrode 214 of the second flange 213, and the second wire W2 is hooked on the second electrode 215 of the second flange 213. The wires W1, W2 move to the holding member 76 while being hooked on the hook members 78a, 78b. At this point, the control mechanism 130 performs the holding and opening and closing processing. In the holding and opening and closing processing, the control mechanism 130 drives the end-line-side wire opening and closing unit 70D to change the end-line-side wire holding unit 70C into the wire holding release state. Consequently, because the contact unit 77c is separated from the contact unit 76c, a space where the first and second wires W1, W2 are disposed is formed between the contact units 76c, 77c. The control mechanism 130 inserts the wire W1, W2 between the contact units 76c, 77c through the moving processing. Through the holding and opening and closing processing, the control mechanism 130 drives the end-line-side wire opening and closing unit 70D to change the end-line-side wire holding unit 70C into the wire holding state. Consequently, the state in which the first and second wires W1, W2 are pinched between the contact units 76c, 77c is maintained.

In the moving processing of the winding ending control, the control mechanism 130 may control, instead of the first moving mechanism 110 and the second moving mechanism 120, an arm (not illustrated) that holds and moves the first and second wires W1, W2. In this case, the actuator of the first moving mechanism 110 and the actuator 123 of the second moving mechanism 120 are not driven in the moving processing.

(Wire Connection Process and Excess Wire Cutting Process)

The wire connection mechanism 80 in FIG. 34 is used in the wire connection process and the wire cutting process. The wasted line recovery mechanism 90 in FIG. 36, the holding mechanism 30, the opening and closing mechanism 40, and the wire holding retreating mechanism 70 are also used in the wire cutting process. In FIGS. 34 to 36, for convenience, the holding mechanism 30 and the wire holding retreating mechanism 70 are schematically illustrated similar to FIG. 4.

In the wire connection process, the wire connection mechanism 80 connects the first wire W1 to the first electrode 214 of the core 210, and connects the second wire W2 to the second electrode 215, thereby electrically connecting the first wire W1 and the first electrode 214, and electrically connecting the second wire W2 and the second electrode 215. In the excess wire cutting process, the wire connection mechanism 80 cuts the excess wire that is of a portion extending from the first electrode 214 and the second electrode 215 of the core 210 toward the opposite side to the coil 220 in the wires W1, W2.

As illustrated in FIGS. 34 and 35, the wire connection mechanism 80 includes a support base 81, a first pushing unit 82, a heat generator 83, two second pushing units 84, and two excess wire cutting units 85. In FIG. 34, the second pushing units 84 and the excess wire cutting units 85 are omitted for convenience. In FIG. 34B, the post 72b, the pressed unit 72c, and the elastic body 73 are omitted for convenience.

As illustrated in FIGS. 34A and 34B, the support base 81 is disposed on the opposite side to the coupling arm 71 with respect to the carrier 112 and at a position adjacent to the wire winding mechanism 60 (see FIG. 4) in the horizontal direction Y. As illustrated in FIG. 34B, the support base 81 is formed into a substantial L-shape covering the carrier 112 from above when viewed in the horizontal direction Y. In the support base 81, the first pushing unit 82 is attached at the leading end of the portion covering the carrier 112 from above. An example of the first pushing unit 82 is an electric cylinder. In the first pushing unit 82, the heat generator 83 is attached to the arm movable in the vertical direction Z. That is, the first pushing unit 82 moves the heat generator 83 in the vertical direction Z. Consequently, the heat generator 83 is pressed against the electrode 214, 215 (see FIG. 34C) of the core 210. The heat generator 83 heats the core 210. As illustrated in FIG. 34C, the heat generator 83 includes a thermoelectric member 83a and a heat transfer member 83b. An example of the heat generator 83 is a pulse heater. An example of the thermoelectric member 83a is a thermocouple. An example of the heat transfer member 83b is a heater chip. A material, such as molybdenum, titanium, and stainless steel, which has good thermal conductivity, is used as the heater chip. The heat transfer member 83b is provided adjacent to the thermoelectric member 83a, and pressed against the first electrode 214 and second electrode 215 (not illustrated) of the first flange 212 of the coil 210 and the first electrode 214 and second electrode 215 (not illustrated) of the second flange 213 by the first pushing unit 82. Consequently, heat of the thermoelectric member 83a is transferred to the electrodes 214, 215 of the core 210 through the heat transfer member 83b.

Figure 35A:
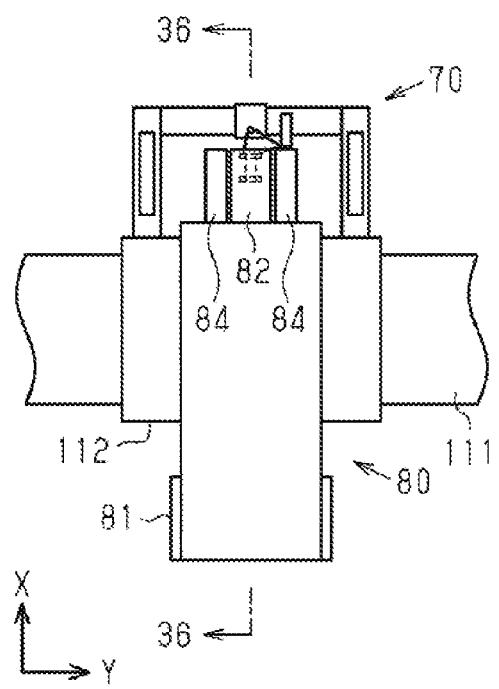
FIG. 35A is a schematic plan view of the wire connection mechanism.
Figure 35B:
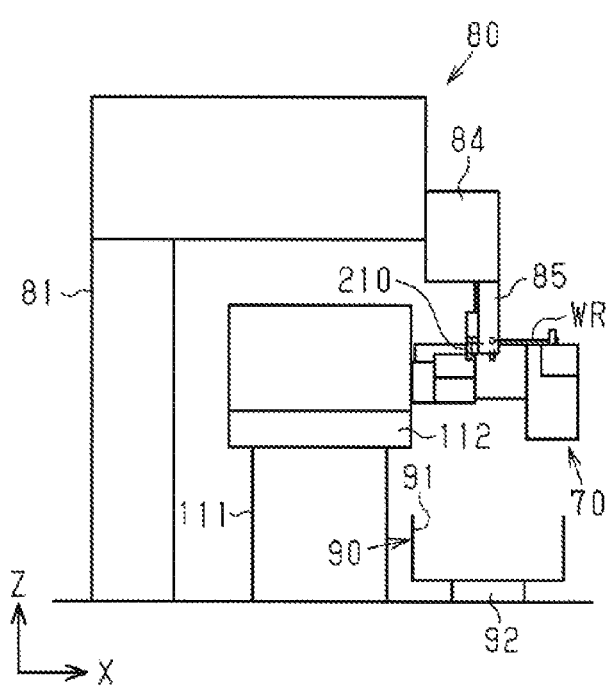
FIG. 35B is a schematic side view of the wire connection mechanism.

As illustrated in FIG. 35A, the second pushing units 84 are attached to portions on both sides of the first pushing unit 82 in the support base 81 in the horizontal direction Y. An example of the second pushing unit 84 is an electric cylinder. As illustrated in FIG. 35B, the excess wire cutting unit 85 is attached to the second pushing unit 84. The second pushing unit 84 moves the excess wire cutting unit 85 in the vertical direction Z.

Figure 36A:
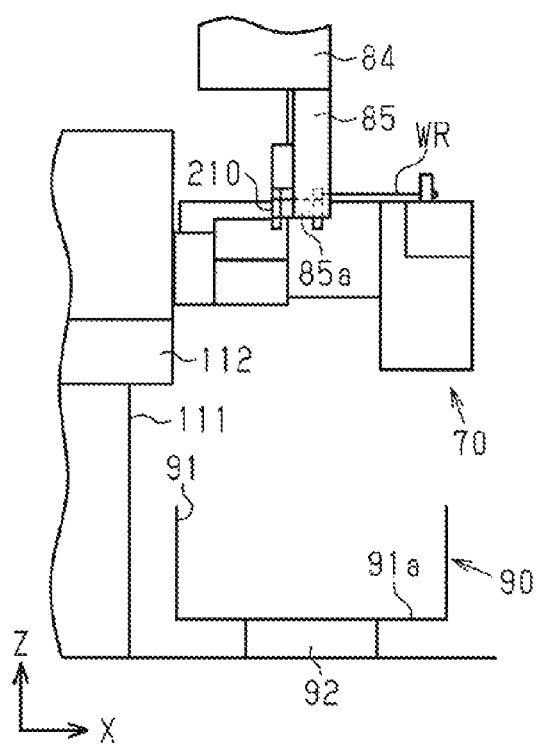
FIGS. 36A and 36B are schematic side views illustrating a wire cutting operation of the wire connection mechanism.
Figure 36B:
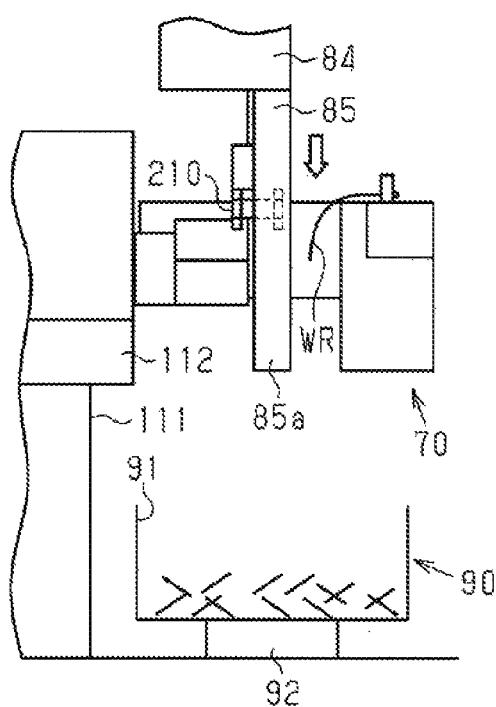

As illustrated in FIGS. 36A and 36B, a cutting blade 85a is provided at the lower end of the excess wire cutting unit 85. In the excess wire cutting unit 85, the cutting blade 85a is movable in the vertical direction Z by the second pushing unit 84 in a range between a first position in FIG. 36A and a second position in FIG. 36B. In the excess wire cutting unit 85, the cutting blade 85a moves from the first position to the second position to cut an excess wire WR extending from each of the electrodes 214, 215 of the core 210 toward the opposite side to the coil 220 (see FIG. 34C). One of the excess wire cutting units 85 cuts the excess wire WR on a starting side of the winding of the wires W1, W2 around the core 210, and the other excess wire cutting unit 85 cuts the excess wire WR on an ending side of the winding of the wires W1, W2 around the core 210.

As illustrated in FIG. 36A, the wasted line recovery mechanism 90 includes a recovery box 91 and a suction fan 92. The recovery box 91 is a box in which an upper portion is opened, and recovers the cut wire WR (see FIG. 36B). For example, the suction fan 92 is attached below a bottom wall 91a of the recovery box 91.

The control mechanism 130 (see FIG. 7) performs wire connection control and excess wire cutting control. The excess wire cutting control is performed after the wire connection control. In the wire connection control, the wires W1, W2 are connected to the electrodes 214, 215 of the first flange 212 of the core 210 and the electrodes 214, 215 of the second flange 213. The wire connection control include pressure bonding load control processing, pressure bonding time control processing, and pressure bonding temperature control processing. Through the pressure bonding load control processing, the control mechanism 130 controls the operation of the first pushing unit 82 such that a load pressing the heat generator 83 against the electrodes 214, 215 of the first flange 212 of the core 210 and the electrodes 214, 215 of the second flange 213 becomes a previously-set load. Through the pressure bonding time control processing, the control mechanism 130 controls the operation of the first pushing unit 82 such that the first pushing unit 82 is separated from the core 210 when time to press the heat generator 83 against the electrodes 214, 215 of the first flange 212 of the core 210 and the electrodes 214, 215 of the second flange 213 reaches a previously-set time. Through the pressure bonding temperature control processing, the control mechanism 130 controls the heat generator 83 such that a temperature (or a temperature at the thermoelectric member 83a) at the heat transfer member 83b of the heat generator 83 becomes a previously-set temperature.

The excess wire cutting control includes cutting processing and recovery processing. The cutting processing and the recovery processing are performed in the same period. In the cutting processing, the control mechanism 130 moves the cutting blade 85a of the excess wire cutting unit 85 from the first position to the second position to cut the excess wire in each of the wires W1, W2, and moves the cutting blade 85a from the second position to the first position. The control mechanism 130 changes the start-line-side wire holding unit 30C into the holding release state using the start-line-side wire opening and closing unit 40B, and changes the end-line-side wire holding unit 70C into the holding release state using the end-line-side wire opening and closing unit 70D. Consequently, the excess wire WR drops downward. In the recovery processing, the control mechanism 130 drives the suction fan 92 at a predetermined rotation speed. Consequently, an intake flow is generated from the upper portion of the recovery box 91 toward the opening and inside of the recovery box 91, the excess wire WR is easily recovered in the recovery box 91.

(Component Carrying Process)

The holding mechanism 30, the opening and closing mechanism 40, and the core carrying mechanism 100 are used in the component carrying process. In FIG. 37, for convenience, the holding mechanism 30 is schematically illustrated similar to FIG. 4.

As illustrated in FIGS. 37A to 37C, the core carrying mechanism 100 has the same configuration as the core input mechanism 20. That is, the core carrying mechanism 100 includes a core holding and fixing unit 101, a core conveyance unit 102, and a core attitude support unit 103. The core conveyance unit 102 includes a first electric cylinder 102a and a second electric cylinder 102b. The core holding and fixing unit 101 includes a holding member 101a and an opening and closing cylinder 101b. As illustrated in FIG. 37A, the holding member 101a includes a first arm 101c and a second arm 101d. The second arm 101d is movable in the front-back direction X by the opening and closing cylinder 101b. The core holding and fixing unit 101 can hold the core 210 by the arm 101c, 101d of the opening and closing cylinder 101b.

The control mechanism 130 (see FIG. 7) performs core carrying position control to control the operation of the core carrying mechanism 100. First holding and opening and closing processing, second holding and opening and closing processing, moving processing, and position control processing are performed in the core carrying position control. In the component carrying process, as illustrated in FIG. 37A, the control mechanism 130 drives the core opening and closing unit 40A of the opening and closing mechanism 40 to release the holding of the core 210 by the fixed-side holding member 37 and the movable-side holding member 38 through the first holding and opening and closing processing. Through the moving processing, the control mechanism 130 controls the electric cylinders 102a, 102b to move the core holding and fixing unit 101 such that the core holding and fixing unit 101 faces the holding mechanism 30.

Through the second holding and opening and closing processing, the control mechanism 130 controls the opening and closing cylinder 101b such that the second arm 101d is brought close to the first arm 101c. Consequently, the core 210 is pinched between the first and second arms 101c, 101d. As illustrated in FIG. 37B, the control mechanism 130 drives the first electric cylinder 102a such that the core holding and fixing unit 101 moves upward through the moving processing while the core carrying mechanism 100 holds the core 210, and then the control mechanism 130 drives the second electric cylinder 102b such that the core holding and fixing unit 101 moves forward. Consequently, the core 210 is carried from the holding mechanism 30.

<Taping Apparatus>

A configuration of the taping electronic component array 300 will be described with reference to FIGS. 38 to 40.

Figure 38:
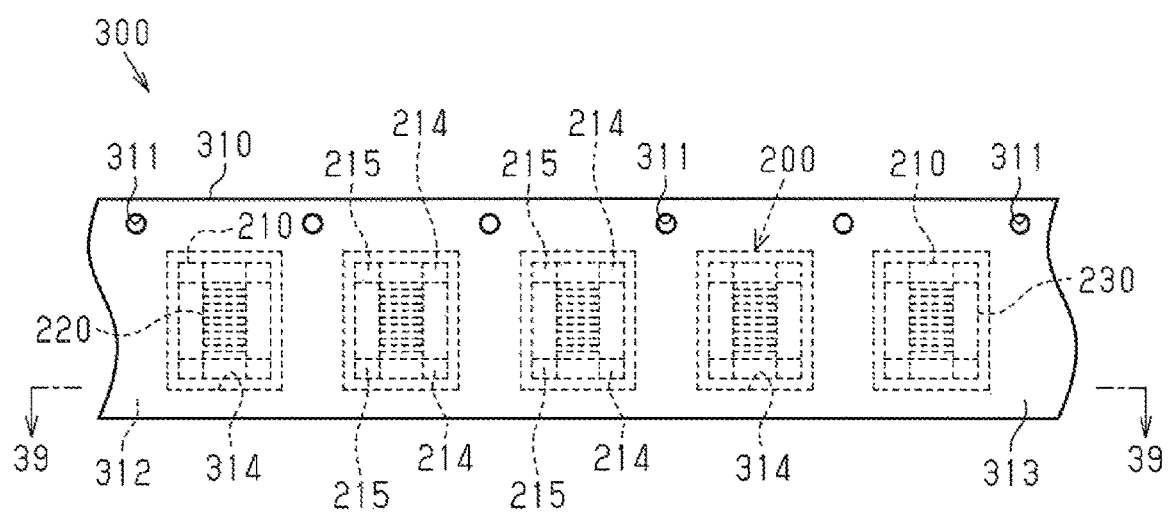
FIG. 38 is a plan view illustrating a part of a taping electronic component array.
Figure 39:
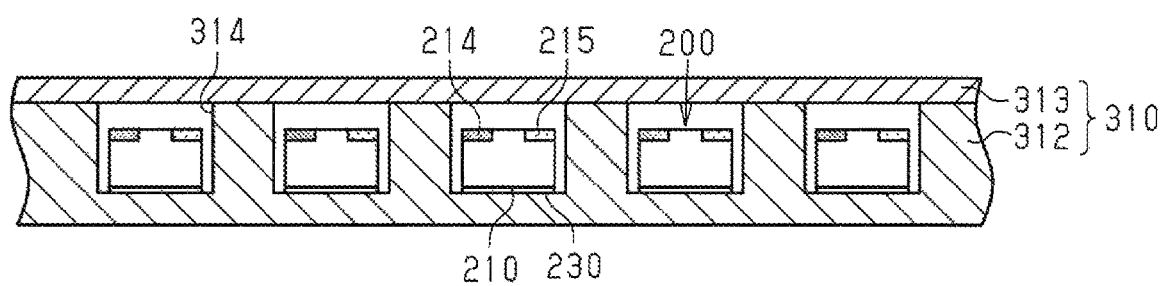
FIG. 39 is a sectional view taken along line 39-39 in FIG. 38.

As illustrated in FIG. 38, the taping electronic component array 300 includes a long tape 310 including a feed hole 311. The tape 310 includes a long carrier tape 312 and a long cover tape 313. In the carrier tape 312, a plurality of recesses 314 are provided at equal intervals in the length direction. In the first embodiment, each recess 314 has a rectangular plane shape. One coil component 200 is accommodated in each recess 314. As illustrated in FIG. 39, the coil component 200 is accommodated in each recess 314 such that the electrodes 214, 215 becomes the side of the cover tape 313. The cover tape 313 is bonded onto the carrier tape 312 using an adhesive agent so as to cover each recess 314. Consequently, the coil component 200 accommodated in each recess 314 can be prevented from dropping from the tape 310. When the coil component 200 is taken out from the tape 310, the cover tape 313 is peeled off from the carrier tape 312.

Figure 40:
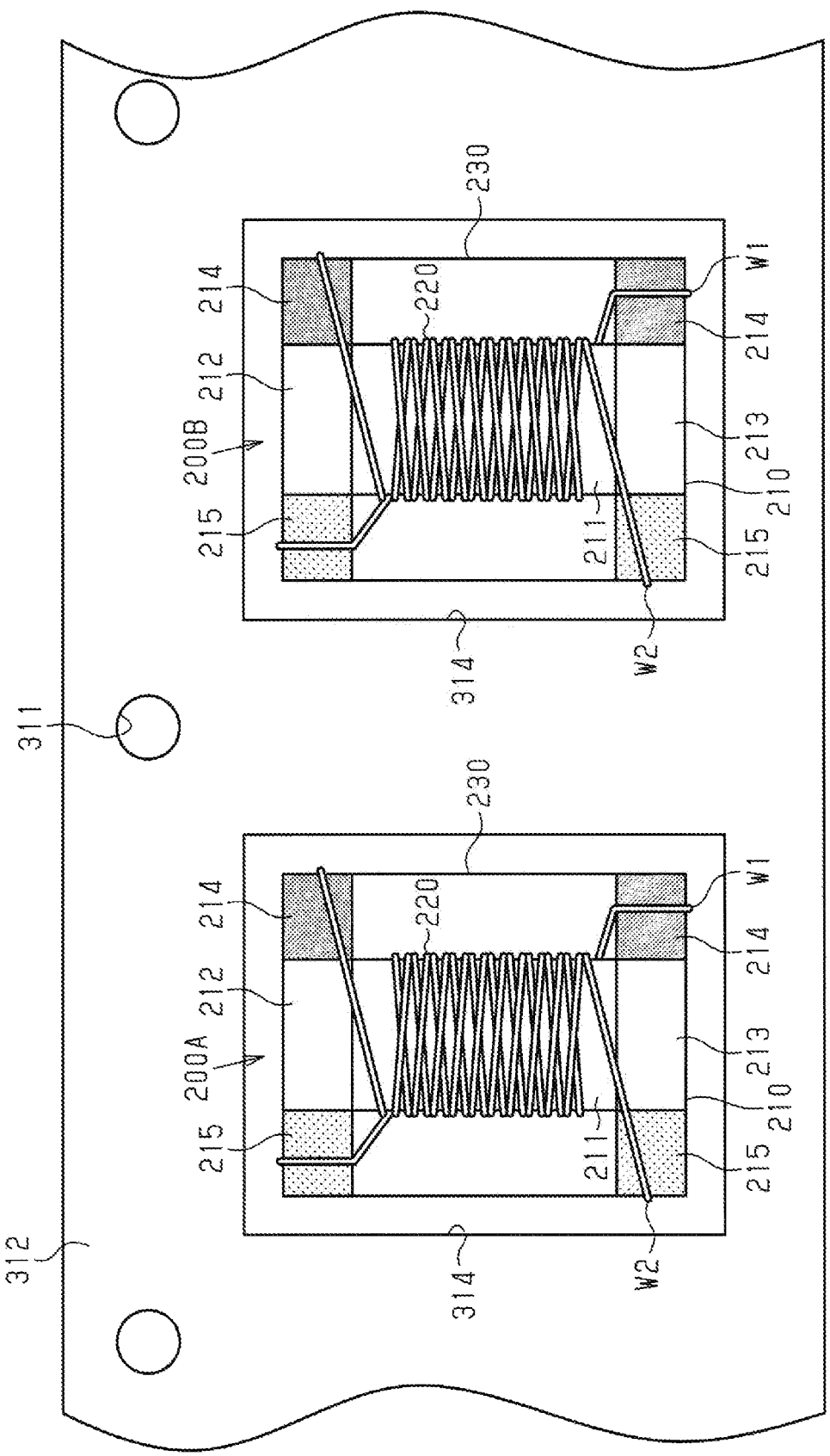
FIG. 40 is an enlarged view illustrating a part of the taping electronic component array in which a cover tape is omitted.

As illustrated in FIG. 40, a first coil component 200A that is of the coil component in which the wires W1, W2 are wound around the winding core 211 of the core 210 by the first control and a second coil component 200B that is of the coil component in which the wires W1, W2 are wound around the winding core 211 by the second control are accommodated in the recess 314 of the carrier tape 312. The first coil component 200A is the coil component in which the first and second wires W1, W2 in the winding core 211 are twisted in a predetermined twist direction. In the first embodiment, the predetermined twist direction is the direction in which the wires W1, W2 are twisted such that the first wire W1 intersects above the second wire W2. The second coil component 200B is the coil component in which the first and second wires W1, W2 in the winding core 211 are twisted in the opposite direction to the predetermined twist direction. In the first embodiment, the opposite direction to the predetermined twist direction is the direction in which the wires W1, W2 are twisted such that the first wire W1 intersects on the lower side (the side of the winding core 211) of the second wire W2.

In the longitudinal direction of the carrier tape 312, the first coil component 200A and the second coil component 200B are alternately accommodated in the predetermined number of recesses 314 in each predetermined number. In the first embodiment, because the first coil component 200A and the second coil component 200B are alternately manufactured one by one, the first coil component 200A and the second coil component 200B are alternately accommodated in each recess 314 in the longitudinal direction of the carrier tape 312. That is, in the first embodiment, the predetermined number is one. The core 210 of the first coil component 200A corresponds to the first core, the coil 220 corresponds to the first coil, and the cover member 230 corresponds to the first cover member. The core 210 of the second coil component 200B corresponds to the second core, the coil 220 corresponds to the second coil, and the cover member 230 corresponds to the second cover member.

An arrangement direction of the first coil component 200A with respect to the recess 314 is identical to an arrangement direction of the second coil component 200B with respect to the recess 314. More particularly, the arrangement direction of each of the electrodes 214, 215 in which the winding starting end of the coil 220 of the first coil component 200A is fixed with respect to the recess 314 is matched with the arrangement direction of each of the electrodes 214, 215 in which the winding starting end of the coil 220 of the second coil component 200B is fixed with respect to the recess 314. Consequently, the arrangement direction of each of the electrodes 214, 215 in which the winding ending end of the coil 220 of the first coil component 200A is fixed with respect to the recess 314 is matched with the arrangement direction of each of the electrodes 214, 215 in which the winding ending end of the coil 220 of the second coil component 200B is fixed with respect to the recess 314.

As described above, the following action and effect are obtained in the first embodiment.

(1-1) Assuming that the first rotation body 62 and the wire position support member 66 are fixed, according to the rotation position of the first rotation body 62, namely, the orbital revolution position of the wire position support member 66, the attitude of the wire position support member 66 changes when the wire position support member 66 is viewed in the axial direction. That is, the wire position support member 66 rotates about the center axis J3 while the first rotation body 62 makes one rotation.

In the first embodiment, the wire position support member 66 is supported by the inner bearings 64c, 64d while being rotatable with respect to the first rotation body 62. When the first rotation body 62 rotates, the first rotation body 62 and the wire position support member 66 rotate relatively by the inner bearings 64c, 64d according to the orbital revolution of the wire position support member 66. Consequently, the rotation of the wire position support member 66 due to the rotation of the first rotation body 62 can be prevented when the wire position support member 66 is viewed in the axial direction.

When the first rotation body 62 and the second rotation body 63 rotate synchronously, the synchronous rotation component 67 to which the wire position support member 66 is fixed revolves orbitally about the center axis J1 of the first rotation body 62 and the center axis J3 of the second rotation body 63 while the attitude of the synchronous rotation component 67 is maintained. Consequently, the rotation of the wire position support member 66, which is unrotatably fixed to the synchronous rotation component 67, is prevented by the synchronous rotation component 67. When the wire position support member 66 revolves orbitally while the wires W1, W2 contact with the wire position support member 66, the rotation of the wire position support member 66 can be prevented even if the wires W1, W2 try to cause the wire position support member 66 to rotate. Thus, the rotation of the wire position support member 66 is prevented, so that generation of the twist can be prevented between the wire position support member 66 and the second pulley 53b in each of the wires W1, W2.

(1-2) The inner bearings 64c, 64d are a rolling bearing. For this reason, the rotation of the first rotation body 62 can be received by a simple configuration compared with a magnetic bearing. Consequently, the configuration of the winding unit 60A can be simplified.

(1-3) The winding unit 60A further includes the screw member 67d pressing the wire position support member 66 against the inner circumferential surface constituting the second insertion hole 67b in which the wire position support member 66 is inserted in the synchronous rotation component. For this reason, the rotation of the wire position support member 66 can be prevented by frictional force between the outer circumferential surface of the wire position support member 66 and the inner circumferential surface of the second insertion hole 67b. Thus, for example, the rotation of the wire position support member 66 with respect to the synchronous rotation component 67 can be prevented even if the outer shape of the wire position support member 66 is not changed.

(1-4) The winding driving unit 60B includes the motor 68b constituting the driving source and the transmission mechanism 69 that transmits the rotating force of the motor 68b to the first rotation body 62 and the second rotation body 63. In this configuration, the transmission mechanism 69 rotates the first rotation body 62 and the second rotation body 63 using one motor 68b, so that the number of components of the winding driving unit 60B can be decreased.

(1-5) The shaft body 63f of the second rotation body 63 is rotatably coupled to the synchronous rotation component 67. This enables the prevention of the change in attitude of the synchronous rotation component 67 depending on the orbital revolution position of the shaft body 63f with respect to the center axis J2 of the second rotation body 63. Thus, the rotation of the wire position support member 66 due to the change in attitude of the synchronous rotation component 67 can be prevented.

(1-6) In the front end surface 66f constituting the regulation unit in the wire position support member 66, the opening is formed on the side on which the first wire W1 is fed in the first wire route hole 66d of the wire position support member 66, and the opening is formed on the side on which the second wire W2 is fed in the second wire route hole 66e. Consequently, in the case that the first wire route hole 66d is separated from the core 210 with respect to the second wire route hole 66e during the orbital revolution of the wire position support member 66 around the core 210, the first wire W1 fed from the first wire route hole 66d passes on the second wire route hole 66e by the front end surface 66f. In the case that the second wire route hole 66e is separated from the core 210 with respect to the first wire route hole 66d, the second wire W2 fed from the second wire route hole 66e passes on the first wire route hole 66d by the front end surface 66f. Thus, even if the wire position support member 66 revolves orbitally around the core 210, the wires W1, W2 are prevented from being entangled in a part of the wire position support member 66.

In the first embodiment, the front end surface 66f of the wire position support member 66 is formed into the spherical shape. Consequently, in the case that the first wire W1 crosses the second wire route hole 66e during the orbital revolution of the wire position support member 66 around the core 210, the first wire W1 passes through the position (the position on the front side) separated from the second wire route hole 66e in the axial direction of the wire position support member 66. On the other hand, in the case that the second wire W2 crosses the first wire route hole 66d, the second wire W2 passes through the position (the position on the front side) separated from the first wire route hole 66d in the axial direction of the wire position support member 66. Thus, even if the wire position support member 66 revolves orbitally around the core 210, the wires W1, W2 are further prevented from being entangled in a part of the wire position support member 66.

(1-7) The wire position support member 66 has the columnar outer shape. Consequently, the wire position support member 66 and the core 210 can be brought closer to each other compared with a wire position support member having a polygonal columnar shape. For this reason, the orbital revolution diameter of the wire position support member 66 can be decreased, and miniaturization of the winding apparatus 1 (winding unit 60A) can be achieved. In the case that the orbital revolution diameter of the wire position support member 66 is equal to that of the wire position support member having the polygonal columnar shape, the wire position support member 66 is hard to contact with the core 210 compared with the wire position support member having the polygonal columnar shape.

(1-8) The control mechanism 130 performs the first control, in which the rotation direction of the core 210 is matched with the orbital revolution direction of the wire position support member 66 and the orbital revolution speed of the wire position support member 66 is set faster than the rotation speed of the core 210. The control mechanism 130 also performs the second control, in which the rotation direction of the core 210 is matched with the orbital revolution direction of the wire position support member 66, which is the opposite direction to the rotation direction of the core 210 and the orbital revolution direction of the wire position support member 66 in the first control, and the orbital revolution speed of the wire position support member 66 is reduced lower than the rotation speed of the core 210. In this configuration, the kink direction of each of the first and second wires W1, W2 in the first control is opposite to the kink direction of each of the first and second wires W1, W2 in the second control.

The control mechanism 130 switches between the first control and the second control based on a predetermined condition. For this reason, even if each of the first and second wires W1, W2 is kinked by the first control, the kink of each of the first and second wires W1, W2 is decreased by the second control. The kink of each of the first and second wires W1, W2 is decreased compared with the case that the first and second wires W1, W2 are wound around the core 210 only by the first control or only by the second control. Thus, the generation of the kink of each of the first and second wires W1, W2 can be prevented between the wire feeding mechanism 50 and the wire position support member 66.

The winding directions of the first and second wires W1, W2 around the core 210 in the first control are matched with the winding directions of the first and second wires W1, W2 around the core 210 in the second control. For this reason, a magnetic flux orientation in supplying electric power to the coil 220 of the coil component 200 manufactured by the first control is matched with a magnetic flux orientation in supplying electric power to the coil 220 of the coil component 200 manufactured by the second control. Thus, mixture of the coil components 200 having different magnetic flux orientations can be prevented.

(1-9) The control mechanism 130 switches between the first control and the second control in each core 210. For this reason, a kink amount of each of the first and second wires W1, W2 in the first control is substantially equal to a kink amount of each of the wires W1, W2 in the second control. Thus, the kink of each of the first and second wires W1, W2 is substantially eliminated when the control mechanism 130 switches between the first control and the second control, so that the generation of the kink of each of the first and second wires W1, W2 can be prevented between the wire feeding mechanism 50 and the wire position support member 66.

(1-10) The absolute value of the speed of the wire position support member 66 relative to the core 210 in the first control is equal to the absolute value of the speed of the wire position support member 66 relative to the core 210 in the second control. In this configuration, the number of twists of each of the first and second wires W1, W2 per one turn of each of the first and second wires W1, W2 wound around the core 210 in the first control is equal to the number of twists of each of the first and second wires W1, W2 per one turn of each of the first and second wires W1, W2 wound around the core 210 in the second control. Thus, the generation of performance variation of the coil component 200 can be prevented.

(1-11) The plurality of recesses 314 of the carrier tape 312 include the recess 314 in which the first coil component 200A is accommodated and the recess 314 in which the second coil component 200B is accommodated. For this reason, a process of selecting the first coil component 200A and the second coil component 200B is eliminated with this carrier tape, compared with a tape in which only the first coil component 200A is accommodated or a tape in which only the second coil component 200B is accommodated, so that degradation of manufacturing capacity of the taping electronic component array 300 can be prevented.

(1-12) The arrangement direction of the winding starting end of the coil 220 of the first coil component 200A with respect to the recess 314 is matched with an arrangement direction of the winding starting end of the coil 220 of the second coil component 200B with respect to the recess 314. For this reason, necessity of a process of aligning the orientations of the first coil component 200A and the second coil component 200B is eliminated when the first coil component 200A and the second coil component 200B are mounted on the circuit board. Thus, efficiency of mounting work of the first coil component 200A and the second coil component 200B can be enhanced.

(1-13) The coil component 200 includes the magnetic cover member 230.

Consequently, the leakage of the magnetic flux of the coil component 200 is prevented because the magnetic flux leaking from the coil 220 flows in the cover member 230. Thus, an inductance value (L value) of the coil component 200 can be increased.

(1-14) The center C of the first and second wires W1, W2 of the second pulley 53*b* is matched with the center axis J1 of the first rotation body 62. Consequently, the change in distance between the center C of the second pulley 53*b* and the wire position support member 66 is prevented even if the wire position support member 66 revolves orbitally in association with the rotation of the first rotation body 62. Thus, the change in tension of each of the wires W1, W2 in association with the orbital revolution of the wire position support member 66 can be prevented.

(1-15) In the winding process, the wire holding retreating mechanism 70 downwardly retreats the end-line-side wire holding unit 70C, the end-line-side wire opening and closing unit 70D, and the wire route support unit 70E. Consequently, the end-line-side wire holding unit 70C, the end-line-side wire opening and closing unit 70D, and the wire route support unit 70E avoid interfering with the wire position support member 66 even if the wire position support member 66 revolves orbitally. For this reason, the end-line-side wire holding unit 70C, the end-line-side wire opening and closing unit 70D, and the wire route support unit 70E are disposed close to the core 210, so that the enlargement of the winding apparatus 1 can be prevented.

Second Embodiment

A winding apparatus 1 of a second embodiment will be described with reference to FIGS. 41 and 42. The winding apparatus 1 of the second embodiment differs from the winding apparatus 1 of the first embodiment in contents of the first control and the second control. In the second embodiment, the same component as the first embodiment is designated by the same reference numeral, and the description will be omitted as appropriate. The description of the relationship between the same components will be omitted as appropriate.

Figure 41:
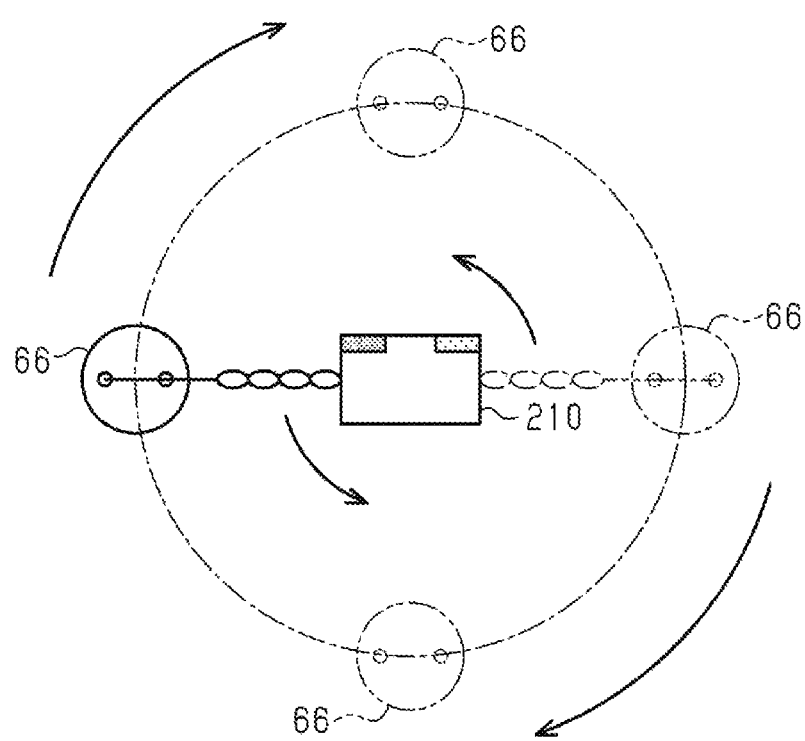
FIG. 41 is a schematic diagram illustrating a relationship between rotation of the core and orbital revolution of the wire position support member by first control with respect to a winding apparatus of a second embodiment.

As illustrated in FIG. 41, in the first control, the control mechanism 130 (see FIG. 7) rotates the core 210 in the counterclockwise direction, and orbitally revolves the wire position support member 66 in the clockwise direction. That is, the rotation direction of the core 210 is opposite to the orbital revolution direction of the wire position support member 66.

Figure 42:
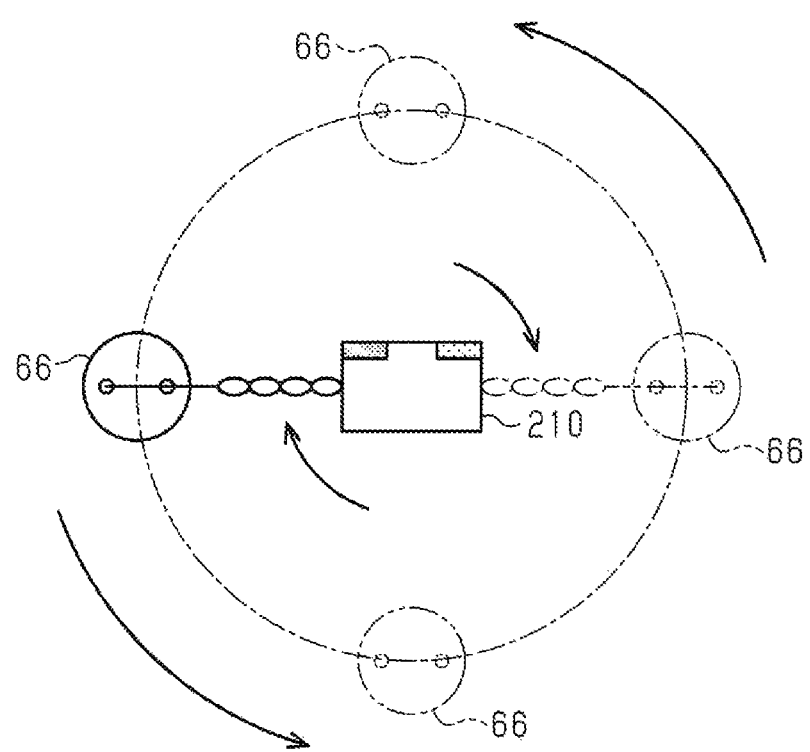
FIG. 42 is a schematic diagram illustrating the relationship between the rotation of the core and the orbital revolution of the wire position support member by second control of the winding apparatus.

As illustrated in FIG. 42, in the second control, the control mechanism 130 rotates the core 210 in the clockwise direction, and orbitally revolves the wire position support member 66 in the counterclockwise direction. That is, even in the second control, the rotation direction of the core 210 is opposite to the orbital revolution direction of the wire position support member 66.

The control mechanism 130 can arbitrarily set the rotation speed of the core 210 and the orbital revolution speed of the wire position support member 66. BY way of example, the rotation speed of the core 210 in the first control is equal to the rotation speed of the core 210 in the second control, and the orbital revolution speed of the wire position support member 66 in the first control is equal to the orbital revolution speed of the wire position support member 66 in the second control. That is, the absolute value of the speed of the wire position support member 66 relative to the core 210 in the first control is equal to the absolute value of the speed of the wire position support member 66 relative to the core 210 in the second control.

The control mechanism 130 of the second embodiment performs switching control similar to the switching control of the first embodiment. In the switching control, the first control and the second control are switched every time the coil 220 is formed in one core 210. For example, in the case that the coil 220 is formed in the core 210 by the first control, the coil 220 is formed in the next core 210 by the second control. That is, the control mechanism 130 repeats a cycle, in which the wires W1, W2 are wound around one core 210 by the first control and the wires W1, W2 are wound around the next core 210 by the second control.

The control mechanism 130 controls the rotation of the core 210 and the orbital revolution of the wire position support member 66 such that the number of rotations of the core 210 and the number of orbital revolutions of the wire position support member 66 in the first control are equal to the number of rotations of the core 210 and the number of orbital revolutions of the wire position support member 66 in the second control. For example, the control mechanism 130 sets the rotation speeds of the core 210 and the orbital revolution speeds of the wire position support member 66 in the first control and the second control according to the product lot or the product type. By way of example, the control mechanism 130 sets the rotation speeds of the core 210 and the orbital revolution speeds of the wire position support member 66 in the first control and the second control based on the specification (such as a size or a shape of the core 210 and diameters of the wires W1, W2) of the coil component 200. That is, the control mechanism 130 changes the rotation speeds of the core 210 and the orbital revolution speeds of the wire position support member 66 in the first control and the second control when the coil component 200 in which the specification is changed is manufactured. As described above, the effects similar to the effects (1-7) to (1-9) of the first embodiment are obtained in the second embodiment.

Third Embodiment

A winding apparatus 1 of a third embodiment will be described with reference to FIGS. 43 and 44. The winding apparatus 1 of the third embodiment differs from the winding apparatus 1 of the first embodiment in contents of the first control and the second control. In the third embodiment, the same component as the first embodiment is designated by the same reference numeral, and the description will be omitted as appropriate. The description of the relationship between the same components will be omitted as appropriate.

Figure 43:
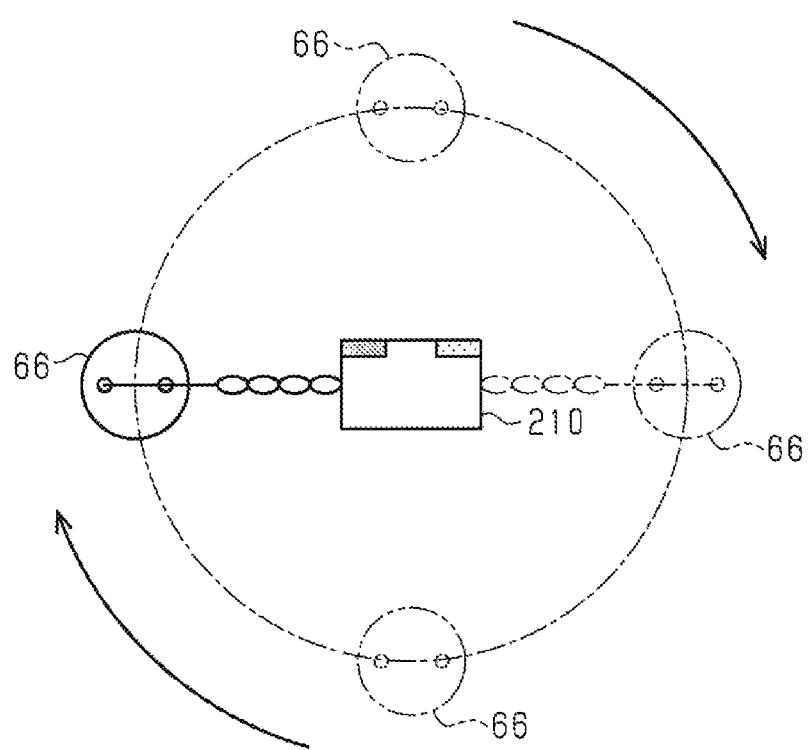
FIG. 43 is a schematic diagram illustrating the relationship between the rotation of the core and the orbital revolution of the wire position support member by first control with respect to a winding apparatus of a third embodiment.
Figure 44:
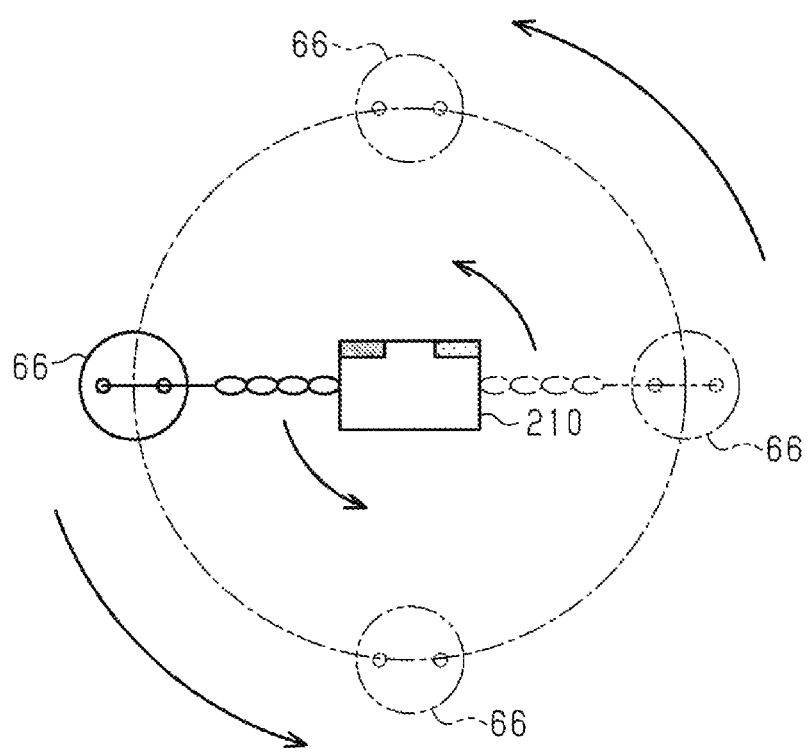
FIG. 44 is a schematic diagram illustrating the relationship between the rotation of the core and the orbital revolution of the wire position support member by second control of the winding apparatus.

As illustrated in FIG. 43, in the first control, the control mechanism 130 does not rotate the core 210, but orbitally revolves the wire position support member 66 in the clockwise direction that is of an example of the first rotation direction. As illustrated in FIG. 44, in the second control, the control mechanism 130 rotates the core 210 in the counterclockwise direction that is of an example of the second rotation direction, and orbitally revolves the wire position support member 66 in the counterclockwise direction. In the second control, the control mechanism 130 sets the rotation speed of the core 210 faster than the orbital revolution speed of the wire position support member 66. In the second control, because the rotation speed of the core 210 is faster than the orbital revolution speed of the wire position support member 66 although the orbital revolution direction of the wire position support member 66 is opposite to the orbital revolution direction of the wire position support member 66 of the first control, winding directions of the wires W1, W2 around the core 210 in the second control are matched with winding directions of the wires W1, W2 around the core 210 in the first control.

The control mechanism 130 controls the rotation speed of the core 210 and the orbital revolution speed of the wire position support member 66 such that the absolute value of the speed of the wire position support member 66 relative to the core 210 in the first control is equal to the absolute value of the speed of the wire position support member 66 relative to the core 210 in the second control.

The control mechanism 130 of the third embodiment performs switching control similar to the switching control of the first embodiment. In the switching control, the first control and the second control are switched every time the coil 220 is formed in one core 210. By way of example, the control mechanism 130 controls the orbital revolution of the wire position support member 66 such that the number of orbital revolutions of the wire position support member 66 in the first control are equal to the number of orbital revolutions of the wire position support member 66 in the second control. Specifically, in the case that the coil 220 is formed in one core 210 by the first control, the coil 220 is formed in the next one core 210 by the second control. That is, the control mechanism 130 repeats a cycle, in which the wires W1, W2 are wound around one core 210 by the first control and the wires W1, W2 are wound around the next core 210 by the second control. As described above, the effects similar to the effects (1-7) to (1-9) of the first embodiment are obtained in the third embodiment.

(Modifications)

The description of each of the above embodiments is an illustrative of a mode of the disclosure, but is not intended to restrict the mode. The following modifications of the above embodiments and a combination of at least two modifications can be made in the disclosure.

<Configuration of Winding Apparatus 1>

In the above embodiments, the configuration of the transmission mechanism 69 of the winding driving unit 60B can arbitrarily be changed. By way of example, the transmission mechanism 69 includes a transmission gear which is provided among the first gear 69a and the second gear 69b and the third gear 69c to similarly transmit the rotation of the first gear 69a to the second gear 69b and the third gear 69c. The term of "similarly transmit the rotation of the first gear 69a to the second gear 69b and the third gear 69c" means that the rotation of the first gear 69a is transmitted to the second gear 69b and the third gear 69c such that the rotation direction and the rotation speed of the second gear 69b are equal to the rotation direction and the rotation speed of the third gear 69c.

In the above embodiments, the fixing structure of the wire position support member 66 and the synchronous rotation component 67 can arbitrarily be changed. By way of example, the wire position support member 66 may be fixed by press fitting in the first insertion hole 67a of the synchronous rotation component 67 or bonding to the first insertion hole 67a of the synchronous rotation component 67. A rotation stop structure that regulates the rotation of the wire position support member 66 with respect to the synchronous rotation component 67 may be provided. By way of example, the first rotation body 62 includes a key groove formed in at least one of the outer circumferential surface of the wire position support member 66 and the inner circumferential surface constituting the first insertion hole 67a and a key member fitted in the key groove. In other words, the wire position support member 66 may unrotatably be coupled to the synchronous rotation component 67.

Figure 45:
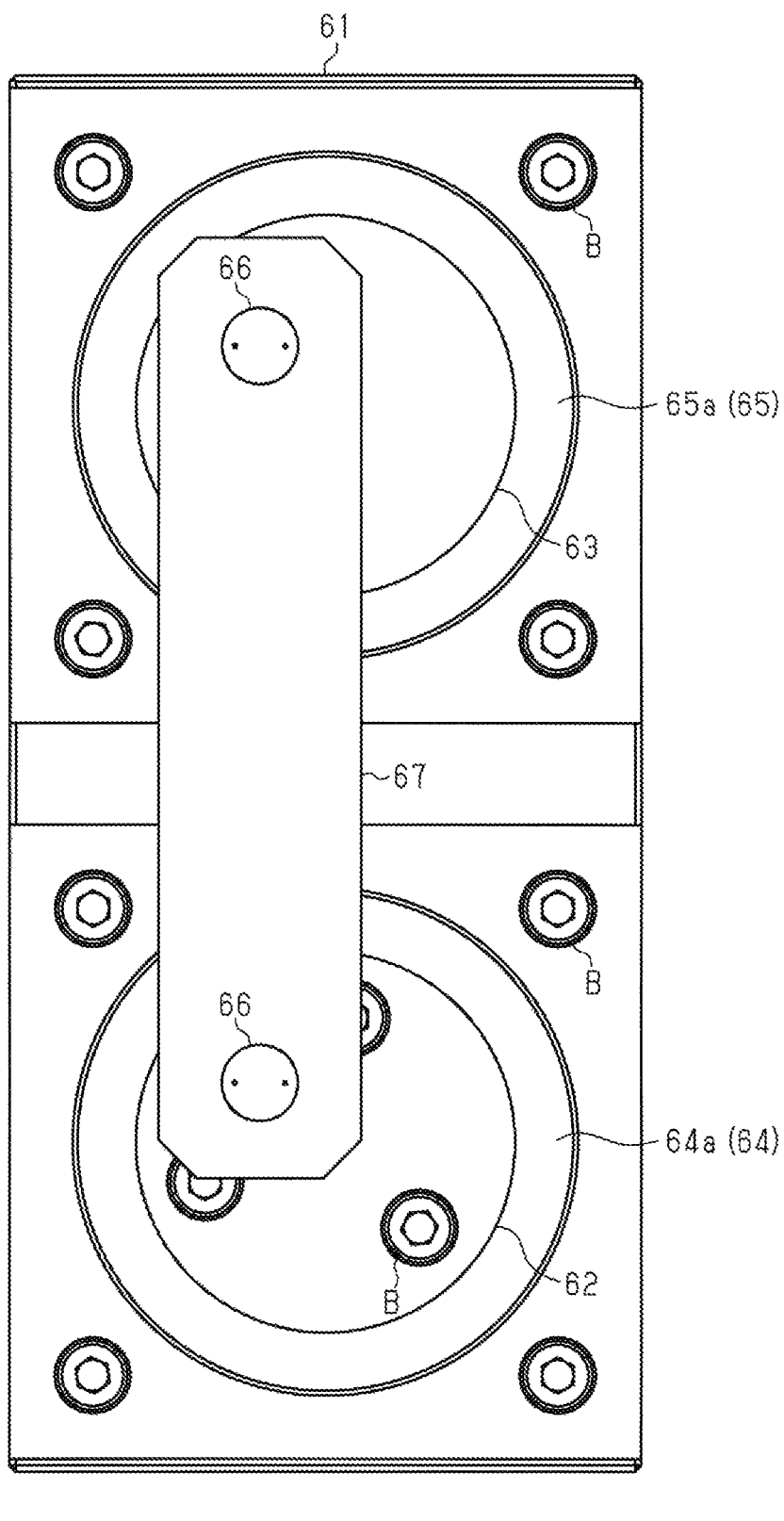
FIG. 45 is a front view illustrating a winding unit of a winding apparatus of a modification.
Figure 46:
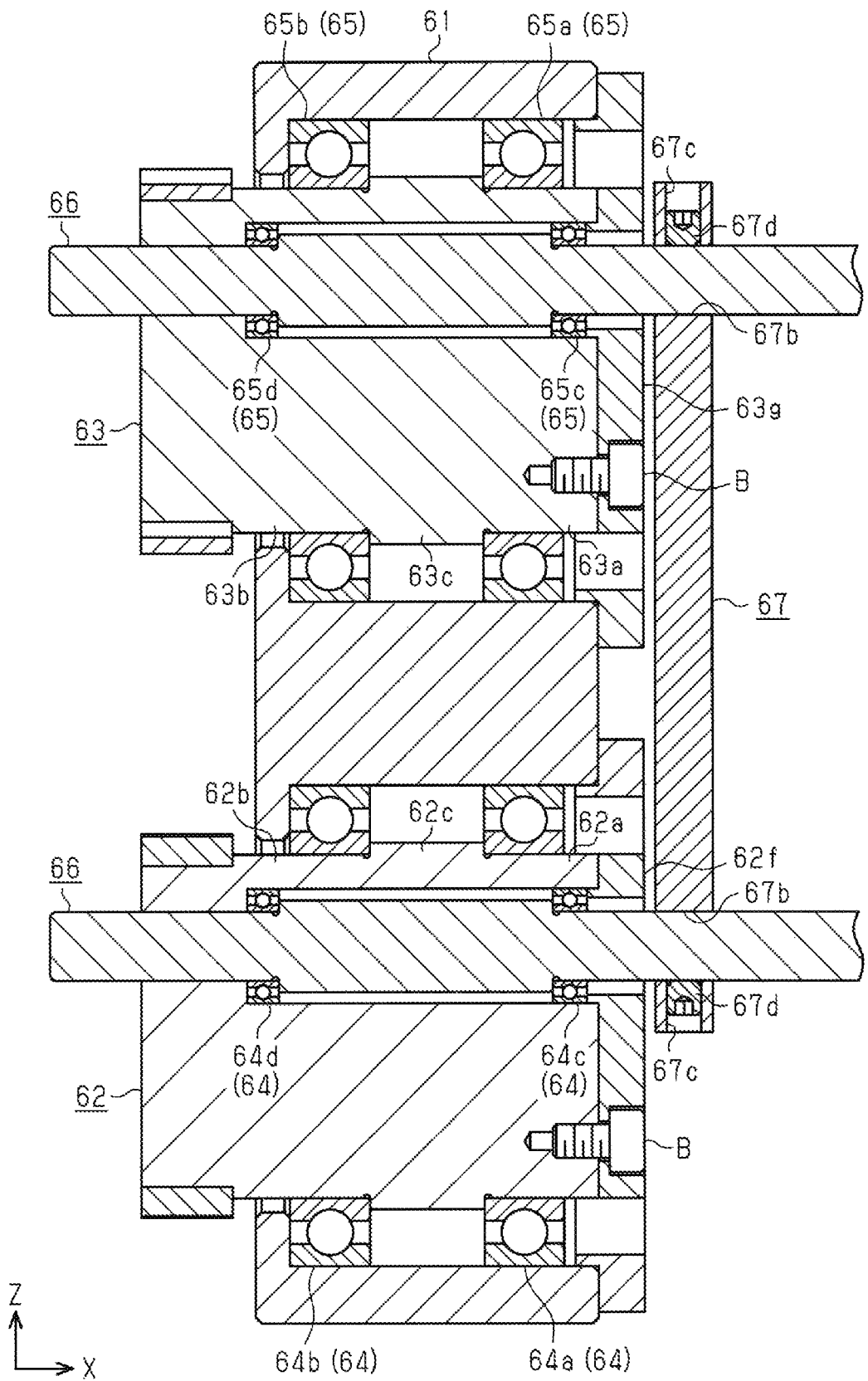
FIG. 46 is a sectional view of FIG. 45.

In the above embodiments, the configuration of the winding unit 60A can arbitrarily be changed. For example, as illustrated in FIG. 45, in the winding unit 60A, the configuration of the second rotation body 63 may be changed similarly to the first rotation body 62. As illustrated in FIG. 46, the second rotation body 63 includes the wire position support member 66, a regulation plate 63g, and inner bearings 65c, 65d in which the wire position support member 66 is journaled with respect to the second rotation body 63. The regulation plate 63g has the same configuration as the regulation plate 62f of the first rotation body 62. The inner bearings 65c, 65d have the same configurations as the inner bearings 64c, 64d.

Figure 47:
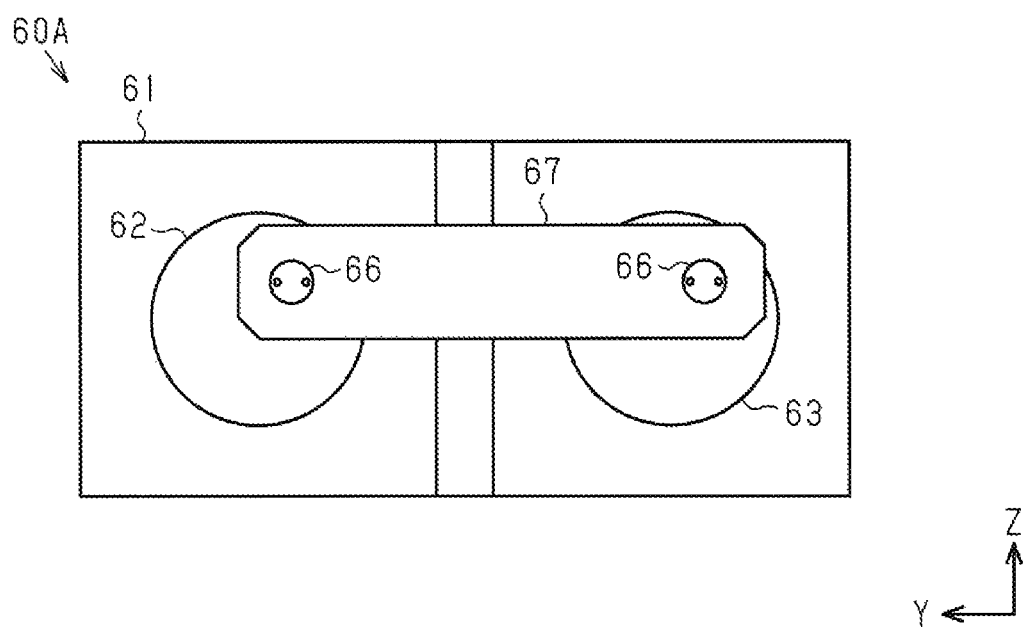
FIG. 47 is a front view illustrating a winding unit of a winding apparatus of a modification.

The inner bearings 65c, 65d correspond to the second inner bearing. In this configuration, the wires W1, W2 are wound around the core 210 using the wire position support member 66 inserted in the first rotation body 62, and the wires W1, W2 can be wound around another core 210 using the wire position support member 66 inserted in the second rotation body 63. Thus, manufacturing efficiency of the coil component 200 can be enhanced. In the above modification, two first rotation bodies 62 may be arranged in the horizontal direction Y as illustrated in FIG. 47. In the configuration of the winding unit 60A in FIGS. 45 and 47, at least three wire position support members 66 may be arranged.

In the above embodiments, the leading end shape of the wire position support member 66 can arbitrarily be changed. For example, the leading end shape of the wire position support member 66 may be changed in (A) to (E).

(A) As illustrated in FIGS. 48A and 48B, in the front end surface 66*f* of the wire position support member 66, a spherical convex surface 141 is formed between the first wire route hole 66*d* and the second wire route hole 66*e*. A portion except for the convex surface 141 in the front end surface 66*f* is formed by a plane orthogonal to the center axis J3 of the wire position support member 66. Preferably the wire position support member 66 is formed into a curved surface connecting the front end surface 66*f* and the outer circumferential surface of the wire position support member 66. Preferably the curved surface is formed over a whole circumference about the center axis J3 of the front end surface 66*f*.

In this configuration, in the case that the first wire W1 crosses the second wire route hole 66*e* during the orbital revolution of the wire position support member 66 around the core 210, the first wire W1 runs on the convex surface 141 because the convex surface 141 is formed between the first wire route hole 66*d* and the second wire route hole 66*e*. For this reason, the first wire W1 passes on the opening end surface on the side on which the second wire W2 is fed in the second wire route hole 66*e*, or passes through the position separated from the opening end surface in the axial direction of the wire position support member 66. In the case that the second wire W2 crosses the first wire route hole 66*d*, because the second wire W2 runs on the convex surface 141, the second wire W2 passes on the opening end surface on which the first wire W1 is fed in the first wire route hole 66*d*, or passes through the position separated from the opening end face in the axial direction of the wire position support member 66. Thus, the wires W1, W2 can be prevented from being entangled in the wire position support member 66.

(B) As illustrated in FIGS. 49A and 49B, in the front end surface 66*f* of the wire position support member 66, a convex surface 142 extending in a direction orthogonal to the array direction of the wire route holes 66*d*, 66*e* is formed between the first wire route hole 66*d* and the second wire route hole 66*e*. As illustrated in FIG. 49A, the convex surface 142 is formed into an arc shape in planar view of the wire position support member 66. A portion except for the convex surface 142 in the front end surface 66*f* is formed by a plane orthogonal to the center axis J3 of the wire position support member 66. Preferably the wire position support member 66 is formed into a curved surface connecting the front end surface 66*f* and the outer circumferential surface of the wire position support member 66. Preferably the curved surface is formed over a whole circumference about the center axis J3 of the front end surface 66*f*. In this configuration, the effect similar to that of the configuration of (A) is obtained.

Figure 50:
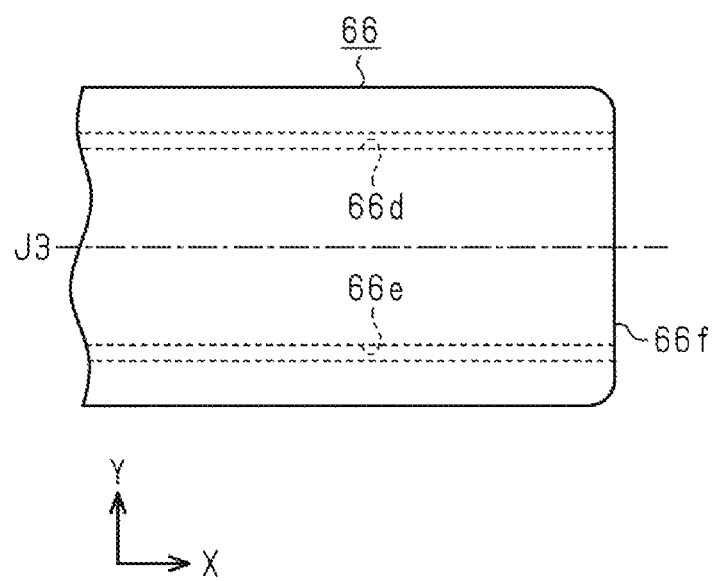
FIG. 50 is a plan view illustrating a leading end of a wire position support member in a winding apparatus of a modification.

(C) As illustrated in FIG. 50, the front end surface 66*f* of the wire position support member 66 includes a plane orthogonal to the center axis J3 of the wire position support member 66. In FIG. 50, the whole surface of the front end surface 66*f* is formed by the plane orthogonal to the center axis J3 of the wire position support member 66. Preferably the wire position support member 66 is formed into a curved surface connecting the front end surface 66*f* and the outer circumferential surface of the wire position support member 66. Preferably the curved surface is formed over a whole circumference about the center axis J3 of the front end surface 66*f*.

In this configuration, in the case that the first wire W1 crosses the second wire route hole 66*e* during the orbital revolution of the wire position support member 66 around the core 210, because the first wire W1 passes on the plane between the first wire route hole 66*d* and the second wire route hole 66*e*, the first wire W1 passes on the opening end surface on which the second wire W2 is fed in the second wire route hole 66*e*. Because the second wire W2 passes on the plane between the first wire route hole 66*d* and the second wire route hole 66*e*, the second wire W2 passes on the opening end surface on which the first wire W1 is fed in the first wire route hole 66*d*. Thus, the wires W1, W2 can be prevented from being entangled in the wire position support member 66.

Figure 51A:
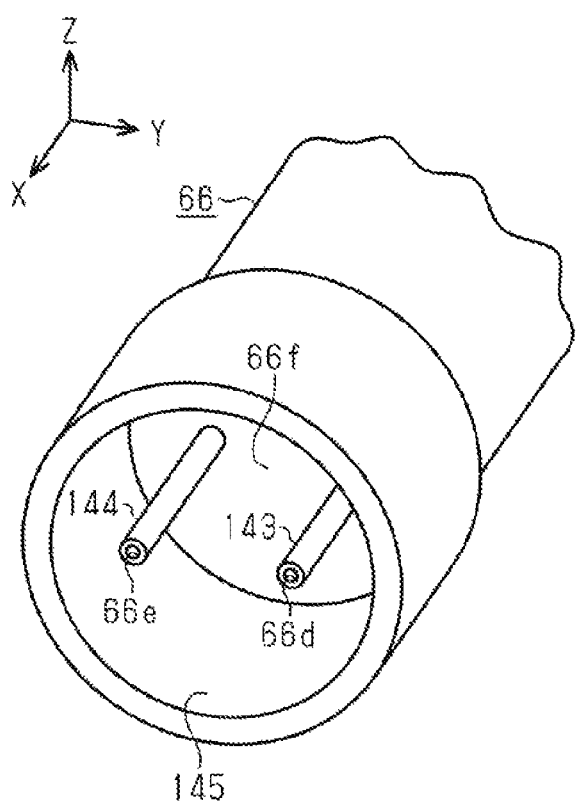
FIG. 51A is a perspective view illustrating a leading end of a wire position support member in a winding apparatus of a modification.
Figure 51B:
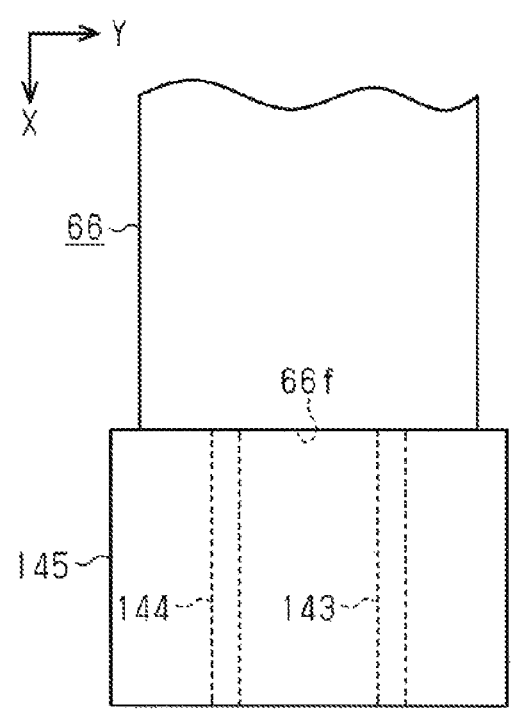
FIG. 51B is a plan view illustrating the leading end of the wire position support member.

(D) As illustrated in FIG. 51A, the wire position support member 66 includes a first feeding unit 143 and a second feeding unit 144, which extend forward from the front end surface 66*f*, and a circumferential wall 145 surrounding the first feeding unit 143 and the second feeding unit 144. The first wire route hole 66*d* is made in the first feeding unit 143, and the second wire route hole 66*e* is made in the second feeding unit 144. The circumferential wall 145 is provided at an outer circumferential edge of the front end surface 66*f*. By way of example, the circumferential wall 145 has a cylindrical shape extending forward from the front end surface 66*f*. As illustrated in FIG. 51B, the front end surface of each of the feeding units 143, 144 and the leading end surface of the circumferential wall 145 are located at the same position in the front-back direction X. The leading end surface of the circumferential wall 145 may project forward from the leading end surface of each of the feeding units 143, 144. The shape of the circumferential wall 145 can arbitrarily be changed. For example, the circumferential wall 145 may be formed into a polygonal shape when viewed from the front.

In this configuration, the wires W1, W2 pass on the leading end surface of the circumferential wall 145 when the wire position support member 66 revolves orbitally around the core 210. Consequently, the first wire W1 passes on the opening end surface on which the second wire W2 is fed in the second wire route hole 66*e*, or passes through the position separated from the opening end surface, and the second wire W2 passes on the opening end surface on which the first wire W1 is fed in the first wire route hole 66*d*, or passes through the position separated from the opening end surface. Thus, the wires W1, W2 can be prevented from being entangled in the wire position support member 66.

Figure 52:
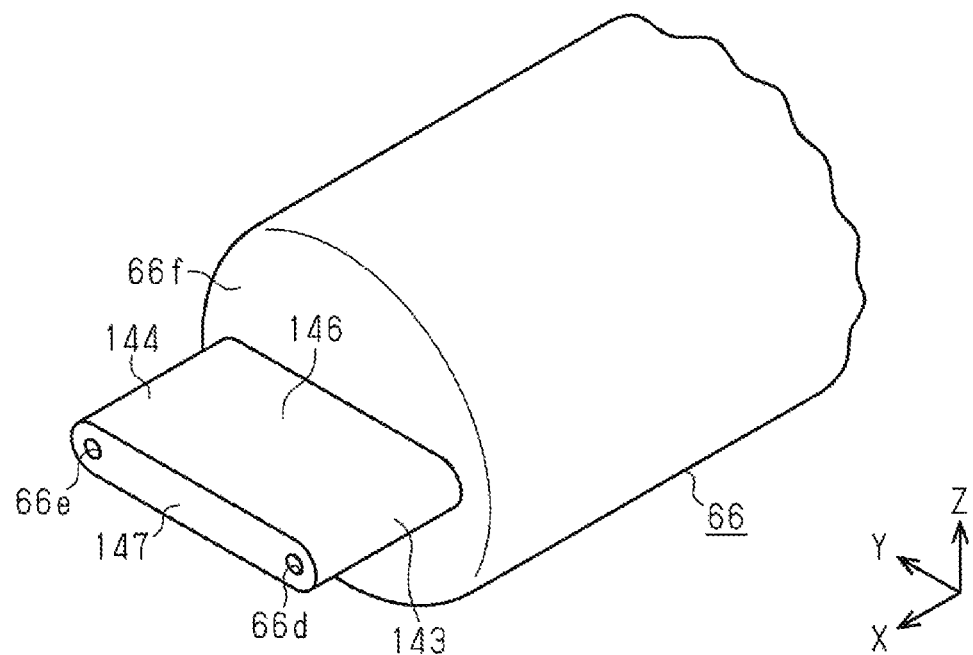
FIG. 52 is a perspective view illustrating a leading end of a wire position support member in a winding apparatus of a modification.

(E) In the wire position support member 66 in FIG. 52, compared with the wire position support member 66 in FIG. 51A, a coupling wall 146 coupling the first feeding unit 143 and the second feeding unit 144 is provided, and the circumferential wall 145 is eliminated. The coupling wall 146 extends from the front end surface 66*f* of the wire position support member 66 to the front end surfaces of the feeding units 143, 144. That is, a coupling surface 147 constituting the front end surface of the coupling wall 146 is flush with the opening end surface of the first wire route hole 66*d* in which the first wire W1 in the first feeding unit 143 is fed and the opening end surface of the second wire route hole 66*e* in which the second wire W2 in the second feeding unit 144 is fed.

Figure 53:
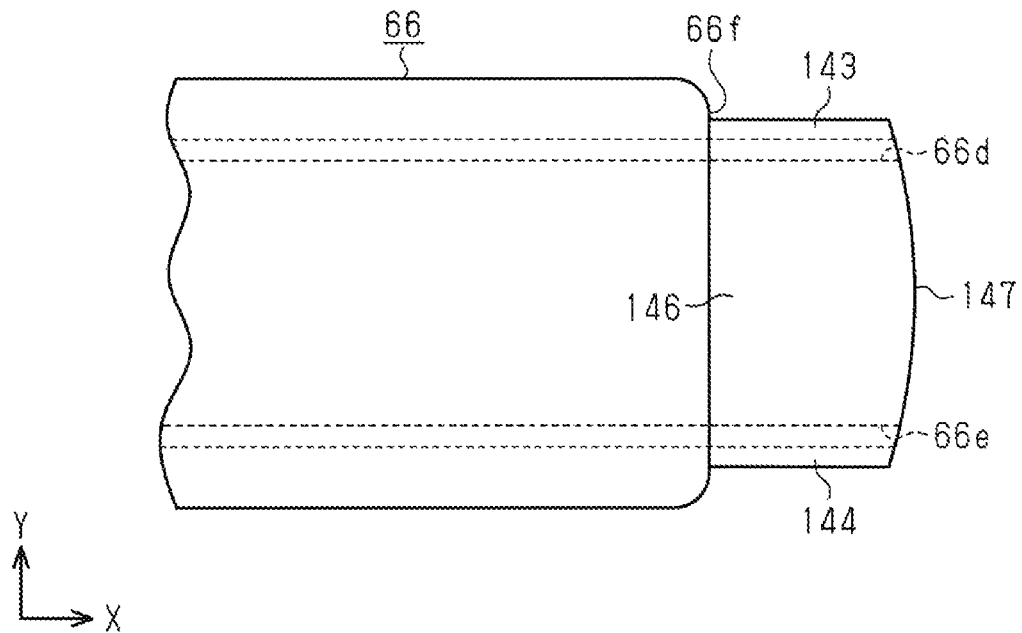
FIG. 53 is a plan view illustrating a leading end of a wire position support member in a winding apparatus of a modification.

In this configuration, because the wires W1, W2 pass on the coupling surface 147 during the orbital revolution of the wire position support member 66 around the core 210, the first wire W1 passes on the opening end surface on which the second wire W2 is fed in the second wire route hole 66e and the second wire W2 passes on the opening end surface on which the first wire W1 is fed in the first wire route hole 66d. Thus, the wires W1, W2 can be prevented from being entangled in the wire position support member 66. In the wire position support member 66 of FIG. 52, the coupling surface 147 may be formed into a convex surface projecting forward as illustrated in FIG. 53. The coupling surface 147 may be formed into a spherical surface projecting forward.

Figure 54A:
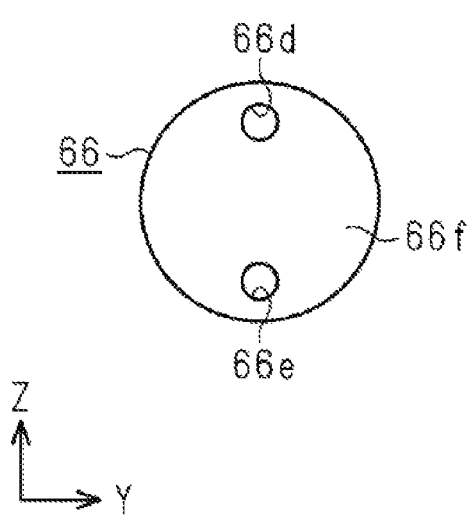
FIGS. 54A and 54B are front views illustrating a wire position support member of a winding apparatus of a modification.
Figure 54B:
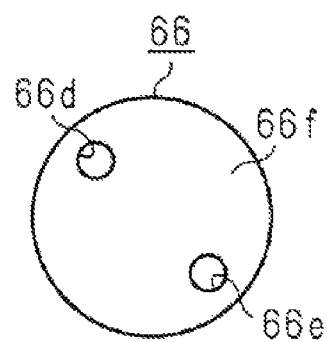

In the above embodiments, the first wire route hole 66d and the second wire route hole 66e of the wire position support member 66 have the positional relationship in which the first wire route hole 66d and the second wire route hole 66e are arranged in the horizontal direction Y. However, the positional relationship between the first wire route hole 66d and the second wire route hole 66e is not limited to the above embodiments, but can arbitrarily be changed. For example, as illustrated in FIG. 54A, the first wire route hole 66d and the second wire route hole 66e may be arranged in the vertical direction Z. As illustrated in FIG. 54B, the first wire route hole 66d and the second wire route hole 66e may be disposed at any rotation position about the center axis J3 except for the direction along the vertical direction Z and the direction along the horizontal direction Y. In other words, the first wire route hole 66d and the second wire route hole 66e may have the positional relationship of a point symmetry with respect to the center axis J3 of the wire position support member 66.

Figure 55:
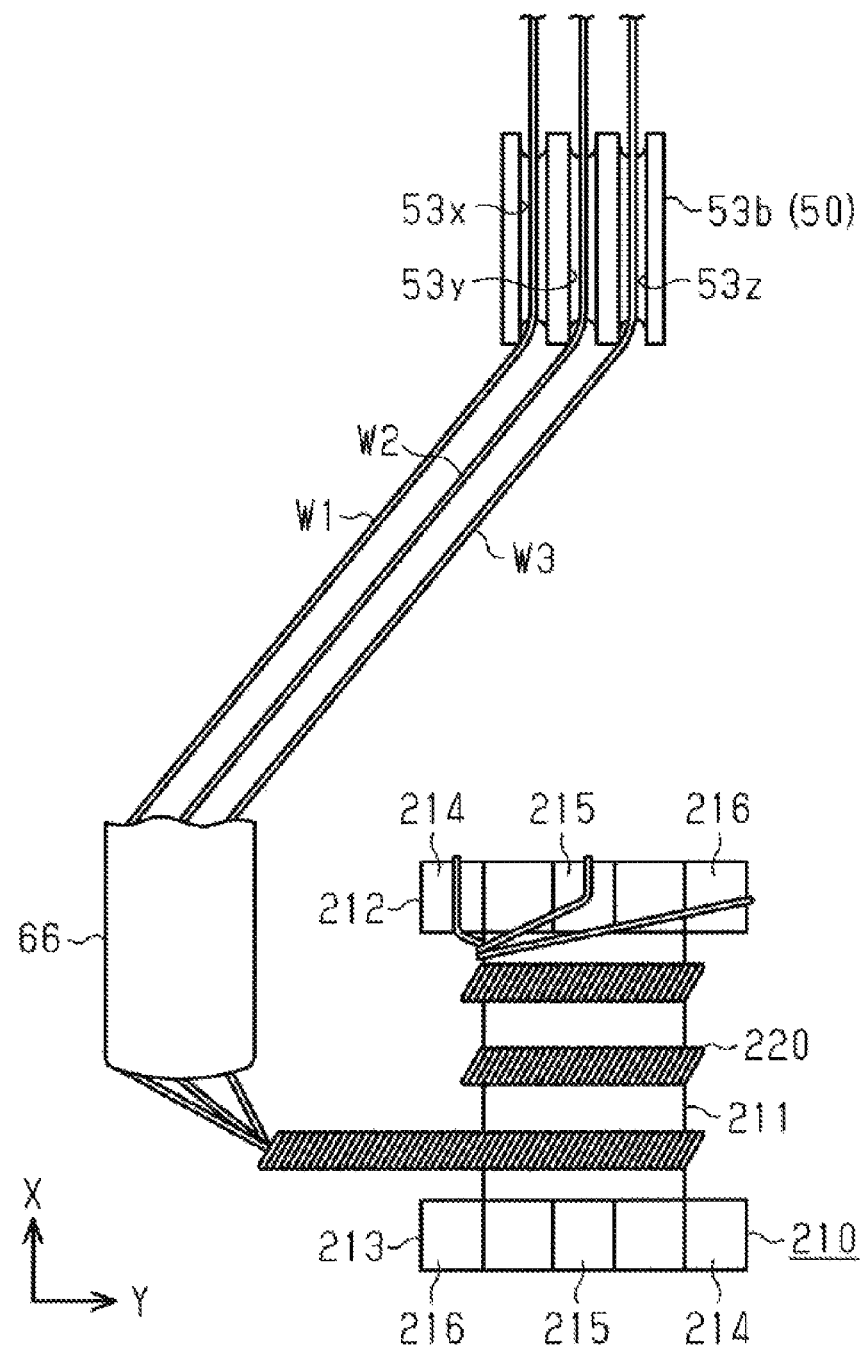
FIG. 55 is a schematic diagram illustrating winding of a wire around a core using a wire position support member in a winding apparatus of a modification.
Figure 56A:
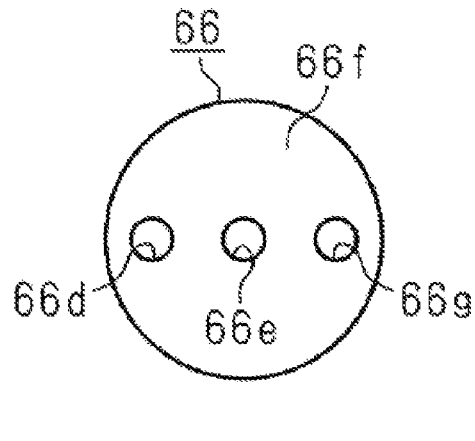
FIGS. 56A to 56D are front views illustrating a wire position support member of a winding apparatus of a modification.
Figure 56B:
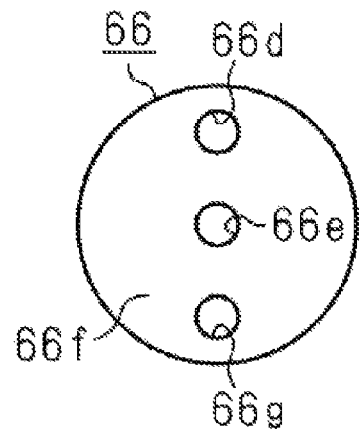
Figure 56C:
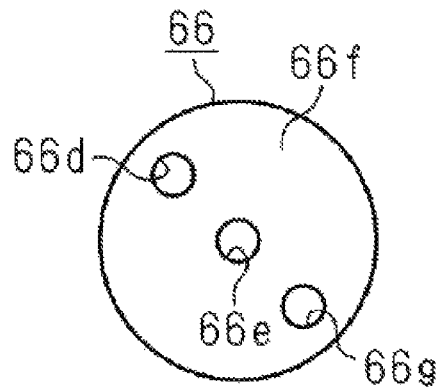
Figure 56D:
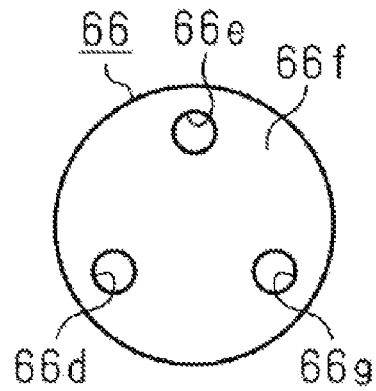
Figure 57:
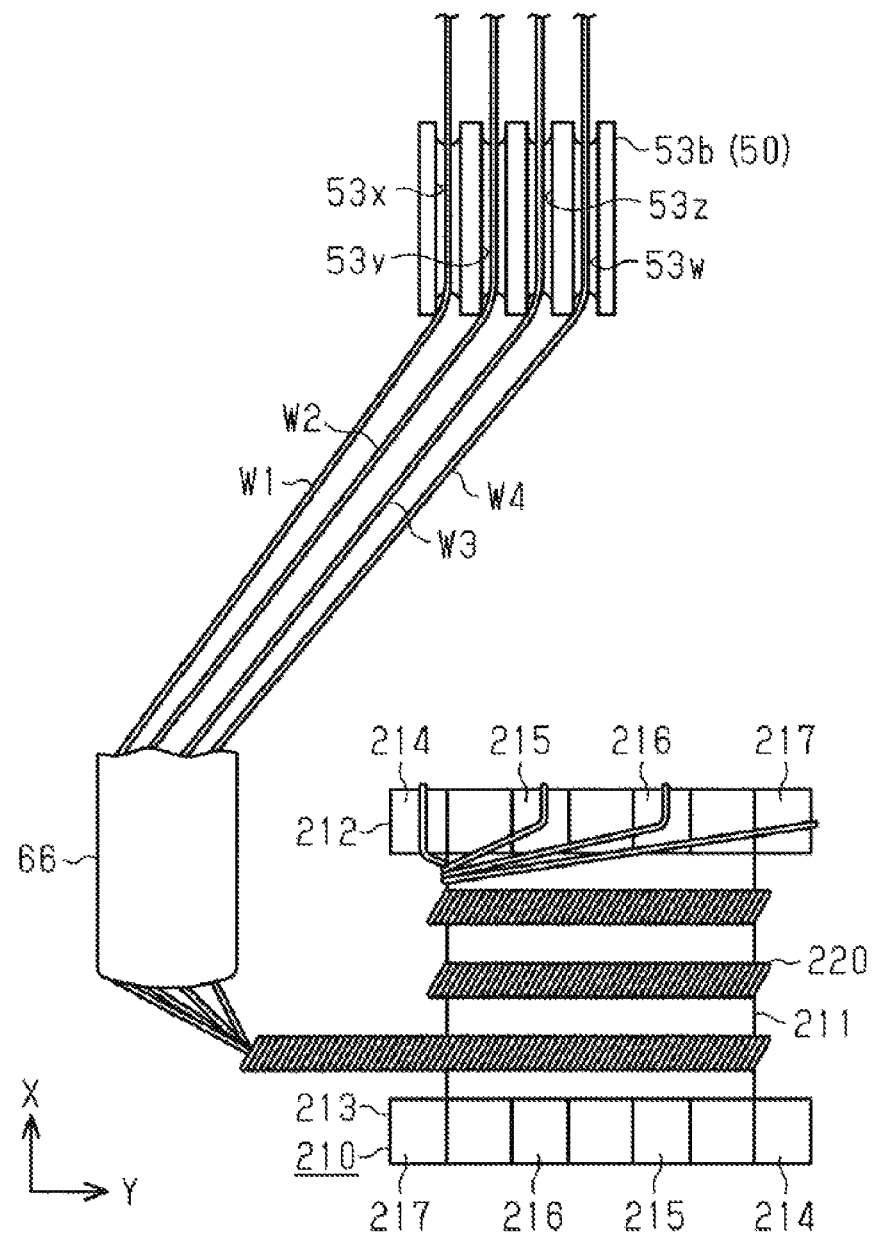
FIG. 57 is a schematic diagram illustrating winding of a wire around a core using a wire position support member in a winding apparatus of a modification.
Figure 58A:
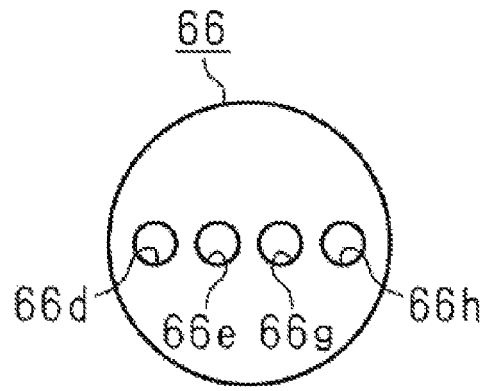
FIGS. 58A to 58E are front views illustrating a wire position support member of a winding apparatus of a modification.
Figure 58B:
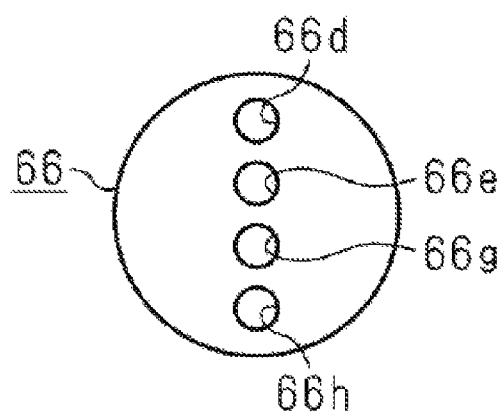
Figure 58C:
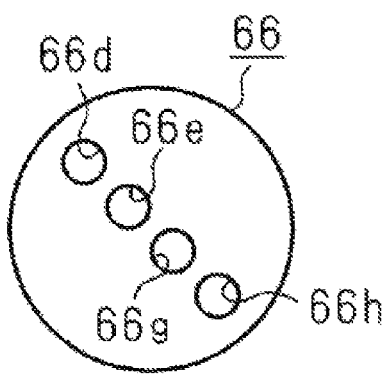
Figure 58D:
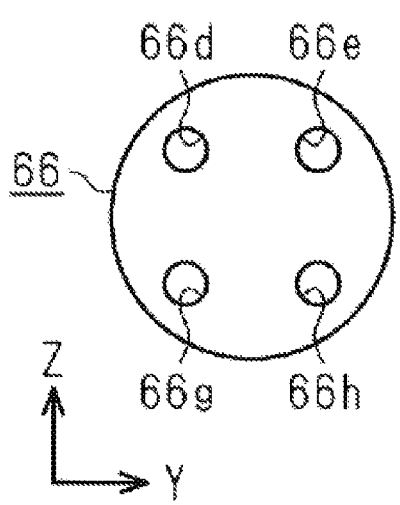
Figure 58E:
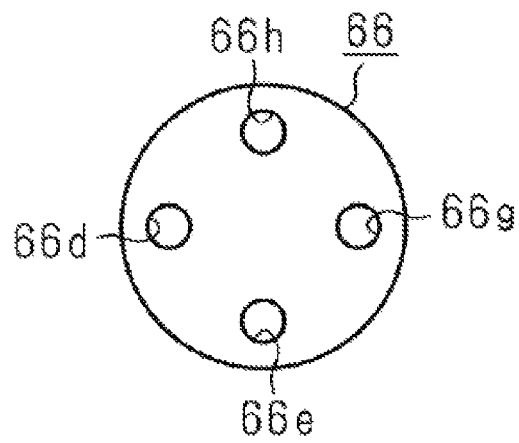

In the above embodiments, the number of wires fed from the wire position support member 66 can arbitrarily be changed within a range of at least two. By way of example, the number of wires is three (FIG. 55) or four (FIG. 57). The number of electrodes of the core 210 is changed according to the number of wires. FIGS. 55 and 57 schematically illustrate the shapes of the wire position support member 66 and the coil 220 for convenience.

As illustrated in FIG. 55, the first groove 53x, the second groove 53y, and a third groove 53z are formed in the second pulley 53b of the wire feeding mechanism 50. The first wire W1 is entrained about the first groove 53x, the second wire W2 is entrained about the second groove 53y, and a third wire W3 is entrained about the third groove 53z. Each of the wires W1 to W3 is fed from the second pulley 53b to the wire position support member 66. Each of the wires W1 to W3 fed from the wire position support member 66 is wound around the core 210. The first electrode 214, the second electrode 215, and a third electrode 216 are formed in each of the first flange 212 and the second flange 213 of the core 210. The first wire W1 is hooked on the first electrode 214, the second wire W2 is hooked on the second electrode 215, and the third wire W3 is hooked on the third electrode 216.

As illustrated in FIG. 56, the first wire route hole 66d, the second wire route hole 66e, and a third wire route hole 66g are made in the wire position support member 66. The positional relationship among the wire route holes 66d, 66e, 66g can arbitrarily be changed. By way of example, the positional relationship among the wire route holes 66d, 66e, 66g may be positional relationships illustrated in FIGS. 56A and 56D. As illustrated in FIG. 56A, the wire route holes 66d, 66e, 66g are arranged in a line in the horizontal direction Y. As illustrated in FIG. 56B, the wire route holes 66d, 66e, 66g are arranged in a line in the vertical direction Z. As illustrated in FIG. 56C, the wire route holes 66d, 66e, 66g are arranged in a line in a diameter direction of the wire position support member 66 at any rotation position about the center axis J3 except for the direction along the vertical direction Z and the direction along the horizontal direction Y. As illustrated in FIG. 56D, the wire route holes 66d, 66e, 66g are made at positions becoming vertices of a triangle.

As illustrated in FIG. 57, the first groove 53x, the second groove 53y, the third groove 53z, and a fourth groove 53w are formed in the second pulley 53b of the wire feeding mechanism 50. The first wire W1 is entrained about the first groove 53x, the second wire W2 is entrained about the second groove 53y, the third wire W3 is entrained about the third groove 53z, and a fourth wire W4 is entrained about the fourth groove 53w. Each of the wires W1 to W4 is fed from the second pulley 53b to the wire position support member 66. Each of the wires W1 to W4 fed from the wire position support member 66 is wound around the core 210. The first electrode 214, the second electrode 215, the third electrode 216, and a fourth electrode 217 are formed in each of the first flange 212 and the second flange 213 of the core 210. The first wire W1 is hooked on the first electrode 214, the second wire W2 is hooked on the second electrode 215, the third wire W3 is hooked on the third electrode 216, and the fourth wire W4 is hooked on the fourth electrode 217.

As illustrated in FIG. 58, the first wire route hole 66d, the second wire route hole 66e, the third wire route hole 66g, and a fourth wire route hole 66h are made in the wire position support member 66. The positional relationship among the wire route holes 66d, 66e, 66g can arbitrarily be changed. By way of example, the positional relationship among the wire route holes 66d, 66e, 66g, 66h may be positional relationships illustrated in FIGS. 58A to 58E. As illustrated in FIG. 58A, the wire route holes 66d, 66e, 66g, 66h are arranged in a line in the horizontal direction Y. As illustrated in FIG. 58B, the wire route holes 66d, 66e, 66g, 66h are arranged in a line in the vertical direction Z. As illustrated in FIG. 58C, the wire route holes 66d, 66e, 66g, 66h are arranged in a line in a diameter direction of the wire position support member 66 at any rotation position about the center axis J3 except for the direction along the vertical direction Z and the direction along the horizontal direction Y. As illustrated in FIG. 58D, the wire route holes 66d, 66e, 66g, 66h are made at positions becoming vertices of a quadrangle. As illustrated in FIG. 58E, the wire route holes 66d, 66e, 66g, 66h are made at positions becoming vertices of a rhombus.

Figure 59A:
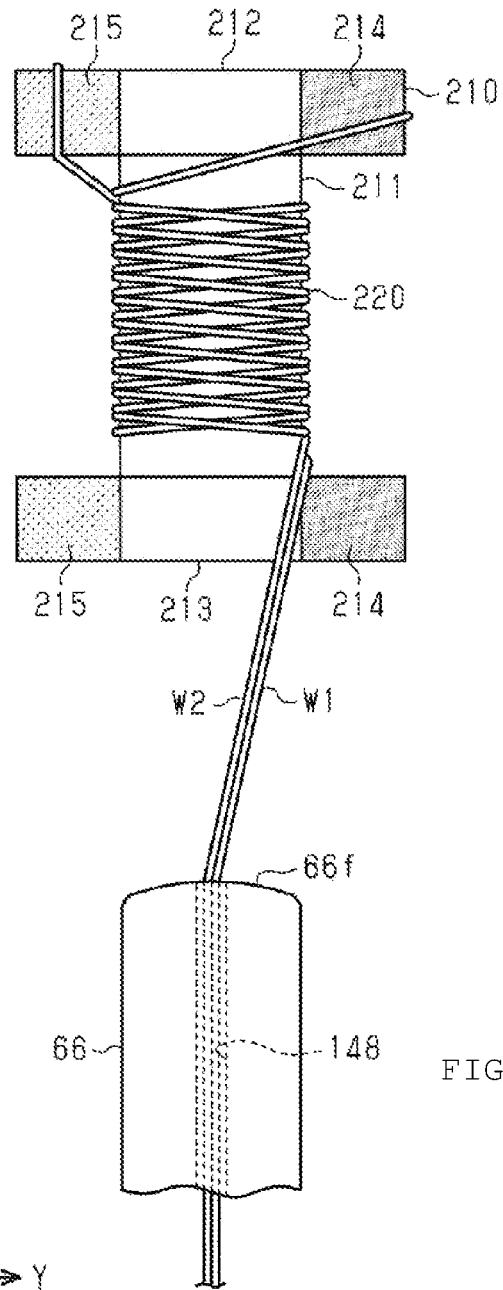
FIG. 59A is a schematic diagram illustrating winding of a wire around a core using a wire position support member in a winding apparatus of a modification.
Figure 59B:
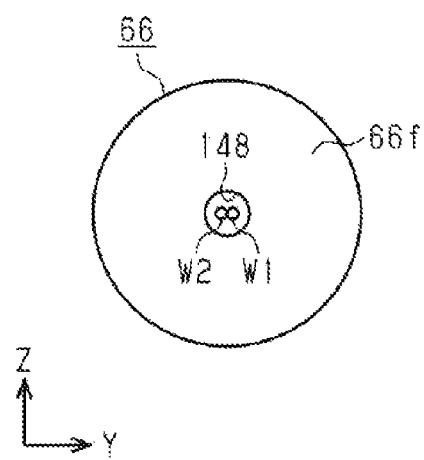
FIG. 59B is a front view of the wire position support member.

In the above embodiments, two holes of the first wire route hole 66d and the second wire route hole 66e are made in the wire position support member 66, but not limited to this configuration. Alternatively, one wire route hole 148 may be made in the wire position support member 66 as illustrated in FIG. 59B.

The first wire W1 and the second wire W2 are inserted in the wire route hole 148. An inner diameter of the wire route hole 148 is larger than inner diameters of the first wire route hole 66d and the second wire route hole 66e. As illustrated in FIG. 59A, the first and second wires W1, W2 are fed from the wire route hole 148 while being adjacent to each other.

In the above embodiments, the outer shape of the wire position support member 66 can arbitrarily be changed. By way of example, the outer shape of the wire position support member 66 may be a polygon such as a triangle as illustrated in FIG. 60A, a quadrangle as illustrated in FIG. 60B, a pentagon as illustrated in FIG. 60C, and a hexagon as illustrated in FIG. 60D. The outer shape of the wire position support member 66 may be an elliptical shape as illustrated in FIG. 60E.

In the second embodiment, a selection apparatus that selects the coil component 200 in which the first and second wires W1, W2 are wound counterclockwise with respect to the winding core 211 of the core 210 and the coil component 200 in which the first and second wires W1, W2 are wound clockwise with respect to the winding core 211 of the core 210 may be provided between the bonding apparatus 2 and the taping apparatus 3. The counterclockwise coil component 200 is one in which the first and second wires W1, W2 are wound in the clockwise direction with respect to the winding core 211 of the core 210 from the first flange 212 toward the second flange 213. The clockwise coil component 200 is one in which the first and second wires W1, W2 are wound in the counterclockwise direction with respect to the winding core 211 of the core 210 from the first flange 212 toward the second flange 213. The selection apparatus includes a determination unit that determines the winding direction of the coil 220 and a selector that selects the counterclockwise coil component 200 and the clockwise coil component 200 based on a result of the determination unit. An example of the determination unit is a camera that capturing an image of the coil 220. For example, the selector selects the counterclockwise coil component 200 and the clockwise coil component 200 by comparing the image of the coil 220 captured by the camera and the previously-stored images of the counterclockwise coil 220 and the clockwise coil 220.

<Control of Winding Apparatus 1>

In the first embodiment, the core 210 rotates in the clockwise direction while the wire position support member 66 revolves orbitally in the clockwise direction in the first controls, and the core 210 rotates in the counterclockwise direction while the wire position support member 66 revolves orbitally in the counterclockwise direction in the second control. However, the rotation direction of the core 210 and the orbital revolution direction of the wire position support member 66 in each of the first control and the second control are not limited to this. The core 210 may rotate in the counterclockwise direction while the wire position support member 66 revolves orbitally in the counterclockwise direction in the first control, and the core 210 may rotate in the clockwise direction while the wire position support member 66 revolves orbitally in the clockwise direction in the second control.

In the second embodiment, the core 210 rotates in the counterclockwise direction and the wire position support member 66 revolves orbitally in the clockwise direction in the first controls, and the core 210 rotates in the clockwise direction and the wire position support member 66 revolves orbitally in the counterclockwise direction in the second control. However, the rotation direction of the core 210 and the orbital revolution direction of the wire position support member 66 in each of the first control and the second control are not limited to this. The core 210 may rotate in the clockwise direction while the wire position support member 66 revolves orbitally in the counterclockwise direction in the first control, and the core 210 may rotate in the counterclockwise direction while the wire position support member 66 revolves orbitally in the clockwise direction in the second control.

In the third embodiment, the core 210 does not rotate in the first control. Alternatively, the core 210 may rotate in the same direction as the orbital revolution direction of the wire position support member 66 in the first control, and the core 210 may not rotate in the second control. In this case, the rotation speed of the core 210 is faster than the orbital revolution speed of the wire position support member 66. In the first control, because the rotation speed of the core 210 is faster than the orbital revolution speed of the wire position support member 66 although the orbital revolution direction of the wire position support member 66 is opposite to the orbital revolution direction of the wire position support member 66 of the second control, winding directions of the wires W1, W2 around the core 210 in the first control are matched with winding directions of the wires W1, W2 around the core 210 in the second control. Preferably the absolute value of the speed of the wire position support member 66 relative to the core 210 in the first control is equal to the absolute value of the speed of the wire position support member 66 relative to the core 210 in the second control.

In the third embodiment, the control mechanism 130 may control not to rotate the core 210 in the first control and the second control. In this case, the control mechanism 130 orbitally revolves the wire position support member 66 in the clockwise direction that is of an example of the first rotation direction in the first control, and orbitally revolves the wire position support member 66 in the counterclockwise direction that is of an example of the second rotation direction in the second control. The control mechanism 130 performs switching control similar to the switching control of the first embodiment. In the switching control, the first control and the second control are switched every time the coil 220 is formed in one core 210. By way of example, the control mechanism 130 controls the orbital revolution of the wire position support member 66 such that the number of orbital revolutions of the wire position support member 66 in the first control are equal to the number of orbital revolutions of the wire position support member 66 in the second control. Specifically, in the case that the coil 220 is formed in one core 210 by the first control, the coil 220 is formed in the next one core 210 by the second control. That is, the control mechanism 130 repeats a cycle, in which the wires W1, W2 are wound around one core 210 by the first control and the wires W1, W2 are wound around the next core 210 by the second control. The control mechanism 130 can arbitrarily set the orbital revolution speed of the wire position support member 66 in the first control and the second control. By way of example, the orbital revolution speed of the wire position support member 66 in the first control is equal to the orbital revolution speed of the wire position support member 66 in the second control. That is, the absolute value of the speed of the wire position support member 66 relative to the core 210 in the first control is equal to the absolute value of the speed of the wire position support member 66 relative to the core 210 in the second control.

In the switching control of the above embodiments, the predetermined condition that switches between the first control and the second control may be set to the number of orbital revolutions of the wire position support member 66. In this case, the control mechanism 130 counts the number of orbital revolutions of the wire position support member 66 in each of the first control and the second control.

During the performance of one of the first control and the second control, the control mechanism 130 changes to the other of the first control and the second control when the number of orbital revolutions of the wire position support member 66 reaches a previously-set threshold. Preferably the number of orbital revolutions of the wire position support member 66 in the first control is equal to the number of orbital revolutions of the wire position support member 66 in the second control.

In this configuration, the kink amount of each of the wires W1, W2 in the first control is substantially equal to the kink amount of each of the wires W1, W2 in the second control. Thus, the kink of each of the wires W1, W2 is substantially eliminated when the control mechanism 130 switches between the first control and the second control, so that the generation of the kink of each of the wires W1, W2 can be prevented between the wire feeding mechanism 50 and the wire position support member 66.

In the switching control of the above embodiments, the control mechanism 130 may switch between the first control and the second control in preference to a predetermined condition when the number of twists that of the number in which the wires W1, W2 are twisted between the core 210 and the first wire route hole 66d and the second wire route hole 66e of the wire position support member 66 reaches a previously-set upper limit. For example, in the case that the predetermined condition is the number of products of the coil component 200, information indicating a relationship between the combination of the rotation speed and the rotation direction of the core 210 and the orbital revolution speed and the orbital revolution direction of the wire position support member 66 and the number of orbital revolutions of the wire position support member 66 in reaching the upper limit of the number of twists of the wires W1, W2 is stored in the operation storage 132. Based on the number of orbital revolutions of the wire position support member 66, the control mechanism 130 switches between the first control and the second control using the information stored in the operation storage 132.

In each of the wires W1, W2, the portion between the core 210 and the first wire route hole 66d and the second wire route hole 66e of the wire position support member 66 is twisted in association with the orbital revolution of the wire position support member 66. When the number of twists is excessively increased, the whole portion between the core 210 and the wire position support member 66 in each of the wires W1, W2 is twisted, excessive tension is likely to be applied to each of the wires W1, W2. In that respect, the control mechanism 130 switches between the first control and the second control when the number of twists reaches the upper limit, so that the wire position support member 66 revolves orbitally such that the twist of the portion between the core 210 and the wire position support member 66 in each of the wires W1, W2 is eliminated. Thus, the excessive tension due to the twist of the portion between the core 210 and the wire position support member 66 in each of the wires W1, W2 is prevented from being applied to the wires W1, W2.

(Supplements)

Technical ideas that can be recognized from the above embodiments and modifications will be described below.

(Supplement 1)

A winding apparatus including: a first rotation body; a wire position support member inserted in an insertion hole made outside a center axis of the first rotation body, the wire position support member including a wire route hole in which a wire is inserted; a second rotation body that is disposed while separated from the first rotation body; a shaft body provided outside a center axis of the second rotation body; a synchronous rotation component that couples the wire position support member and the shaft body while being unrotatably fixed to the wire position support member; a winding driving unit that synchronously rotates the first rotation body and the second rotation body; and a first inner bearing disposed between the wire position support member in the insertion hole and the first rotation body, in which the wire position support member is journaled with respect to the first rotation body.

(Supplement 2)

In the winding apparatus according to the supplement 1, the first inner bearing is a rolling bearing.

(Supplement 3)

The winding apparatus according to the supplement 1 or 2 further including a pushing member that presses the wire position support member against an inner surface constituting an insertion hole, and the synchronous rotation component includes the insertion hole in which the wire position support member is inserted.

(Supplement 4)

In the winding apparatus according to any one of the supplements 1 to 3, the shaft body is rotatably coupled to the synchronous rotation component.

(Supplement 5)

The winding apparatus according to any one of the supplements 1 to 4 further including a second inner bearing in which the shaft body is journaled with respect to the second rotation body, and the shaft body is the wire position support member including a plurality of the wire route holes in which the wire is inserted.

(Supplement 6)

In the winding apparatus according to any one of the supplements 1 to 5, the winding driving unit includes a motor constituting a driving source and a transmission mechanism that transmits rotating force of the motor to the first rotation body and the second rotation body.

(Supplement 7)

A winding apparatus for a coil component in which a plurality of wires are wound around a core, the winding apparatus including: a wire position support member including a wire route hole in which the plurality of wires are inserted; a wire feeding mechanism that feeds the plurality of wires to the wire position support member such that tension is applied to the plurality of wires; a winding driving unit that orbitally revolves the wire position support member around the core such that the plurality of wires are wound around the core while twisted; a rotation unit that rotates the core; and a controller that controls the winding driving unit and the rotation unit, the controller including first control, in which a rotation direction of the core is matched with an orbital revolution direction of the wire position support member and an orbital revolution speed of the wire position support member is faster than a rotation speed of the core, and second control, in which the rotation direction of the core is matched with the orbital revolution direction of the wire position support member, which is the opposite direction to the rotation direction of the core and the orbital revolution direction of the wire position support member in the first control, and the orbital revolution speed of the wire position support member is slower than the rotation speed of the core, the controller switching between the first control and the second control based on a predetermined condition.

(Supplement 8)

A winding apparatus for a coil component in which a plurality of wires are wound around a core, the winding apparatus including: a wire position support member including a wire route hole in which the plurality of wires are inserted; a wire feeding mechanism that feeds the plurality of wires to the wire position support member such that tension is applied to the plurality of wires; a winding driving unit that orbitally revolves the wire position support member around the core such that the plurality of wires are wound around the core while twisted; a rotation unit that rotates the core; and a controller that controls the winding driving unit and the rotation unit, the controller including first control, in which the core is not rotated but the wire position support member is orbitally revolved in a first rotation direction, and second control, in which the core is rotated in a second rotation direction that is of an opposite direction to the first rotation direction, the wire position support member is orbitally revolved in the second rotation direction, and a rotation speed of the core is faster than an orbital revolution speed of the wire position support member, the controller switching between the first control and the second control based on a predetermined condition.

(Supplement 9)

A winding apparatus for a coil component in which a plurality of wires are wound around a core, the winding apparatus including: a wire position support member including a wire route hole in which the plurality of wires are inserted; a wire feeding mechanism that feeds the plurality of wires to the wire position support member such that tension is applied to the plurality of wires; a winding driving unit that orbitally revolves the wire position support member around the core such that the plurality of wires are wound around the core while twisted; a rotation unit that rotates the core; and a controller that controls the winding driving unit and the rotation unit, the controller including first control, in which the wire position support member is orbitally revolved in a first rotation direction and the core is rotated in a second rotation direction that is of an opposite direction to the first rotation direction, and second control, in which the wire position support member is orbitally revolved in the second rotation direction and the core is rotated in the first rotation direction, the controller switching the first control and the second control based on a predetermined condition.

(Supplement 10)

A winding apparatus for a coil component in which a plurality of wires are wound around a core, the winding apparatus including: a wire position support member including a wire route hole in which the plurality of wires are inserted; a wire feeding mechanism that feeds the plurality of wires to the wire position support member such that tension is applied to the plurality of wires; a winding driving unit that orbitally revolves the wire position support member around the core such that the plurality of wires are wound around the core while twisted; and a controller that controls the winding driving unit, the controller including first control, in which the core is not rotated but the wire position support member is orbitally revolved in a first rotation direction, and second control, in which the core is not rotated but the wire position support member is orbitally revolved in a second rotation direction that is of an opposite direction to the first rotation direction, the controller switching the first control and the second control based on a predetermined condition.

(Supplement 11)

In the winding apparatus according to any one of the supplements 7 to 10, the predetermined condition is the number of orbital revolutions of the wire position support member, and the number of orbital revolutions of the wire position support member in the first control is equal to the number of orbital revolutions of the wire position support member in the second control.

(Supplement 12)

In the winding apparatus according to any one of the supplements 7 to 10, the predetermined condition is the number of products of the coil component, and the controller repeats a cycle, in which the plurality of wires are wound around one core based on the first control and the plurality of wires are wound around next one core based on the second control.

(Supplement 13)

In the winding apparatus according to any one of the supplements 7 to 12, an absolute value of a speed of the wire position support member relative to the core in the first control is equal to an absolute value of a speed of the wire position support member relative to the core in the second control.

(Supplement 14)

In the winding apparatus according to any one of the supplements 7 to 13, the controller switches between the first control and the second control in preference to the predetermined condition when the number of twists that is of a number in which the plurality of wires are twisted between the core and the wire position support member reaches an upper limit.

(Supplement 15)

A method for manufacturing a coil component in which a plurality of wires are wound around a core, the coil component manufacturing method including: a core preparation process of preparing the core; a winding starting process of hooking a winding starting end in the plurality of wires inserted in a wire route hole of a wire position support member on an electrode corresponding to the winding starting end in the core while tension is applied to the plurality of wires; a winding process of orbitally revolving the wire position support member in a direction identical to a rotation direction of the core while rotating the core, and winding the plurality of wires around the core while twisting the plurality of wires; a winding ending process of hooking a winding ending end in the plurality of wires on an electrode corresponding to the winding ending end in the core; and a fixing process of fixing the winding starting end to the electrode corresponding to the winding starting end in the core, and fixing the winding ending end to the electrode corresponding to the winding ending end in the core. In the winding process, switching between first control, in which the rotation direction of the core is matched with an orbital revolution direction of the wire position support member and an orbital revolution speed of the wire position support member is faster than a rotation speed of the core, and second control, in which the rotation direction of the core is matched with the orbital revolution direction of the wire position support member, which is the opposite direction to the rotation direction of the core and the orbital revolution direction of the wire position support member in the first control, and the orbital revolution speed of the wire position support member is slower than the rotation speed of the core, is performed based on a predetermined condition.

(Supplement 16)

A method for manufacturing a coil component in which a plurality of wires are wound around a core, the coil component manufacturing method including: a core preparation process of preparing the core; a winding starting process of hooking a winding starting end in the plurality of wires inserted in a wire route hole of a wire position support member on an electrode corresponding to the winding starting end in the core while tension is applied to the plurality of wires; a winding process of orbitally revolving the wire position support member around the core, and winding the plurality of wires around the core while twisting the plurality of wires; a winding ending process of hooking a winding ending end in the plurality of wires on an electrode corresponding to the winding ending end in the core; and a fixing process of fixing the winding starting end to the electrode corresponding to the winding starting end in the core, and fixing the winding ending end to the electrode corresponding to the winding ending end in the core. In the winding process, switching between first control, in which the core is not rotated but the wire position support member is orbitally revolved in a first rotation direction, and second control, in which the core is rotated in an opposite direction to the first rotation direction, the wire position support member is orbitally revolved in the opposite direction to the first rotation direction, and a rotation speed of the core is faster than an orbital revolution speed of the wire position support member, is performed based on a predetermined condition.

(Supplement 17)

A method for manufacturing a coil component in which a plurality of wires are wound around a core, the coil component manufacturing method including: a core preparation process of preparing the core; a winding starting process of hooking a winding starting end in the plurality of wires to which tension is applied by a wire feeding mechanism, the plurality of wires being inserted in a wire route hole of a wire position support member on an electrode corresponding to the winding starting end in the core; a winding process of orbitally revolving the wire position support member in an opposite direction to a rotation direction of the core while rotating the core, and winding the plurality of wires around the core while twisting the plurality of wires; a winding ending process of hooking a winding ending end in the plurality of wires on an electrode corresponding to the winding ending end in the core; and a fixing process of fixing the winding starting end to the electrode corresponding to the winding starting end in the core, and fixing the winding ending end to the electrode corresponding to the winding ending end in the core. In the winding process, switching between first control, in which the wire position support member is orbitally revolved in a first rotation direction and the core is rotated in a second rotation direction that is of an opposite direction to the first rotation direction, and second control, in which the wire position support member is orbitally revolved in the second rotation direction and the core is rotated in the first rotation direction, is performed based on a predetermined condition.

(Supplement 18)

A method for manufacturing a coil component in which a plurality of wires are wound around a core, the coil component manufacturing method including: a core preparation process of preparing the core; a winding starting process of hooking a winding starting end in the plurality of wires to which tension is applied by a wire feeding mechanism, the plurality of wires being inserted in a wire route hole of a wire position support member on an electrode corresponding to the winding starting end in the core; a winding process of orbitally revolving the wire position support member around the core, and winding the plurality of wires around the core while twisting the plurality of wires; a winding ending process of hooking a winding ending end in the plurality of wires on an electrode corresponding to the winding ending end in the core; and a fixing process of fixing the winding starting end to the electrode corresponding to the winding starting end in the core, and fixing the winding ending end to the electrode corresponding to the winding ending end in the core. In the winding process, switching between first control, in which the core is not rotated but the wire position support member is orbitally revolved in a first rotation direction, and second control, in which the core is not rotated but the wire position support member is orbitally revolved in a second rotation direction that is of an opposite direction to the first rotation direction, is performed based on a predetermined condition.

(Supplement 19)

A winding apparatus that winds a first wire and a second wire around a core, the winding apparatus including: a wire position support member including a first feeding unit including a first wire route hole in which the first wire is inserted and a second feeding unit including a second wire route hole in which the second wire is inserted; and a winding driving unit that orbitally revolves the wire position support member around the core. The wire position support member includes a regulation unit that regulates movement of the first wire and the second wire such that, when the wire position support member revolves orbitally around the core, the first wire passes on an opening end surface from which the second wire is fed in the second wire route hole while the second wire passes on an opening end surface from which the first wire is fed in the first wire route hole.

(Supplement 20)

In the winding apparatus according to the supplement 19, the regulation unit includes a coupling surface that is coupled to an end surface from which the first wire is fed in the first feeding unit and an end surface from which the second wire is fed in the second feeding unit so as to be flush with both the end surfaces.

(Supplement 21)

In the winding apparatus according to the supplement 19, the regulation unit includes a circumferential wall surrounding the first feeding unit and the second feeding unit in a direction orthogonal to an axial direction of the wire position support member, and a leading end surface of the circumferential wall is formed so as to be flush with the end surface from which the first wire is fed in the first feeding unit and the end surface from which the second wire is fed in the second feeding unit, or formed at a position projecting from the end surface from which the first wire is fed in the first feeding unit and the end surface from which the second wire is fed in the second feeding unit.

(Supplement 22)

In the winding apparatus according to the supplement 19, the wire position support member is formed into one columnar shape including the first feeding unit and the second feeding unit, and the regulation unit includes a convex surface that projects from the end surface of the first feeding unit and the end surface of the second feeding unit when viewed in a direction orthogonal to both an array direction of the first feeding unit and the second feeding unit and an axial direction of the wire position support member.

(Supplement 23)

In the winding apparatus according to the supplement 19, the wire position support member is formed into one columnar shape including the first feeding unit and the second feeding unit, the regulation unit is an end surface in which an opening on a side on which the first wire is fed in the first wire route hole of the wire position support member and an opening on a side on which the second wire is fed in the second wire route hole are formed, and the end surface includes a plane orthogonal to an axial direction of the wire position support member.

(Supplement 24)

In the winding apparatus according to the supplement 19, the wire position support member is formed into one columnar shape including the first feeding unit and the second feeding unit, the regulation unit is an end surface in which an opening on a side on which the first wire is fed in the first wire route hole of the wire position support member and an opening on a side on which the second wire is fed in the second wire route hole are formed, and the end surface includes a spherical surface.

(Supplement 25)

In the winding apparatus according to the supplement 23 or 24, the wire position support member has a columnar outer shape.

(Supplement 26)

In the winding apparatus according to the supplement 23 or 24, the wire position support member has a polygonal columnar outer shape.

What is claimed is:

1. A taping electronic component array comprising:
    a tape including
        an elongated carrier tape in which recesses are provided along a longitudinal direction thereof; and
        a cover tape that is provided on the carrier tape so as to cover the recesses; and
    an electronic component arranged in each of the recesses,
    the electronic component including a first coil component and a second coil component,
    the first coil component including a first core and a first coil in which wires are wound around the first core in a predetermined winding direction while twisted in a predetermined twist direction, and
    the second coil component including a second core and a second coil in which the wires are wound around the second core in the predetermined winding direction while twisted in an opposite direction to the predetermined twist direction.

2. The taping electronic component array according to claim 1, wherein the first coil component and the second coil component are alternately disposed in the recesses in each predetermined number.

3. The taping electronic component array according to claim 2, wherein the predetermined number is one.

4. The taping electronic component array according to claim 1, wherein:
    the first core includes an electrode to which a winding starting end of the first coil is fixed and an electrode to which a winding ending end of the first coil is fixed,
    the second core includes an electrode to which a winding starting end of the second coil is fixed and an electrode to which a winding ending end of the second coil is fixed, and
    an arrangement direction of the electrode to which the winding starting end of the first coil is fixed with respect to the recess is matched with an arrangement direction of the electrode to which the winding starting end of the second coil is fixed with respect to the recess.

5. The taping electronic component array according to claim 1, wherein:
    the first coil component includes a magnetic first cover that is attached to the first core so as to cover the first coil, and
    the second coil component includes a magnetic second cover that is attached to the second core so as to cover the second coil.

6. The taping electronic component array according to claim 2, wherein:
    the first core includes an electrode to which a winding starting end of the first coil is fixed and an electrode to which a winding ending end of the first coil is fixed,
    the second core includes an electrode to which a winding starting end of the second coil is fixed and an electrode to which a winding ending end of the second coil is fixed, and
    an arrangement direction of the electrode to which the winding starting end of the first coil is fixed with respect to the recess is matched with an arrangement direction of the electrode to which the winding starting end of the second coil is fixed with respect to the recess.

7. The taping electronic component array according to claim 3, wherein:
    the first core includes an electrode to which a winding starting end of the first coil is fixed and an electrode to which a winding ending end of the first coil is fixed,
    the second core includes an electrode to which a winding starting end of the second coil is fixed and an electrode to which a winding ending end of the second coil is fixed, and
    an arrangement direction of the electrode to which the winding starting end of the first coil is fixed with respect to the recess is matched with an arrangement direction of the electrode to which the winding starting end of the second coil is fixed with respect to the recess.

8. The taping electronic component array according to claim 2, wherein:
    the first coil component includes a magnetic first cover that is attached to the first core so as to cover the first coil, and
    the second coil component includes a magnetic second cover that is attached to the second core so as to cover the second coil.

9. The taping electronic component array according to claim 3, wherein:
    the first coil component includes a magnetic first cover that is attached to the first core so as to cover the first coil, and
    the second coil component includes a magnetic second cover that is attached to the second core so as to cover the second coil.

10. The taping electronic component array according to claim 4, wherein:
    the first coil component includes a magnetic first cover that is attached to the first core so as to cover the first coil, and
    the second coil component includes a magnetic second cover that is attached to the second core so as to cover the second coil.

11. The taping electronic component array according to claim 6, wherein:
    the first coil component includes a magnetic first cover that is attached to the first core so as to cover the first coil, and
    the second coil component includes a magnetic second cover that is attached to the second core so as to cover the second coil.

12. The taping electronic component array according to claim 7, wherein:
    the first coil component includes a magnetic first cover that is attached to the first core so as to cover the first coil, and
    the second coil component includes a magnetic second cover that is attached to the second core so as to cover the second coil.

* * * * *